US010364317B2

(12) United States Patent
Blouin et al.

(10) Patent No.: US 10,364,317 B2
(45) Date of Patent: Jul. 30, 2019

(54) CONJUGATED POLYMERS

(71) Applicants: Merck Patent GmbH, Darmstadt (DE);
IMPERIAL INNOVATIONS LIMITED, London (GB)

(72) Inventors: Nicolas Blouin, Darmstadt (DE);
William Mitchell, Chandler's Ford (GB); Martin Heeney, Woking (GB);
Jessica Shaw, Prescot (GB)

(73) Assignees: Merck Patent GmbH, Darmstadt (DE);
IMPERIAL INNOVATIONS LIMITED, London (GB)

( * ) Notice: Subject to any disclaimer, the term of this patent is extended or adjusted under 35 U.S.C. 154(b) by 142 days.

(21) Appl. No.: 15/509,893

(22) PCT Filed: Aug. 12, 2015

(86) PCT No.: PCT/EP2015/001661
§ 371 (c)(1),
(2) Date: Mar. 9, 2017

(87) PCT Pub. No.: WO2016/037678
PCT Pub. Date: Mar. 17, 2016

(65) Prior Publication Data
US 2017/0260325 A1 Sep. 14, 2017

(30) Foreign Application Priority Data
Sep. 9, 2014 (EP) ..................... 14003120

(51) Int. Cl.
| C08G 61/00 | (2006.01) |
| C08G 61/12 | (2006.01) |
| C09D 165/00 | (2006.01) |
| C08L 65/00 | (2006.01) |
| H01L 51/00 | (2006.01) |
| H01L 51/42 | (2006.01) |

(52) U.S. Cl.
CPC ......... *C08G 61/126* (2013.01); *C08G 61/123* (2013.01); *C08L 65/00* (2013.01); *C09D 165/00* (2013.01); *H01L 51/0036* (2013.01); *H01L 51/0043* (2013.01); *C08G 2261/12* (2013.01); *C08G 2261/1412* (2013.01); *C08G 2261/1424* (2013.01); *C08G 2261/18* (2013.01); *C08G 2261/3223* (2013.01); *C08G 2261/3241* (2013.01); *C08G 2261/3243* (2013.01); *C08G 2261/3246* (2013.01); *C08G 2261/344* (2013.01); *C08G 2261/414* (2013.01); *C08G 2261/91* (2013.01); *C08G 2261/92* (2013.01); *C08G 2261/95* (2013.01); *H01L 51/0037* (2013.01); *H01L 51/4253* (2013.01); *H01L 2251/308* (2013.01); *Y02E 10/549* (2013.01); *Y02P 70/521* (2015.11)

(58) Field of Classification Search
CPC .......... C08G 61/126; C08G 2261/1412; C08G 2261/3223; C08G 2261/1424; C08G 2261/92; C08G 2261/12; C08G 2261/95; C08G 2261/91; C08G 2261/344; C08G 2261/3246; C08G 2261/414; C08G 61/123; C08G 2261/3243; C08G 2261/18; C08G 2261/3241; C08K 3/045; H01L 51/0043; H01L 51/0036; H01L 51/0037; H01L 51/4253; H01L 2251/308; C09D 165/00; C08L 65/00; Y02E 10/549
USPC ....................................... 252/500
See application file for complete search history.

(56) References Cited

U.S. PATENT DOCUMENTS

| 4,661,591 A * | 4/1987 | Steiner ................. C07D 495/14 540/495 |
| 8,436,208 B2 | 5/2013 | Kirner et al. |
| 8,624,232 B2 | 1/2014 | Sonar et al. |
| 8,835,598 B2 | 9/2014 | Pan et al. |
| 8,841,409 B2 | 9/2014 | Facchetti et al. |
| 9,166,167 B2 | 10/2015 | Chen et al. |
| 9,233,930 B2 | 1/2016 | Kirner et al. |
| 9,312,492 B2 | 4/2016 | Drees et al. |
| 9,472,764 B2 | 10/2016 | Marks et al. |
| 2011/0062426 A1 | 3/2011 | Kirner et al. |

(Continued)

FOREIGN PATENT DOCUMENTS

| WO | 2009/115413 A2 | 9/2009 |
| WO | 2010/136401 A2 | 12/2010 |

(Continued)

OTHER PUBLICATIONS

International Search Report dated Oct. 14, 2015 issued in corresponding PCT/EP2015/001661 application (3 pages).
Written Opinion of the International Searching Authority dated dated Oct. 14, 2015 issued in corresponding PCT/EP2015/001661 application (7 pages).
M. Heeney et al., "Polymers Comprising of Bis-Thienothiophene-Imide for Organic Electronic Materials", (14 pages).
J.A. Letizia et al., "Variable Temperature Mobility Analysis of n-Channel, p-Channel, and Ambipolar Organic Field-Effect Transistors", Advanced Functional Materials, vol. 20 (2010) pp. 50-58.

(Continued)

*Primary Examiner* — Douglas J McGinty
(74) *Attorney, Agent, or Firm* — Millen White Zelano and Branigan, PC

(57) ABSTRACT

The invention relates to novel conjugated polymers containing one or more units based on dithieno[3,2-c;2',3'-e] azepine-4,6-dione that is fused to further aromatic rings, to methods for their preparation and educts or intermediates used therein, to polymer blends, mixtures and formulations containing them, to the use of the polymers, polymer blends, mixtures and formulations as organic semiconductors in, or for the preparation of, organic electronic (OE) devices, especially organic photovoltaic (OPV) devices and organic photodetectors (OPD), and to OE, OPV and OPD devices comprising, or being prepared from, these polymers, polymer blends, mixtures or formulations.

27 Claims, No Drawings

(56) References Cited

U.S. PATENT DOCUMENTS

| | | |
|---|---|---|
| 2012/0097935 A1 | 4/2012 | Kirner et al. |
| 2012/0153274 A1 | 6/2012 | Sonar et al. |
| 2012/0161117 A1 | 6/2012 | Chen et al. |
| 2013/0247991 A1 | 9/2013 | Facchetti et al. |
| 2013/0247992 A1 | 9/2013 | Drees et al. |
| 2013/0248831 A1 | 9/2013 | Pan et al. |
| 2015/0171332 A1 | 6/2015 | Drees et al. |
| 2015/0357590 A1 | 12/2015 | Marks et al. |
| 2016/0072070 A1 | 3/2016 | Drees et al. |
| 2016/0104849 A1 | 4/2016 | Kirner et al. |

FOREIGN PATENT DOCUMENTS

| | | |
|---|---|---|
| WO | 2011/025454 A1 | 3/2011 |
| WO | 2013/142841 A1 | 9/2013 |
| WO | 2013/142845 A1 | 9/2013 |
| WO | 2014/089235 A2 | 6/2014 |

OTHER PUBLICATIONS

X. Guo et al., "Bithiophene-Imide-Based Polymeric Semiconductors for Field-Effect Transistors: Synthesis, Structure-Property Correlations, Charge Carrier Polarity, and Device Stability", Journal of the American Chemical Society, vol. 133 (2011) pp. 1405-1418.

X. Guo et al., "Bithiopheneimide-Dithienosilole/Dithienogermole Copolymers for Efficient Solar Cells: Information from Structure-Property-Device Performance Correlations and Comparison to Thieno[3,4-c]pyrrole-4,6-dione Analogues", Journal of the American Chemical Society, vol. 134 (2012) pp. 18427-18439.

J.A. Letizia et al., "n-Channel Polymers by Design: Optimizing the Interplay of Solubilizing Substituents, Crystal Packing, and Field-Effect Transistor Characteristics in Polymeric Bithiophene-Imide Semiconductors", Journal of the American Chemical Society, vol. 130, No. 30 (2008) pp. 9679-9694.

N. Zhou et al., "Bithiophene Imide and Benzodithiophene Copolymers for Efficient Inverted Polymer Solar Cells", Advanced Materials, vol. 24, (2012) pp. 2242-2248.

* cited by examiner

CONJUGATED POLYMERS

TECHNICAL FIELD

The invention relates to novel conjugated polymers containing one or more units based on dithieno[3,2-c;2',3'-e] azepine-4,6-dione that is fused to further aromatic rings, to methods for their preparation and educts or intermediates used therein, to polymer blends, mixtures and formulations containing them, to the use of the polymers, polymer blends, mixtures and formulations as organic semiconductors in, or for the preparation of, organic electronic (OE) devices, especially organic photovoltaic (OPV) devices and organic photodetectors (OPD), and to OE, OPV and OPD devices comprising, or being prepared from, these polymers, polymer blends, mixtures or formulations.

BACKGROUND

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), organic photodetectors (OPDs), organic photovoltaic (OPV) cells, sensors, memory elements and logic circuits to name just a few. The organic semiconducting materials are typically present in the electronic device in the form of a thin layer, for example of between 50 and 300 nm thickness.

One particular area of importance is organic photovoltaics (OPV). Conjugated polymers have found use in OPVs as they allow devices to be manufactured by solution-processing techniques such as spin casting, dip coating or ink jet printing. Solution processing can be carried out cheaper and on a larger scale compared to the evaporative techniques used to make inorganic thin film devices. Currently, polymer based photovoltaic devices are achieving efficiencies above 8%.

However, the polymers for use in OPV or OPD devices that have been disclosed in prior art still leave room for further improvements, like a lower bandgap, better processability especially from solution, higher OPV cell efficiency, and higher stability.

A commonly used strategy to control the energy levels and band gaps of polymers is to utilize an alternating copolymer consisting of electron-rich and electron-poor units within the polymer backbone. One of the recently introduced acceptor units is the bithiophene imide (dithieno [3,2-c;2',3'-e]azepine-4,6-dione) as shown below.

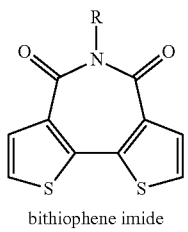

bithiophene imide

Polymers containing this unit have been applied as n-type OFET materials exhibiting mobilities up to 0.04 cm$^2$/Vs and good stabilities (see J. A. Letizia et al., *J. Am. Chem. Soc.* 2008, 130, 9679-9694; J. A. Letizia et al., *Adv Fund. Mater.* 2010, 20, 50-58; X. Guo et al., *J. Am. Chem. Soc.* 2011, 133, 1405-1418; X. Guo et al., *J. Am. Chem. Soc.* 2012, 134, 18427-18439).

Alternating donor-acceptor copolymers containing bithiophene imide as the acceptor and dithienosilole as the donor have been prepared and have shown in blends with PC71 BM an efficiency up to 5.5% in inverted OPV devices, similar to an analogous copolymer with TPD (thienopyrrolidinedione) unit as the acceptor (see X. Guo et al., *J. Am. Chem. Soc.* 2012, 134, 18427-18439; N. Zhou et al., *Adv. Mater.* 2012, 24, 2242-2248). However, compared to TPD, bithiophene imide copolymers are more ordered in the solid state, but have lower hole mobilities.

Copolymers containing the bithiophene imide unit as electron accepting unit are disclosed in WO2011/025454 A1. Random copolymers of bithiophene imide as the acceptor unit for use in transistors and organic solar cells are disclosed in WO2013/142845 A1. Compounds and polymers containing the bithiophene imide unit are also disclosed in WO2009/115413 A2 and WO2010/136401 A2.

However, the OPV and OTFT performance of polymers incorporating bithiophene imide units is limited, which is presumed to be inter alia due to the relatively small size of the conjugated system and, hence, suboptimal π-stacking ability and too high reorganization energy.

Thus there is still a need for organic semiconducting (OSC) polymers which are easy to synthesize, especially by methods suitable for mass production, show good structural organization and film-forming properties, exhibit good electronic properties, especially a high charge carrier mobility, a good processibility, especially a high solubility in organic solvents, and high stability in air. Especially for use in OPV cells, there is a need for OSC materials having a low bandgap, which enable improved light harvesting by the photoactive layer and can lead to higher cell efficiencies, compared to the polymers from prior art.

It was an aim of the present invention to provide compounds for use as organic semiconducting materials that are easy to synthesize, especially by methods suitable for mass production, which show especially good processability, high stability, good solubility in organic solvents, high charge carrier mobility, and a low bandgap. Another aim of the invention was to extend the pool of OSC materials available to the expert. Other aims of the present invention are immediately evident to the expert from the following detailed description.

The inventors of the present invention have found that one or more of the above aims can be achieved by providing conjugated polymers comprising one or more novel units based on a central azepine-4,6-dione-like ring fused with 2-3 aromatic rings on each side, in particular copolymers comprising one or more of these units as electron acceptor units and further comprising one or more electron donor units.

It was found that extension of the bithiophene imide unit by fusing additional aromatic or heteroaromatic rings leads to system having greater propensity to form close π-π contacts in the film, as well as benefiting from reduced electron and hole reorganization energies. Moreover, this modification allows tuning the energetics of this unit, yielding building blocks of desired electron accepting or donating properties.

Surprisingly it was found that donor-acceptor copolymers, comprising the novel units as disclosed and claimed hereinafter as acceptor units, provide several advantages. For example, they have an increased solubility profile in common organic solvents (and especially non-chlorinated solvents) leading to better processability, and exhibit a good solid state organisation leading to efficient charge transport. The incorporation of electron donor units in addition to the novel acceptor units in the polymer backbone can lead to increased light absorption.

SUMMARY

The invention relates to a conjugated polymer comprising one or more units of formula I

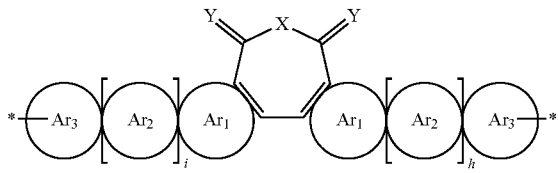

I wherein $Ar_1$ is, on each occurrence identically or differently,

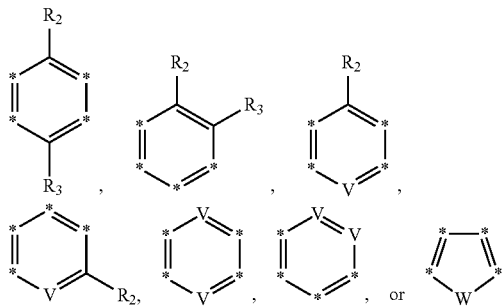

$Ar_2$ is, on each occurrence identically or differently,

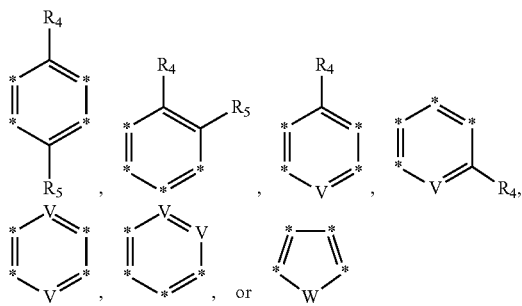

$Ar_3$ is, on each occurrence identically or differently,

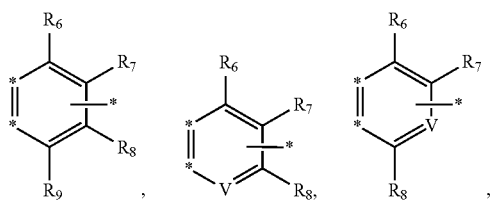

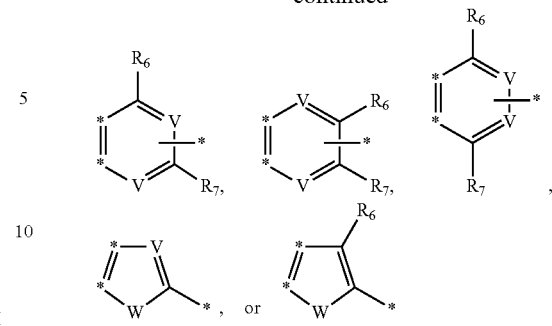

V is $CR^1$ or N,
W is S, O, Se or $NR^1$,
X is O or $NR^1$,
Y is O or S,
$R^1$ on each occurrence identically or differently, denotes H or straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —$NR^o$—, —$SiR^oR^{oo}$—, —$CF_2$—, —$CHR^o$=$CR^{oo}$—, —$CY^1$=$CY^2$— or —C≡C— in such a manner that O and/or S atoms are not linked directly to one another, and in which one or more H atoms are optionally replaced by F, Cl, Br, I or CN, or denotes aryl or heteroaryl with 5 to 15 ring atoms, which is mono- or polycyclic and unsubstituted or substituted by one or more groups $R^S$,
$R^{2-9}$ independently of each other, and on each occurrence identically or differently, denote H, halogen or straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —$NR^o$—, —$SiR^oR^{oo}$—, —$CF_2$—, —$CHR^o$=$CR^{oo}$—, —$CY^1$=$CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or denotes aryl or heteroaryl with 5 to 15 ring atoms, which is mono- or polycyclic and unsubstituted or substituted by one or more groups $R^S$,
$R^S$ denotes, on each occurrence identically or differently, F, Br, Cl, —CN, —NC, —NCO, —NCS, —OCN, —SCN, —C(O)$NR^oR^{oo}$, —C(O)$X^o$, —C(O)$R^o$, —C(O)$OR^o$, —$NH_2$, —$NR^oR^{oo}$, —SH, —$SR^o$, —$SO_3H$, —$SO_2R^o$, —OH, —$NO_2$, —$CF_3$, —$SF_5$, optionally substituted silyl, carbyl or hydrocarbyl with 1 to 40 C atoms that is optionally substituted and optionally comprises one or more hetero atoms,
$Y^1$ and $Y^2$ are independently of each other H, F, Cl or CN,
$R^o$ and $R^{oo}$ are independently of each other H or optionally substituted $C_{1-40}$ carbyl or hydrocarbyl, and preferably denote H or alkyl with 1 to 24 C-atoms,
h and i independently of each other denote 0, 1, 2 or 3.

The invention further relates to a monomer containing a unit of formula I and further containing one or more reactive groups which can be reacted to form a conjugated polymer as described above and below.

The invention further relates to conjugated polymers comprising one or more repeating units of formula I and/or one or more groups selected from arylene and heteroarylene groups that are optionally substituted, and wherein at least one repeating unit in the polymer is a unit of formula I.

The invention further relates to semiconducting polymers comprising one or more units of formula I and one or more additional units which are different from formula I and have electron donor properties.

The invention further relates to semiconducting polymers comprising one or more units of formula I as electron donor units, and preferably further comprising one or more units having electron acceptor properties.

The invention further relates to semiconducting polymers comprising one or more distinct units (hereinafter referred to as "spacer units") which are located between said units of formula I, optional donor units and optional acceptor units, thereby preventing that said units of formula I, optional donor units and optional acceptor units are directly connected to each other in the polymer chain.

The spacer units are selected such that they are not acting as electron acceptor towards the donor units and the units of formula I, and such that they are acting as electron donor towards the acceptor units. A preferred spacer unit is for example thiophene-2,5-diyl or dithiophene-2,5'-diyl, wherein the thiophene rings are optionally substituted in 3- and/or 4-position by a group $R^2$ as defined in formula I.

The spacer units can be introduced into the copolymer for example by copolymerising monomers that comprise a unit of formula I flanked by one, two or more spacer units with reactive groups attached thereto, or by copolymerising monomers that essentially consist of one or more spacer units with reactive groups attached thereto.

The invention further relates to the use of the polymer according to the present invention as electron donor or p-type semiconductor.

The invention further relates to the use of the polymer according to the present invention as electron donor component in a semiconducting material, polymer blend, device or component of a device.

The invention further relates to a mixture or polymer blend comprising one or more polymers according to the present invention and one or more additional compounds which are preferably selected from compounds having one or more of a semiconducting, charge transport, hole transport, electron transport, hole blocking, electron blocking, electrically conducting, photoconducting and light emitting property.

The invention further relates to a mixture or polymer blend comprising one or more polymers according to the present invention as electron donor component, and further comprising one or more compounds or polymers having electron acceptor properties.

The invention further relates to a mixture or polymer blend comprising one or more polymers according to the present invention and one or more n-type organic semiconducting compounds or polymers, preferably selected from fullerenes or substituted fullerenes.

The invention further relates to the use of a polymer, polymer blend or mixture of the present invention as semiconducting, charge transport, electrically conducting, photoconducting or light emitting material, or in an optical, electrooptical, electronic, electroluminescent or photoluminescent device, or in a component of such a device or in an assembly comprising such a device or component.

The invention further relates to a semiconducting, charge transport, electrically conducting, photoconducting or light emitting material, which comprises a polymer, polymer blend or mixture according to the present invention.

The invention further relates to a formulation comprising one or more polymers, polymer blends or mixtures according to the present invention and one or more solvents, preferably selected from organic solvents.

The invention further relates to an optical, electrooptical, electronic, electroluminescent or photoluminescent device, or a component thereof, or an assembly comprising it, which is prepared using a formulation according to the present invention.

The invention further relates to an optical, electrooptical, electronic, electroluminescent or photoluminescent device, or a component thereof, or an assembly comprising it, which comprises a polymer, polymer blend or mixture, or comprises a semiconducting, charge transport, electrically conducting, photoconducting or light emitting material, according to the present invention.

The optical, electrooptical, electronic, electroluminescent and photoluminescent device includes, without limitation, organic field effect transistors (OFET), organic thin film transistors (OTFT), organic light emitting diodes (OLED), organic light emitting transistors (OLET), organic photovoltaic devices (OPV), organic photodetectors (OPD), organic solar cells, dye-sensitized solar cells (DSSC), perovskite-based solar cells, laser diodes, Schottky diodes, photoconductors and photodetectors.

Preferred devices are OFETs, OTFTs, OPVs, OPDs and OLEDs, in particular bulk heterojunction (BHJ) OPVs or inverted BHJ OPVs.

Further preferred is the use of a compound, composition or polymer blend according to the present invention as dye in a DSSC or a perovskite-based solar cell, and a DSSC or perovskite-based solar cells comprising a compound, composition or polymer blend according to the present invention.

The component of the above devices includes, without limitation, charge injection layers, charge transport layers, interlayers, planarising layers, antistatic films, polymer electrolyte membranes (PEM), conducting substrates and conducting patterns.

The assembly comprising such a device or component includes, without limitation, integrated circuits (IC), radio frequency identification (RFID) tags or security markings or security devices containing them, flat panel displays or backlights thereof, electrophotographic devices, electrophotographic recording devices, organic memory devices, sensor devices, biosensors and biochips.

In addition the polymers, polymer blends, mixtures and formulations of the present invention can be used as electrode materials in batteries and in components or devices for detecting and discriminating DNA sequences.

The invention further relates to a bulk heterojunction which comprises, or is being formed from, a mixture comprising one or more polymers according to the present invention and one or more n-type organic semiconducting compounds that are preferably selected from fullerenes or substituted fullerenes. The invention further relates to a bulk heterojunction (BHJ) OPV device or inverted BHJ OPV device, comprising such a bulk heterojunction.

DETAILED DESCRIPTION

The polymers of the present invention are easy to synthesize and exhibit advantageous properties. They show good processability for the device manufacture process, high solubility in organic solvents, and are especially suitable for large scale production using solution processing methods. At the same time, the co-polymers derived from monomers of the present invention and electron donor monomers show low bandgaps, high charge carrier mobilities, high external quantum efficiencies in BHJ solar cells, good morphology when used in p/n-type blends e.g. with fullerenes, high oxidative stability, a long lifetime in electronic devices, and are promising materials for organic electronic OE devices, especially for OPV devices with high power conversion efficiency.

The units of formula I are especially suitable as (electron) acceptor unit in both n-type and p-type semiconducting compounds, polymers or copolymers, in particular copolymers containing both donor and acceptor units, and for the preparation of blends of p-type and n-type semiconductors which are suitable for use in BHJ photovoltaic devices.

Besides, the polymers of the present invention show the following advantageous properties:

i) By fusing additional aromatic rings along the long axis of the extended polycyclic unit, the conjugation within the resultant monomers and consequently along the polymers is extended, and the impact of potential "twists" between repeating units is minimised. Both the features of an extended polycyclic unit and a reduced number of potential "twists" along polymer chains i.e. the increased rigidity of the polymer backbone, favourably reduce the reorganisation energy of the polymer and consequently increase the charge-carrier mobility as described by Marcus Theory, ii) The incorporation of the imide bridge into the bridged bis(thienothiophene) structure modifies the energetic levels of the polymer, particularly by deepening the HOMO level (relative to previously disclosed C- and Si-bridged bis-thienothiophenes), thereby increasing the open circuit potential ($V_{oc}$) in an OPV bulk-heterojunction device compared to a device containing a polymer based on C- and Si-bridged bis(thienothiophenes), iii) Substitution by alkyl, alkoxy and/or alkylaryl or alkoxyaryl groups (R1, R2, R3 on FIG. 3) allows to tune the solubility parameters of the polymer and adjust its phase-separation in blends with fullerenes.

The synthesis of the unit of formula I, its functional derivatives, compounds, homopolymers, and copolymers can be achieved based on methods that are known to the skilled person and described in the literature, as will be further illustrated herein.

As used herein, the term "polymer" will be understood to mean a molecule of high relative molecular mass, the structure of which essentially comprises multiple repetitions of units derived, actually or conceptually, from molecules of low relative molecular mass (*Pure Appl. Chem.,* 1996, 68, 2291). The term "oligomer" will be understood to mean a molecule of intermediate relative molecular mass, the structure of which essentially comprises a small plurality of units derived, actually or conceptually, from molecules of lower relative molecular mass (*Pure Appl. Chem.,* 1996, 68, 2291). In a preferred meaning as used herein present invention a polymer will be understood to mean a compound having >1, i.e. at least 2 repeat units, preferably ≥5 repeat units, and an oligomer will be understood to mean a compound with >1 and <10, preferably <5, repeat units.

Further, as used herein, the term "polymer" will be understood to mean a molecule that encompasses a backbone (also referred to as "main chain") of one or more distinct types of repeat units (the smallest constitutional unit of the molecule) and is inclusive of the commonly known terms "oligomer", "copolymer", "homopolymer", "random polymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, in a formula showing a polymer or a repeat unit, like for example a unit of formula I or a polymer of formula III or IV, or their subformulae, an asterisk (*) will be understood to mean a chemical linkage to an adjacent unit or to a terminal group in the polymer backbone. In a ring, like for example a benzene or thiophene ring, an asterisk (*) will be understood to mean a C atom that is fused to an adjacent ring.

As used herein, the terms "repeat unit", "repeating unit" and "monomeric unit" are used interchangeably and will be understood to mean the constitutional repeating unit (CRU), which is the smallest constitutional unit the repetition of which constitutes a regular macromolecule, a regular oligomer molecule, a regular block or a regular chain (*Pure Appl. Chem.,* 1996, 68, 2291). As further used herein, the term "unit" will be understood to mean a structural unit which can be a repeating unit on its own, or can together with other units form a constitutional repeating unit.

As used herein, a "terminal group" will be understood to mean a group that terminates a polymer backbone. The expression "in terminal position in the backbone" will be understood to mean a divalent unit or repeat unit that is linked at one side to such a terminal group and at the other side to another repeat unit. Such terminal groups include endcap groups, or reactive groups that are attached to a monomer forming the polymer backbone which did not participate in the polymerisation reaction, like for example a group having the meaning of $R^5$ or $R^6$ as defined below.

As used herein, the term "endcap group" will be understood to mean a group that is attached to, or replacing, a terminal group of the polymer backbone. The endcap group can be introduced into the polymer by an endcapping process. Endcapping can be carried out for example by reacting the terminal groups of the polymer backbone with a monofunctional compound ("endcapper") like for example an alkyl- or arylhalide, an alkyl- or arylstannane or an alkyl- or arylboronate. The endcapper can be added for example after the polymerisation reaction. Alternatively the endcapper can be added in situ to the reaction mixture before or during the polymerisation reaction. In situ addition of an endcapper can also be used to terminate the polymerisation reaction and thus control the molecular weight of the forming polymer. Typical endcap groups are for example H, phenyl and lower alkyl.

As used herein, the term "small molecule" will be understood to mean a monomeric compound which typically does not contain a reactive group by which it can be reacted to form a polymer, and which is designated to be used in monomeric form. In contrast thereto, the term "monomer" unless stated otherwise will be understood to mean a monomeric compound that carries one or more reactive functional groups by which it can be reacted to form a polymer.

As used herein, the terms "donor" or "donating" and "acceptor" or "accepting" will be understood to mean an electron donor or electron acceptor, respectively. "Electron donor" will be understood to mean a chemical entity that donates electrons to another compound or another group of atoms of a compound. "Electron acceptor" will be understood to mean a chemical entity that accepts electrons transferred to it from another compound or another group of atoms of a compound. See also International Union of Pure and Applied Chemistry, Compendium of Chemical Technology, Gold Book, Version 2.3.2, 19. August 2012, pages 477 and 480.

As used herein, the term "n-type" or "n-type semiconductor" will be understood to mean an extrinsic semiconductor in which the conduction electron density is in excess of the mobile hole density, and the term "p-type" or "p-type semiconductor" will be understood to mean an extrinsic semiconductor in which mobile hole density is in excess of the conduction electron density (see also, J. Thewlis, *Concise Dictionary of Physics*, Pergamon Press, Oxford, 1973).

As used herein, the term "leaving group" will be understood to mean an atom or group (which may be charged or uncharged) that becomes detached from an atom in what is considered to be the residual or main part of the molecule taking part in a specified reaction (see also *Pure Appl. Chem.*, 1994, 66, 1134).

As used herein, the term "conjugated" will be understood to mean a compound (for example a polymer) that contains mainly C atoms with $sp^2$-hybridisation (or optionally also sp-hybridisation), and wherein these C atoms may also be replaced by hetero atoms. In the simplest case this is for example a compound with alternating C—C single and double (or triple) bonds, but is also inclusive of compounds with aromatic units like for example 1,4-phenylene. The term "mainly" in this connection will be understood to mean that a compound with naturally (spontaneously) occurring defects, or with defects included by design, which may lead to interruption of the conjugation, is still regarded as a conjugated compound.

As used herein, unless stated otherwise the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1,2,4-trichlorobenzene. Unless stated otherwise, 1,2,4-trichlorobenzene is used as solvent. The degree of polymerization, also referred to as total number of repeat units, n, will be understood to mean the number average degree of polymerization given as $n=M_n/M_U$, wherein $M_n$ is the number average molecular weight and $M_U$ is the molecular weight of the single repeat unit, see J. M. G. Cowie, *Polymers: Chemistry & Physics of Modern Materials*, Blackie, Glasgow, 1991.

As used herein, the term "carbyl group" will be understood to mean denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" will be understood to mean a carbyl group that does additionally contain one or more H atoms and optionally contains one or more hetero atoms like for example N, O, S, B, P, Si, Se, As, Te or Ge.

As used herein, the term "hetero atom" will be understood to mean an atom in an organic compound that is not a H- or C-atom, and preferably will be understood to mean N, O, S, B, P, Si, Se, As, Te or Ge.

A carbyl or hydrocarbyl group comprising a chain of three or more C atoms may be straight-chain, branched and/or cyclic, and may include spiro-connected and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more hetero atoms, preferably selected from N, O, S, B, P, Si, Se, As, Te and Ge.

Further preferred carbyl and hydrocarbyl group include for example: a $C_1$-$C_{40}$ alkyl group, a $C_1$-$C_{40}$ fluoroalkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_2$-$C_{20}$ ketone group, a $C_2$-$C_{20}$ ester group, a $C_6$-$C_{12}$ aryl group, and a $C_4$-$C_{20}$ polyenyl group, respectively.

Also included are combinations of groups having carbon atoms and groups having hetero atoms, like e.g. an alkynyl group, preferably ethynyl, that is substituted with a silyl group, preferably a trialkylsilyl group.

The carbyl or hydrocarbyl group may be an acyclic group or a cyclic group. Where the carbyl or hydrocarbyl group is an acyclic group, it may be straight-chain or branched. Where the carbyl or hydrocarbyl group is a cyclic group, it may be a non-aromatic carbocyclic or heterocyclic group, or an aryl or heteroaryl group.

A non-aromatic carbocyclic group as referred to above and below is saturated or unsaturated and preferably has 4 to 30 ring C atoms. A non-aromatic heterocyclic group as referred to above and below preferably has 4 to 30 ring C atoms, wherein one or more of the C ring atoms are optionally replaced by a hetero atom, preferably selected from N, O, S, Si and Se, or by a —S(O)— or —S(O)$_2$— group. The non-aromatic carbo- and heterocyclic groups are mono- or polycyclic, may also contain fused rings, preferably contain 1, 2, 3 or 4 fused or unfused rings, and are optionally substituted with one or more groups L, wherein L is selected from halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, and is preferably alkyl, alkoxy, thioalkyl, alkylcarbonyl, alkoxycarbonyl or alkoxycarbonyloxy with 1 to 20 C atoms that is optionally fluorinated, X$^0$ is halogen, preferably F, Cl or Br, and R$^0$, R$^{00}$ have the meanings given above and below, and preferably denote H or alkyl with 1 to 20 C atoms.

Preferred substituents L are selected from halogen, most preferably F, or alkyl, alkoxy, oxaalkyl, thioalkyl, fluoroalkyl and fluoroalkoxy with 1 to 16 C atoms, or alkenyl or alkynyl with 2 to 20 C atoms.

Preferred non-aromatic carbocyclic or heterocyclic groups are tetrahydrofuran, indane, pyran, pyrrolidine, piperidine, cyclopentane, cyclohexane, cycloheptane, cyclopentanone, cyclohexanone, dihydro-furan-2-one, tetrahydro-pyran-2-one and oxepan-2-one.

An aryl group as referred to above and below preferably has 4 to 30 ring C atoms, is mono- or polycyclic and may also contain fused rings, preferably contains 1, 2, 3 or 4 fused or unfused rings, and is optionally substituted with one or more groups L as defined above.

A heteroaryl group as referred to above and below preferably has 4 to 30 ring C atoms, wherein one or more of the C ring atoms are replaced by a hetero atom, preferably selected from N, O, S, Si and Se, is mono- or polycyclic and may also contain fused rings, preferably contains 1, 2, 3 or 4 fused or unfused rings, and is optionally substituted with one or more groups L as defined above.

As used herein, "arylene" will be understood to mean a divalent aryl group, and "heteroarylene" will be understood to mean a divalent heteroaryl group, including all preferred meanings of aryl and heteroaryl as given above and below.

Preferred aryl and heteroaryl groups are phenyl in which, in addition, one or more CH groups may be replaced by N, naphthalene, thiophene, selenophene, thienothiophene, dithienothiophene, fluorene and oxazole, all of which can be unsubstituted, mono- or polysubstituted with L as defined above. Very preferred rings are selected from pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, 4H-cyclopenta[2,1-b;3,4-b']dithiophene, 7H-3,4-dithia-7-sila-cyclopenta[a]pentalene, all of which can be unsubstituted, mono- or polysubstituted with L as defined above. Further examples of aryl and heteroaryl groups are those selected from the groups shown hereinafter.

An alkyl group or an alkoxy group, i.e., where the terminal $CH_2$ group is replaced by —O—, can be straight-chain or branched. It is preferably a straight-chain, has 2, 3, 4, 5, 6, 7, 8, 10, 12, 14, 16, 18, 20 or 24 carbon atoms and accordingly is preferably ethyl, propyl, butyl, pentyl, hexyl, heptyl, octyl, decyl, dodecyl, tetradecyl, hexadecyl, octadecyl or didecyl, ethoxy, propoxy, butoxy, pentoxy, hexoxy, heptoxy, octoxy, decoxy, dodecoxy, tetradecoxy, hexadecoxy, octadecoxy or didecoxy, furthermore methyl, nonyl, undecyl, tridecyl, pentadecyl, nonoxy, undecoxy or tridecoxy, for example.

An alkenyl group, wherein one or more $CH_2$ groups are replaced by —CH=CH— can be straight-chain or branched. It is preferably straight-chain, has 2 to 10 C atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example. Oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one $CH_2$ group is replaced by —O— and one $CH_2$ group is replaced by —C(O)—, these radicals are preferably neighboured.

Accordingly these radicals together form a carbonyloxy group —C(O)—O— or an oxycarbonyl group —O—C(O)—. Preferably this group is straight-chain and has 2 to 6 C atoms. It is accordingly preferably acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxycarbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, 4-(methoxycarbonyl)-butyl.

An alkyl group wherein two or more $CH_2$ groups are replaced by —O— and/or —C(O)O— can be straight-chain or branched. It is preferably straight-chain and has 3 to 12 C atoms. Accordingly it is preferably bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl, 5,5-bis-(ethoxycarbonyl)-hexyl.

A thioalkyl group, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

A fluoroalkyl group is preferably perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, in particular 1,1-difluoroalkyl, all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 2-ethylhexyl, 2-butylhexyl, 2-ethyloctyl, 2-butyloctly, 2-hexyloctyl, 2-ethyldecyl, 2-butyldecyl, 2-hexyldecyl, 2-octyldecyl, 2-ethyldodecyl, 2-butyldodecyl, 2-hexyldodecyl, 2-octyldodecyl, 2-decyldodecyl, 2-propylpentyl, 3-methylpentyl, 3-ethylpentyl, 3-ethylheptyl, 3-butylheptyl, 3-ethylnonyl, 3-butylnonyl, 3-hexylnonyl, 3-ethylundecyl, 3-butylundecyl, 3-hexylundecyl, 3-octylundecyl, 4-ethylhexyl, 4-ethyloctyl, 4-butyloctyl, 4-ethyldecyl, 4-butyldecyl, 4-hexyldecyl, 4-ethyldodecyl, 4-butyldodecyl, 4-hexyldodecyl, 4-octyldodecyl, in particular 2-methylbutyl, 2-methylbutoxy, 2-methylpentoxy, 3-methyl-pentoxy, 2-ethyl-hexoxy, 2-butyloctoxyo, 2-hexyldecoxy, 2-octyldodecoxy, 1-methylhexoxy, 2-octyloxy, 2-oxa-3-methylbutyl, 3-oxa-4-methyl-pentyl, 4-methylhexyl, 2-hexyl, 2-octyl, 2-nonyl, 2-decyl, 2-dodecyl, 6-methoxy-octoxy, 6-methyloctoxy, 6-methyloctanoyl-oxy, 5-methylheptyloxy-carbonyl, 2-methylbutyryloxy, 3-methylvaleroyloxy, 4-methylhexanoyloxy, 2-chloro-propionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example.

Very preferred are 2-ethylhexyl, 2-butylhexyl, 2-ethyloctyl, 2-butyloctly, 2-hexyloctyl, 2-ethyldecyl, 2-butyldecyl, 2-hexyldecyl, 2-octyldecyl, 2-ethyldodecyl, 2-butyldodecyl, 2-hexyldodecyl, 2-octyldodecyl, 2-decyldodecyl, 3-ethylheptyl, 3-butylheptyl, 3-ethylnonyl, 3-butylnonyl, 3-hexylnonyl, 3-ethylundecyl, 3-butylundecyl, 3-hexylundecyl, 3-octylundecyl, 4-ethyloctyl, 4-butyloctyl, 4-ethyldecyl, 4-butyldecyl, 4-hexyldecyl, 4-ethyldodecyl, 4-butyldodecyl, 4-hexyldodecyl, 4-octyldodecyl, 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the alkyl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

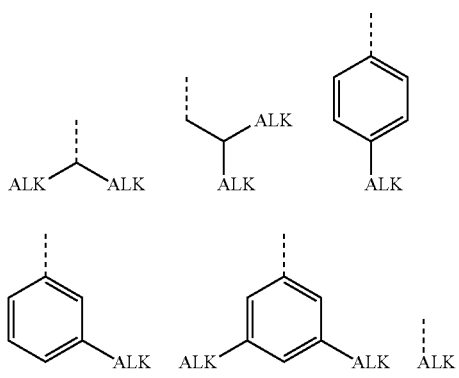

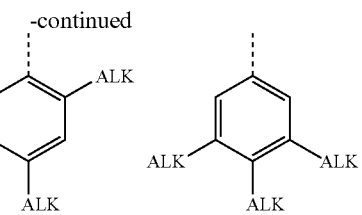

wherein "ALK" denotes optionally fluorinated and straight-chain or branched, preferably straight-chain, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

—$CY^1$=$CY^2$— is preferably —CH=CH—, —CF=CF— or —CH=C(CN)—.

As used herein, "halogen" includes F, Cl, Br or I, preferably F, Cl or Br.

A used herein, —CO—, —C(=O)— and —C(O)— will be understood to mean a carbonyl group, i.e. a group having the structure

Preferred units of formula I are those of formula I1:

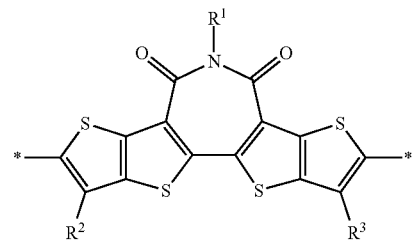

wherein $R^{1-3}$ are as defined in formula I.

Preferably $R^{1-9}$ in formula I and I1, when being different from H, denote straight-chain, branched or cyclic alkyl with 1 to 50, preferably 1 to 30, C atoms that is optionally fluorinated.

In formula I1 preferably $R^1$, and very preferably also $R^2$ and $R^3$, are different from H.

In another preferred embodiment one or more of $R^{2-9}$ denotes a straight-chain, branched or cyclic alkyl group with 1 to 50, preferably 2 to 50, very preferably 2 to 30, more preferably 2 to 24, most preferably 2 to 16 C atoms, in which one or more $CH_2$ or $CH_3$ groups are replaced by a cationic or anionic group.

The cationic group is preferably selected from the group consisting of phosphonium, sulfonium, ammonium, uronium, thiouronium, guanidinium or heterocyclic cations such as imidazolium, pyridinium, pyrrolidinium, triazolium, morpholinium or piperidinium cation.

Preferred cationic groups are selected from the group consisting of tetraalkylammonium, tetraalkylphosphonium, N-alkylpyridinium, N,N-dialkylpyrrolidinium, 1,3-dialkylimidazolium, wherein "alkyl" preferably denotes a straight-chain or branched alkyl group with 1 to 12 C atoms.

Further preferred cationic groups are selected from the group consisting of the following formulae

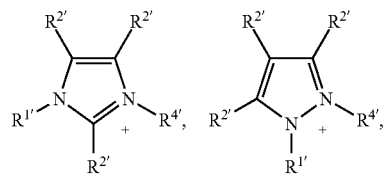
imidazolium  1H-pyrazolium

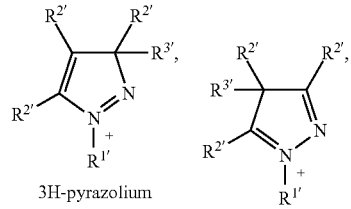
3H-pyrazolium  4H-pyrazolium

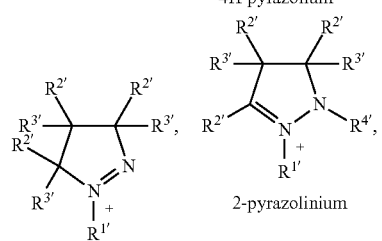
1-pyrazolinium  2-pyrazolinium

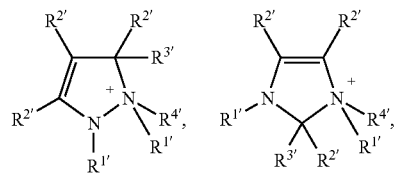
3-pyrazolinium  2,3-dihydroimidazolinium

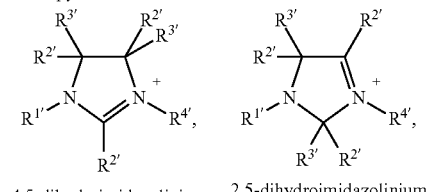
4,5-dihydroimidazolinium  2,5-dihydroimidazolinium

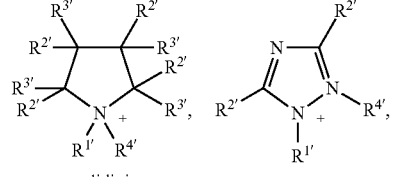
pyrrolidinium  1,2,4-triazolium

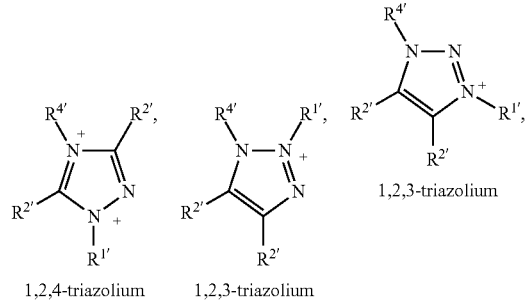
1,2,4-triazolium  1,2,3-triazolium  1,2,3-triazolium

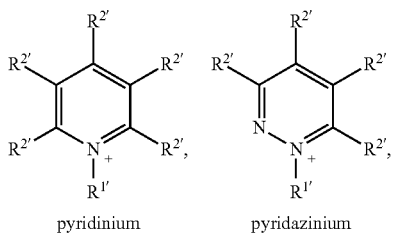
pyridinium  pyridazinium

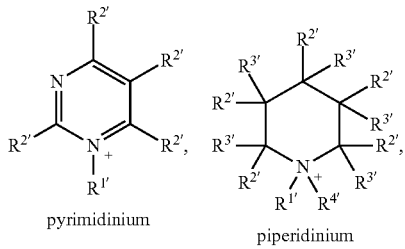
pyrimidinium  piperidinium

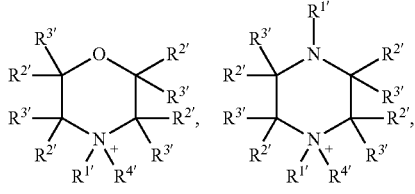
morpholinium  piperazinium

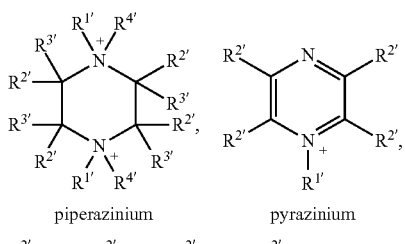
piperazinium  pyrazinium

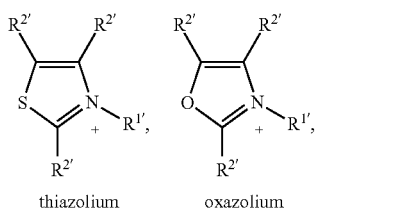
thiazolium  oxazolium

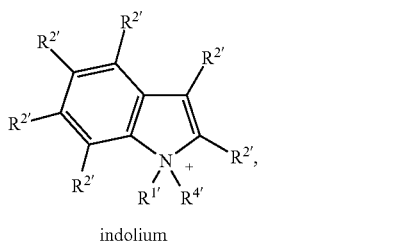
indolium quinolinium

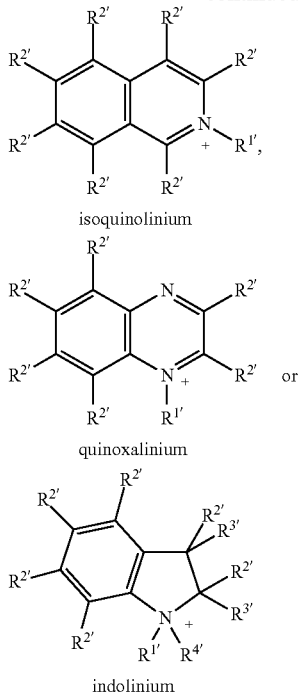

isoquinolinium quinoxalinium indolinium wherein $R^{1'}$, $R^{2'}$, $R^{3'}$ and $R^{4'}$ denote, independently of each other, H, a straight-chain or branched alkyl group with 1 to 12 C atoms or non-aromatic carbo- or heterocyclic group or an aryl or heteroaryl group, each of the aforementioned groups having 3 to 20, preferably 5 to 15, ring atoms, being mono- or polycyclic, and optionally being substituted by one or more identical or different substituents $R^S$ as defined below, or denote a link to the respective group $R^{2-8}$.

In the above cationic groups of the above-mentioned formulae any one of the groups $R^{1'}$, $R^{2'}$, $R^{3'}$ and $R^{4'}$ (if they replace a $CH_3$ group) can denote a link to the group $R^1$, or two neighbored groups $R^{1'}$, $R^{2'}$, $R^{3'}$ or $R^{4'}$ (if they replace a $CH_2$ group) can denote a link to the respective group $R^{2-8}$.

The anionic group is preferably selected from the group consisting of borate, imide, phosphate, sulfonate, sulfate, succinate, naphthenate or carboxylate, very preferably from phosphate, sulfonate or carboxylate.

Preferably the conjugated polymer comprises
one or more units selected of formula I or I1, and
one or more units selected from arylene and heteroarylene groups having electron donor properties that are optionally substituted and are different from the units of formula I, and
optionally one or more units selected from arylene and heteroarylene groups having electron acceptor properties that are optionally substituted and are different from the units of formula I, and
optionally one or more distinct spacer units that are selected from arylene and heteroarylene groups that are optionally substituted and are different from the units of formula I and the acceptor and donor units,
wherein preferably each unit of formula I and each donor and acceptor unit is connected on each side to at least one spacer unit.

Preferably the conjugated polymer comprises at least one donor unit.

Preferred polymers according to the present invention comprise one or more repeating units of formula IIa or IIb:

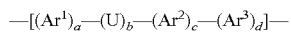   IIa

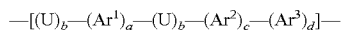   IIb wherein
U is a unit of formula I or I1,
Ar$^1$, Ar$^2$, Ar$^3$ are, on each occurrence identically or differently, and independently of each other, arylene or heteroarylene that is different from U, preferably has 5 to 30 ring atoms, and is optionally substituted, preferably by one or more groups $R^S$,
$R^S$ is on each occurrence identically or differently F, Br, Cl, —CN, —NC, —NCO, —NCS, —OCN, —SCN, —C(O)NR$^0$R$^{00}$, —C(O)X$^0$, —C(O)R$^0$, —C(O)OR$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, carbyl or hydrocarbyl with 1 to 40 C atoms that is optionally substituted and optionally comprises one or more hetero atoms,
R$^0$ and R$^{00}$ are independently of each other H or optionally substituted C$_{1-40}$ carbyl or hydrocarbyl, and preferably denote H or alkyl with 1 to 12 C-atoms,
X$^0$ is halogen, preferably F, Cl or Br,
a, b, c are on each occurrence identically or differently 0, 1 or 2,
d is on each occurrence identically or differently 0 or an integer from 1 to 10,
wherein the polymer comprises at least one repeating unit of formula IIa or IIb wherein b is at least 1.

Further preferred polymers according to the present invention comprise, in addition to the units of formula I, IIa or IIb, one or more repeating units selected from monocyclic or polycyclic arylene or heteroarylene groups that are optionally substituted and comprise an acceptor unit. These additional repeating units are preferably selected of formula IIIa and IIIb

   IIIa

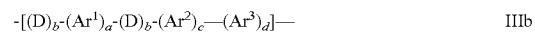   IIIb wherein Ar$^1$, Ar$^2$, Ar$^3$, a, b, c and d are as defined in formula IIa, and D is an arylene or heteroarylene group that is different from U and Ar$^{1-3}$, preferably has 5 to 30 ring atoms, is optionally substituted by one or more groups R$^S$ as defined above, and has electron donor properties, wherein the polymer comprises at least one repeating unit of formula IIIa or IIIb wherein b is at least 1.

R$^S$ preferably denotes, on each occurrence identically or differently, H, straight-chain, branched or cyclic alkyl with 1 to 30 C atoms, in which one or more CH$_2$ groups are optionally replaced by —O—, —S—, —C(O)—, —C(S)—, —C(O)—O—, —O—C(O)—, —NR$^0$—, —SiR$^0$R$^{00}$—, —CF$_2$—, —CHR$^0$=CR$^{00}$—, —CY$^1$=CY$^2$— or —C≡C— in such a manner that O and/or S atoms are not linked directly to one another, and in which one or more H atoms are optionally replaced by F, Cl, Br, I or CN, or denotes aryl, heteroaryl, aryloxy or heteroaryloxy with 4 to 20 ring atoms which is optionally substituted, preferably by halogen or by one or more of the aforementioned alkyl or cyclic alkyl groups, wherein R$^0$, R$^{00}$, X$^0$, Y$^1$ and Y$^2$ are as defined above.

The conjugated polymers according to the present invention are preferably selected of formula IV:

   IV wherein
A, B, C independently of each other denote a distinct unit of formula I, I1, IIa, IIb, IIIa, IIIb, or their subformulae,
x is >0 and ≤1,
y is ≥0 and <1,
z is ≥0 and <1,
x+y+z is 1, and
n is an integer >1.

Preferred polymers of formula IV are selected of the following formulae $$*-[(Ar^1-U-Ar^2)_x-(Ar^3)_y]_n-\quad\text{IVa}$$

$$*-[(Ar^1-U-Ar^2)_x-(Ar^3-Ar^3)_y]_n-*\quad\text{IVb}$$

$$*-[(Ar^1-U-Ar^2)_x-(Ar^3-Ar^3-Ar^3)_y]_n-*\quad\text{IVc}$$

$$*-[(Ar^1)_a-(U)_b-(Ar^2)_c-(Ar^3)_d]_n-*\quad\text{IVd}$$

$$*-([(Ar^1)_a-(U)_b-(Ar^2)_c-(Ar^3)_d]_x-[(Ar^1)_a-(D)_b-(Ar^2)_c-(Ar^3)_d]_y)_n-*\quad\text{IVe}$$

$$*-[(U-Ar^1-U)_x-(Ar^2-Ar^3)_y]_n-*\quad\text{IVf}$$

$$*-[(U-Ar^1-U)_x-(Ar^2-Ar^3-Ar^3)_y]_n-*\quad\text{IVg}$$

$$*-[(U)_b-(Ar^1)_a-(U)_b-(Ar^2)_c]_n-*\quad\text{IVh}$$

$$*-([(U)_b-(Ar^1)_a-(U)_b-(Ar^2)_c]_x-[(D)_b-(Ar^1)_a-(A^c)_b-(Ar^2)_d]_y)_n-*\quad\text{IVi}$$

$$*-[(U-Ar^1)_x-(U-Ar^2)_y-(U-Ar^3)_z]_n-*\quad\text{IVk}$$

$$*-[U]_n-*\quad\text{IVm}$$

wherein U, $Ar^1$, $Ar^2$, $Ar^3$, a, b, c and d have in each occurrence identically or differently one of the meanings given in formula IIa, D has on each occurrence identically or differently one of the meanings given in formula IIIa, and x, y, z and n are as defined in formula IV, wherein these polymers can be alternating or random copolymers, and wherein in formula IVd and IVe in at least one of the repeating units $[(Ar^1)_a-(U)_b-(Ar^2)_c-(Ar^3)_d]$ and in at least one of the repeating units $[(Ar^1)_a-(D)_b-(Ar^2)_c-(Ar^3)_d]$ b is at least 1 and wherein in formula IVh and IVi in at least one of the repeating units $[(U)_b-(Ar^1)_a-(U)_b-(Ar^2)_d]$ and in at least one of the repeating units $[(U)_b-(Ar^1)_a-(U)_b-(Ar^2)_d]$ b is at least 1.

In the polymers of formula IV and its subformulae IVa to IVm and IV1 to IV30, b is preferably 1 in all repeating units.

In the polymers of formula IV and its subformulae IVa to IVm and IV1 to IV30, x is preferably from 0.1 to 0.9, very preferably from 0.3 to 0.7.

In a preferred embodiment of the present invention one of y and z is 0 and the other is >0. In another preferred embodiment of the present invention, both y and z are 0. In yet another preferred embodiment of the present invention, both y and z are >0. If in the polymers of formula IV and its subformulae IVa to IVm and IV1 to IV30 y or z is >0, it is preferably from 0.1 to 0.9, very preferably from 0.3 to 0.7.

In the polymers according to the present invention, the total number of repeating units n is preferably from 2 to 10,000. The total number of repeating units n is preferably ≥5, very preferably ≥10, most preferably ≥50, and preferably ≤500, very preferably ≤1,000, most preferably ≤2,000, including any combination of the aforementioned lower and upper limits of n.

The polymers of the present invention include homopolymers and copolymers, like statistical or random copolymers, alternating copolymers and block copolymers, as well as combinations thereof.

Especially preferred are polymers selected from the following groups:

Group A consisting of homopolymers of the unit U or $(Ar^1-U)$ or $(Ar^1-U-Ar^2)$ or $(Ar^1-U-Ar^3)$ or $(U-Ar^2-Ar^3)$ or $(Ar^1-U-Ar^2-Ar^3)$ or $(U-Ar^1-U)$, i.e. where all repeating units are identical, Group B consisting of random or alternating copolymers formed by identical units $(Ar^1-U-Ar^2)$ or $(U-Ar^1-U)$ and identical units $(Ar^3)$, Group C consisting of random or alternating copolymers formed by identical units $(Ar^1-U-Ar^2)$ or $(U-Ar^1-U)$ and identical units $(A^1)$, Group D consisting of random or alternating copolymers formed by identical units $(Ar^1-U-Ar^2)$ or $(U-Ar^1-U)$ and identical units $(Ar^1-D-Ar^2)$ or $(D-Ar^1-D)$, wherein in all these groups U, D, $Ar^1$, $Ar^2$ and $Ar^3$ are as defined above and below, in groups A, B and C $Ar^1$, $Ar^2$ and $Ar^3$ are different from a single bond, and in group D one of $Ar^1$ and $Ar^2$ may also denote a single bond.

Especially preferred are repeating units, monomers and polymers of formulae I, I1, IIa, IIb, IIIa, IIIb, IV, IVa-IVm, P, MVI-MVII, wherein one or more of $Ar^1$, $Ar^2$, $Ar^3$ and D denote arylene or heteroarylene, preferably having electron donor properties, selected from the group consisting of the following formulae

(D1)

(D2)

(D3)

(D4)

(D5)

(D6)

(D7)

(D8)

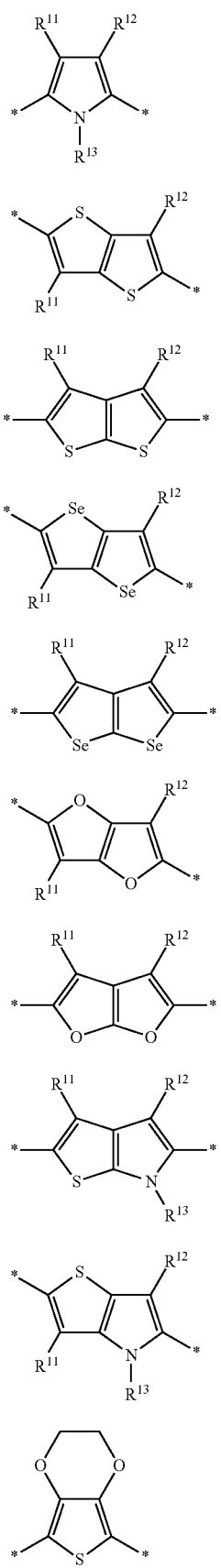
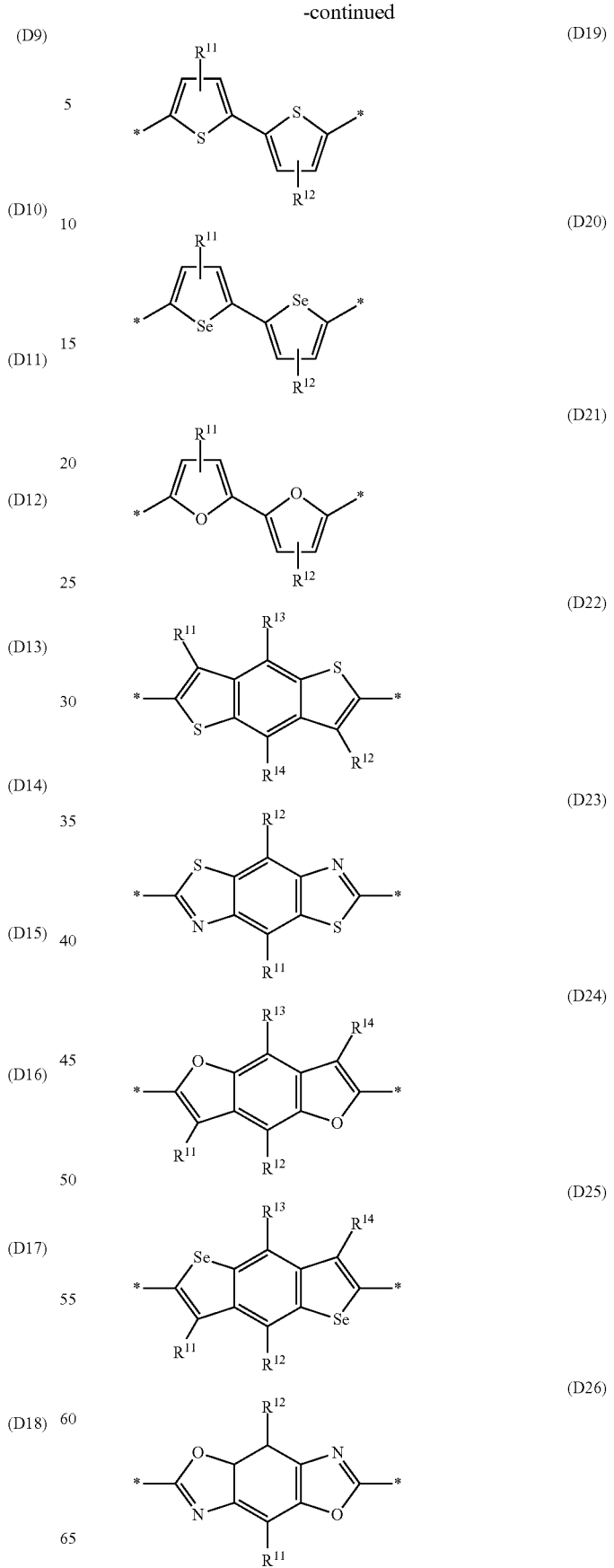

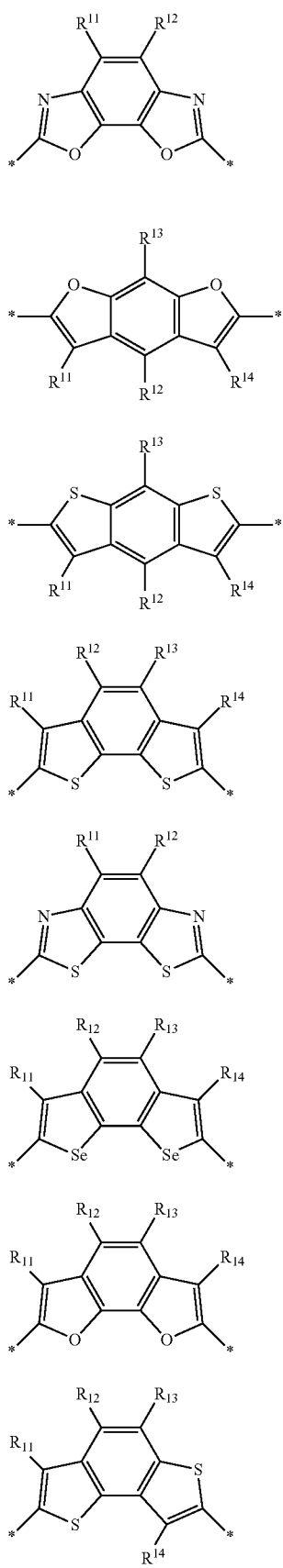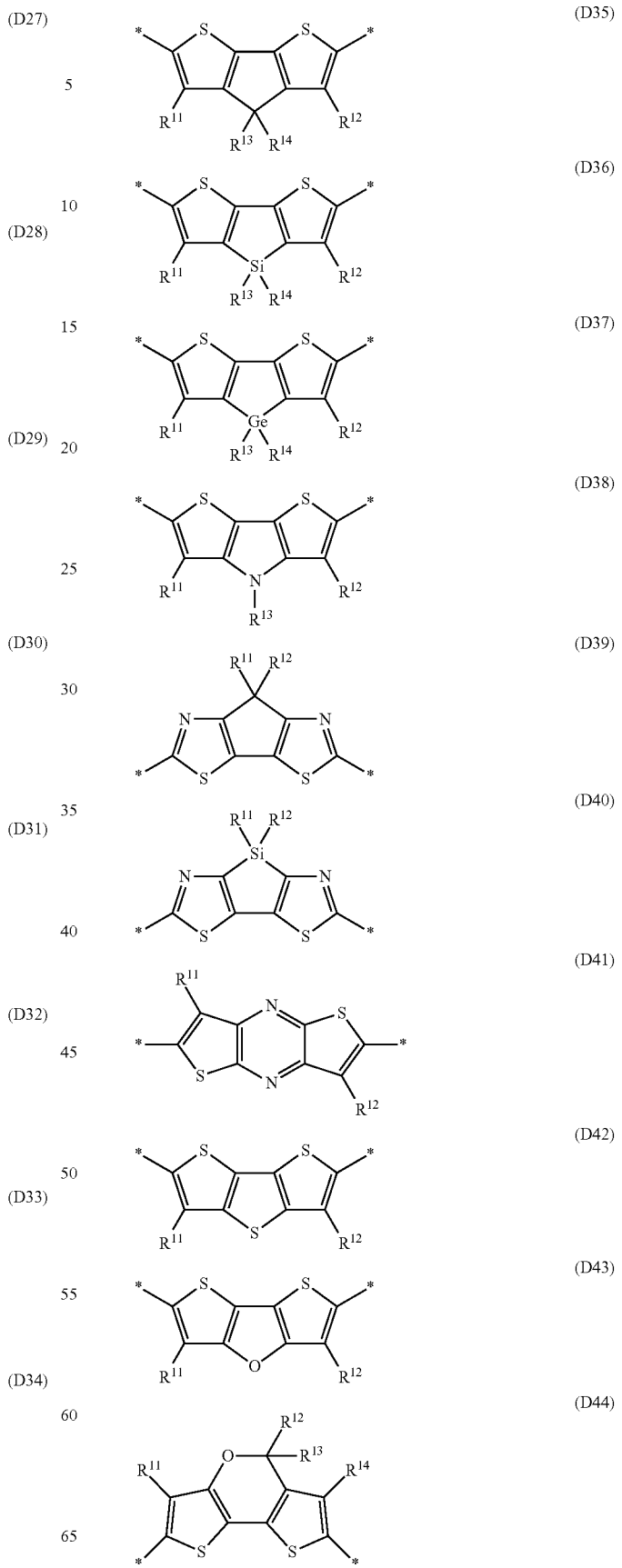

-continued
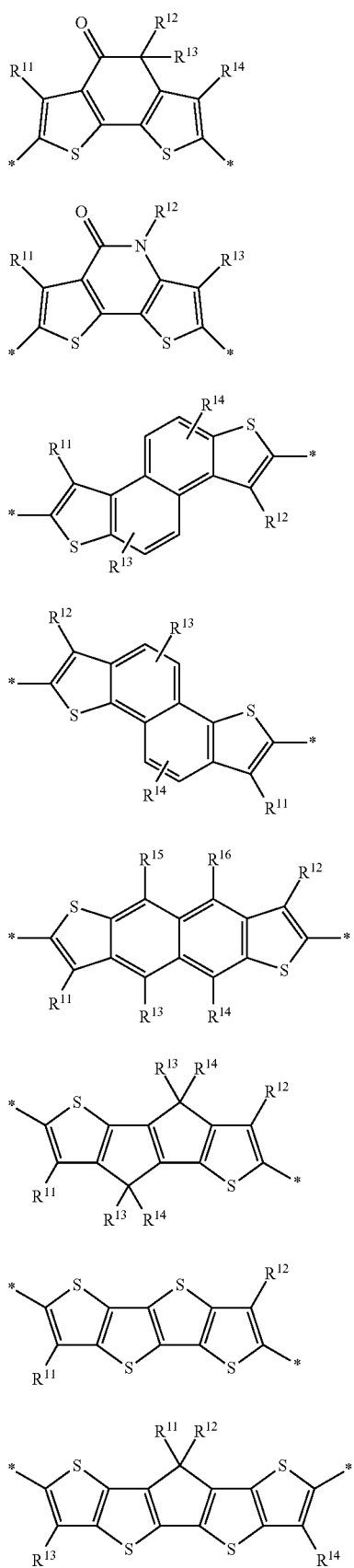
(D45)
(D46)
(D47)
(D48)
(D49)
(D50)
(D51)
(D52)
-continued
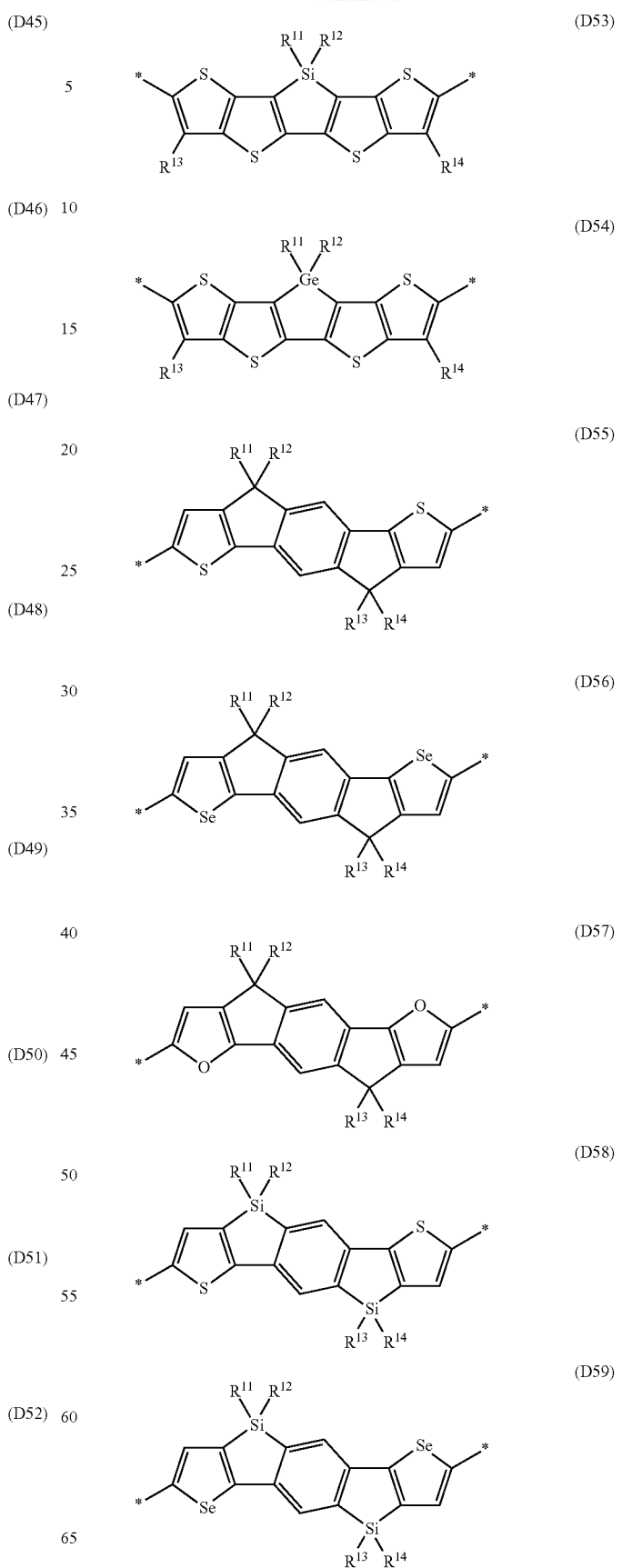
(D53)
(D54)
(D55)
(D56)
(D57)
(D58)
(D59)

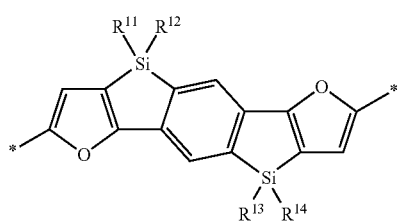
(D60)
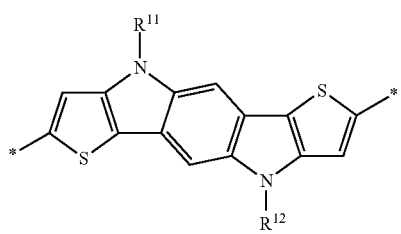
(D61)
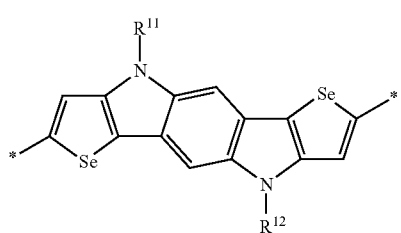
(D62)
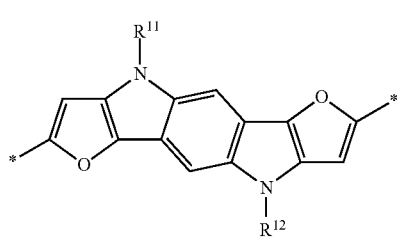
(D63)
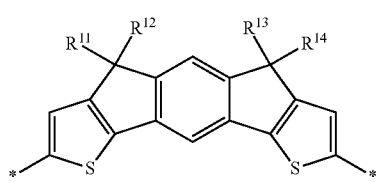
(D64)
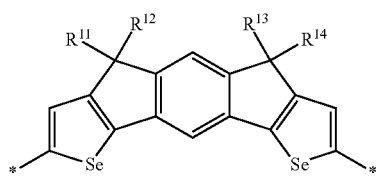
(D65)
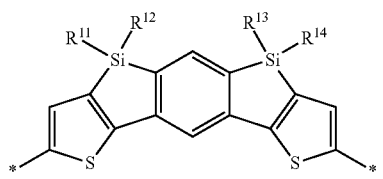
(D66)
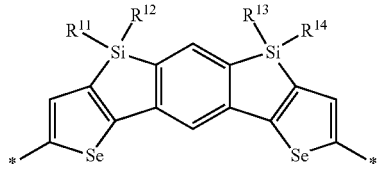
(D67)
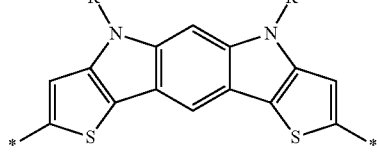
(D68)
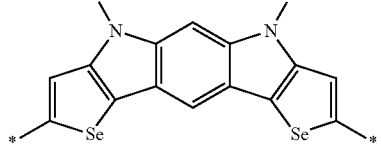
(D69)
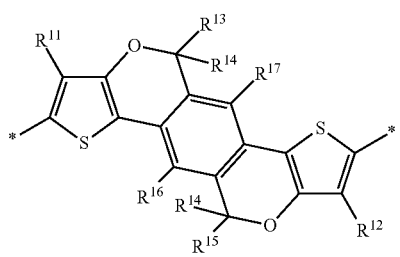
(D70)
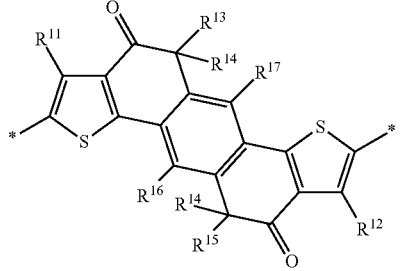
(D71)
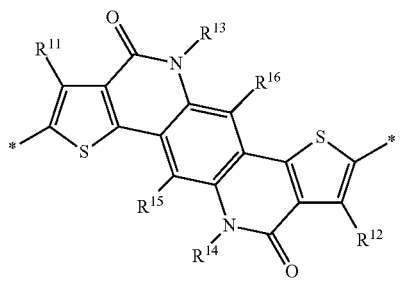
(D72)
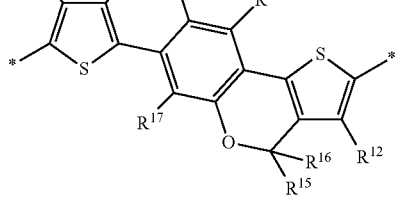
(D73)

-continued
(D74)
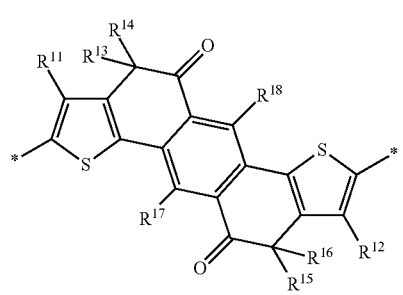
(D75)
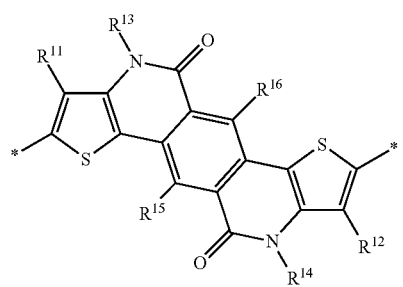
(D76)
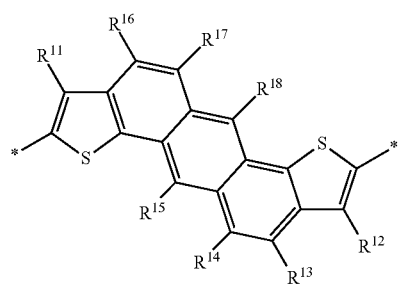
(D77)
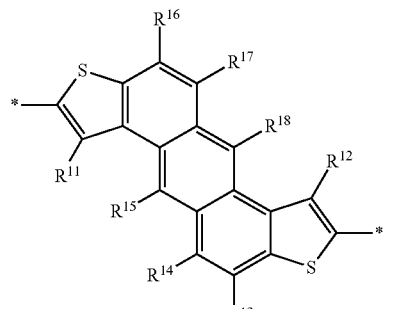
(D78)
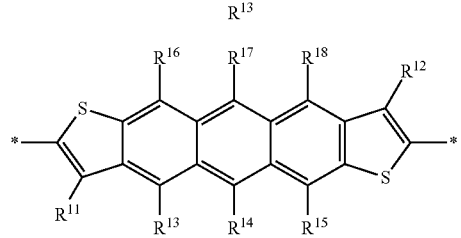
(D79)
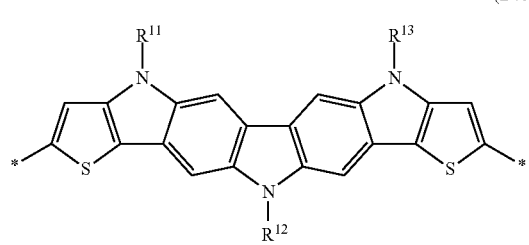
-continued
(D80)
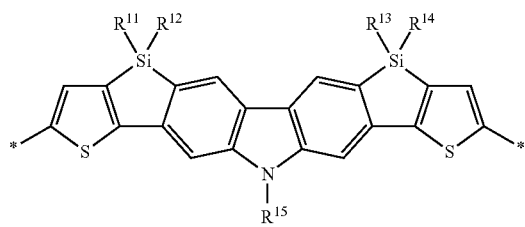
(D81)
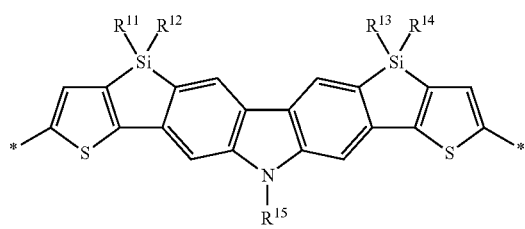
(D82)
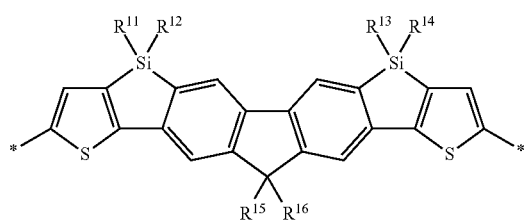
(D83)
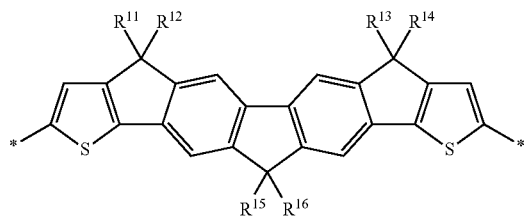
(D84)
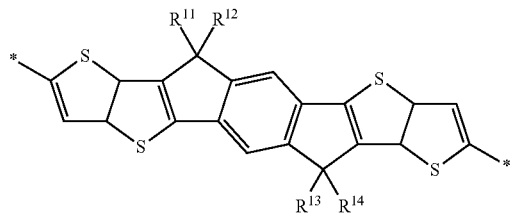
(D85)
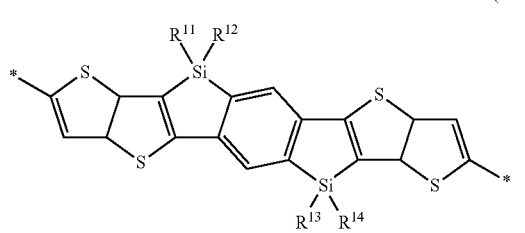

(D86)
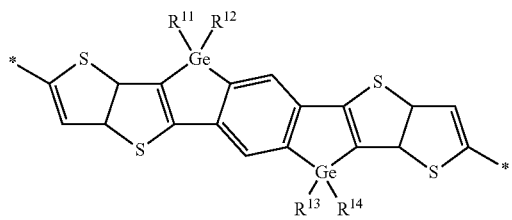
(D87)
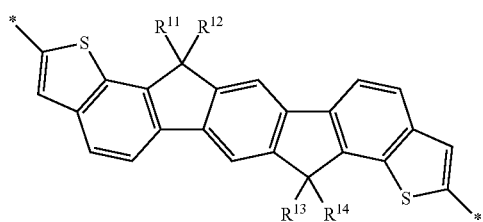
(D88)
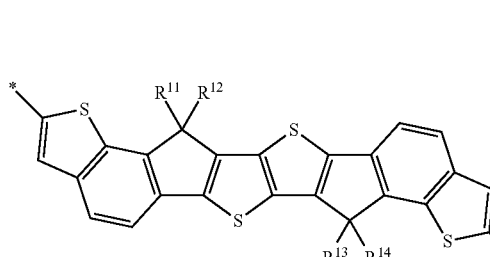
(D89)
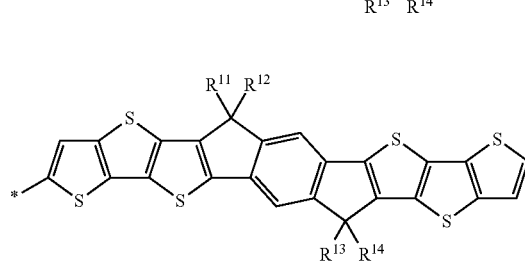
(D90)
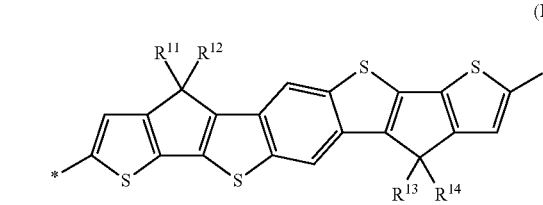
(D91)
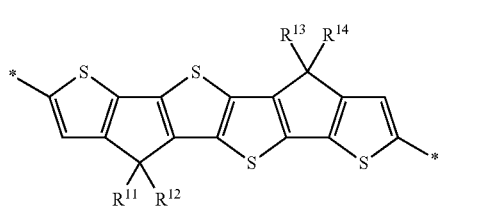
(D92)
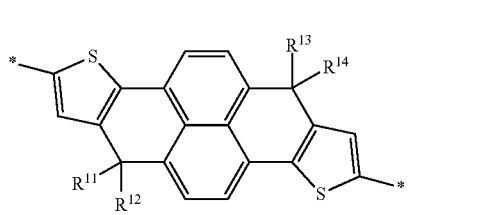
(D93)
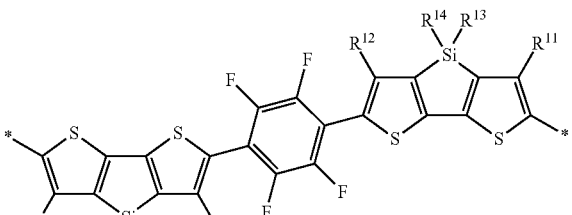
(D94)
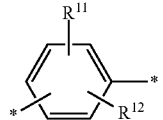
(D95)
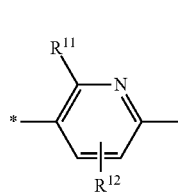
(D96)
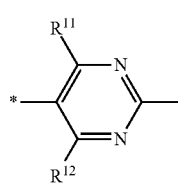
(D97)
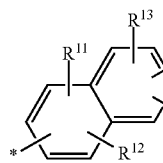
(D98)
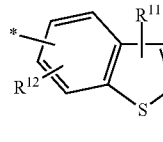
(D99)
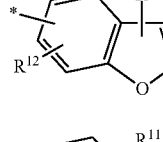
(D100)
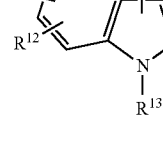
(D101)
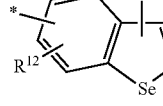

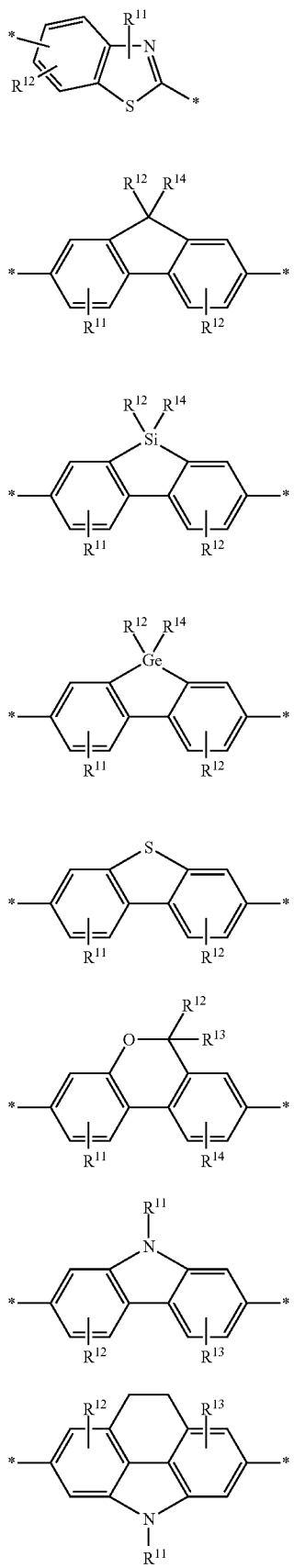
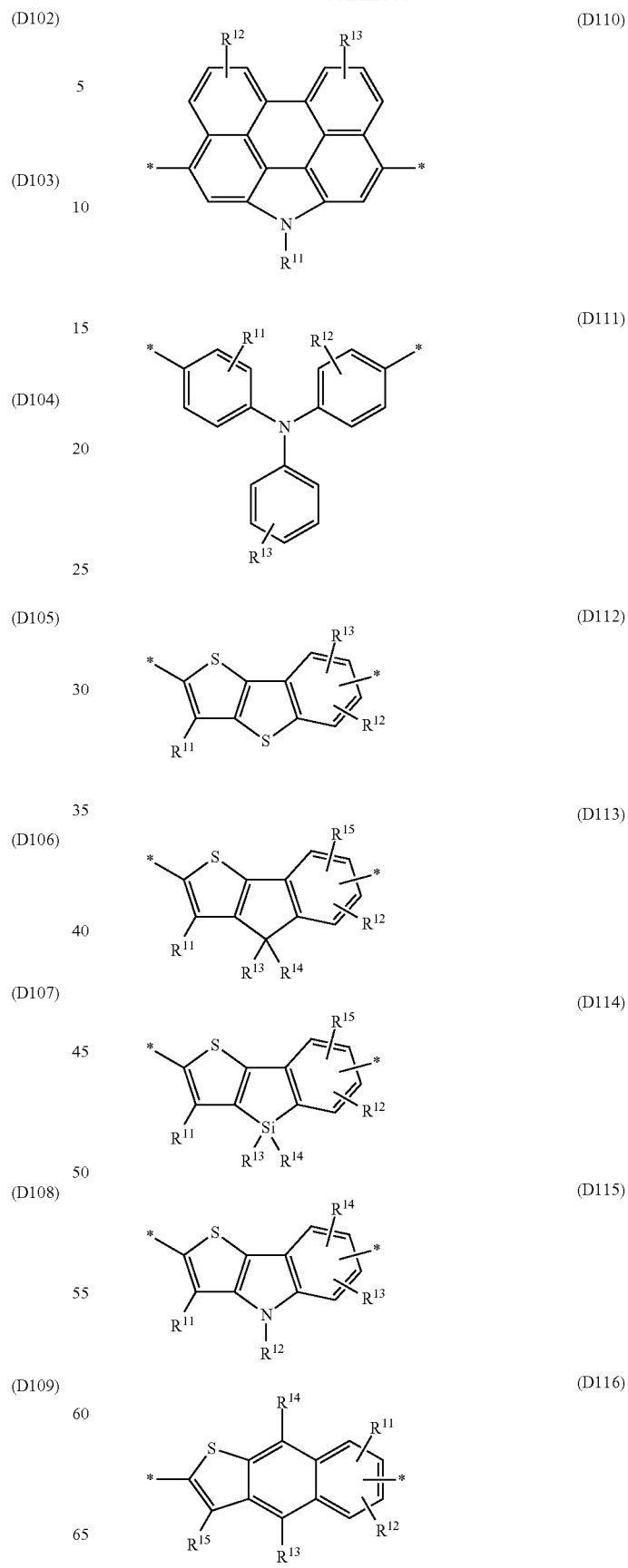

-continued
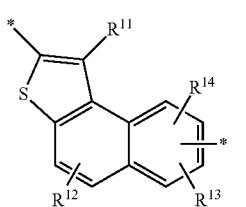
(D117)
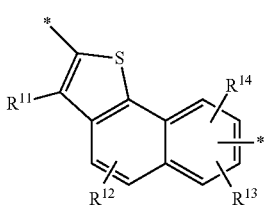
(D118)
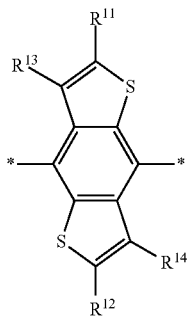
(D119)
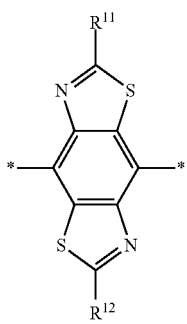
(D120)
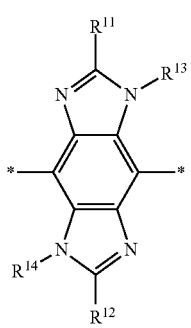
(D121)
-continued
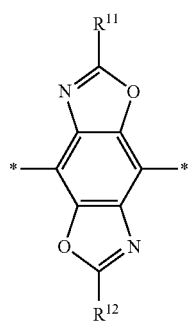
(D122)
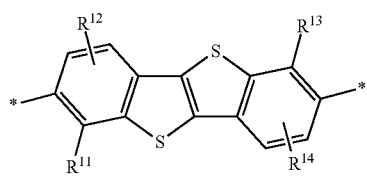
(D123)
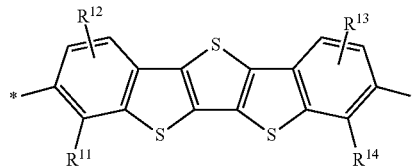
(D124)
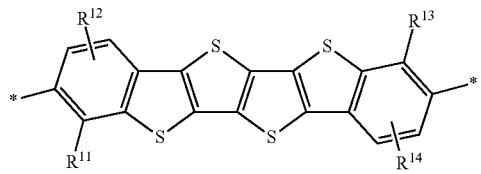
(D125)
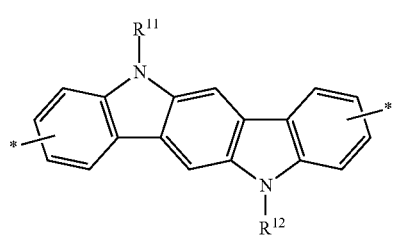
(D126)
(D127)
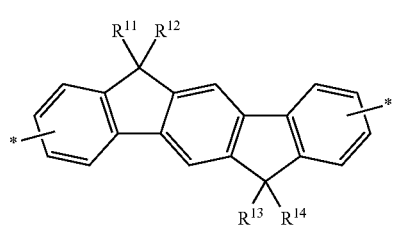
(D128)

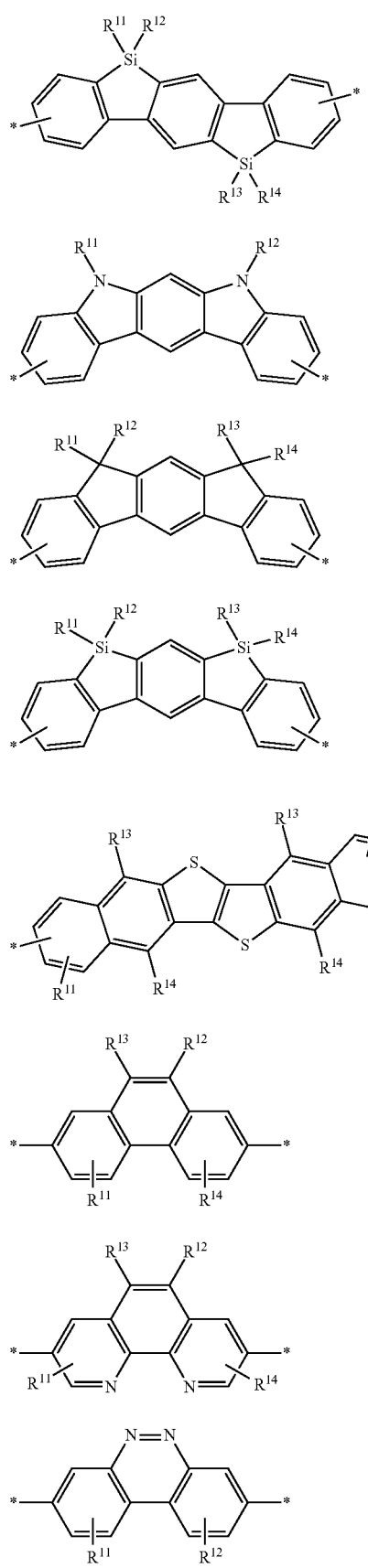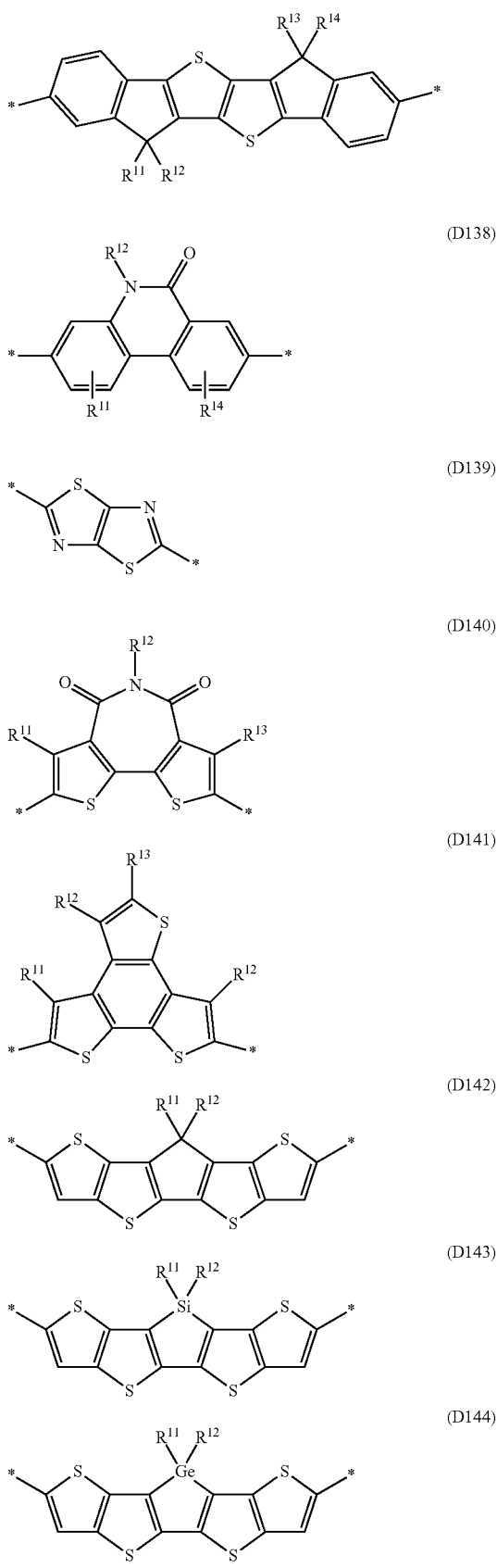

(D145)

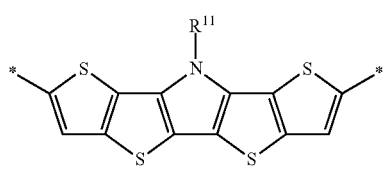

wherein $R^{11}$, $R^{12}$, $R^{13}$, $R^{14}$, $R^{15}$, $R^{16}$, $R^{17}$ and $R^{18}$ independently of each other denote H or have one of the meanings of $R^S$ as defined above and below.

Further preferred are repeating units, monomers and polymers of formulae I, I1, IIa, IIb, IIIa, IIIb, IV, IVa-IVm, P, MIV-MV, wherein one or more of $Ar^1$, $Ar^2$ and $Ar^3$ denote arylene or heteroarylene, preferably having electron acceptor properties, selected from the group consisting of the following formulae (A1)

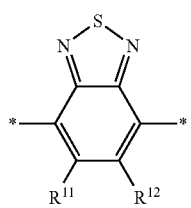

(A2)

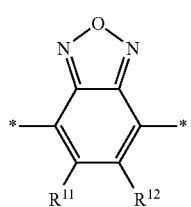

(A3)

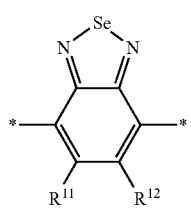

(A4)

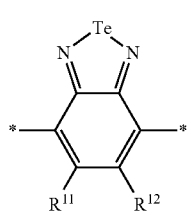

(A5)

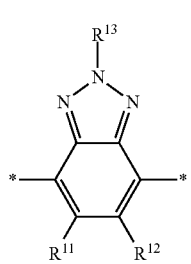

(A6)

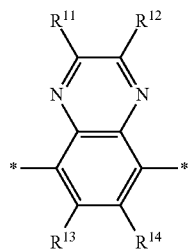

(A7)

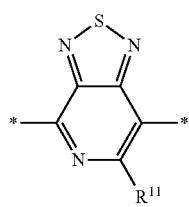

(A8)

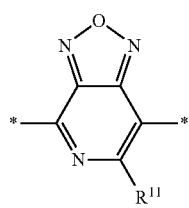

(A9)

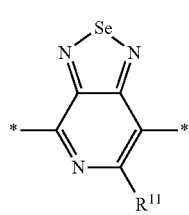

(A10)

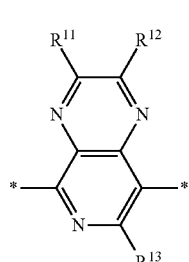

(A11)

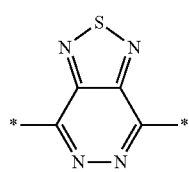

(A12)

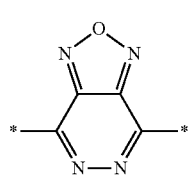

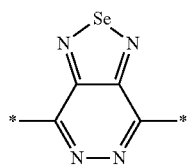 (A13)
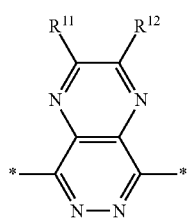 (A14)
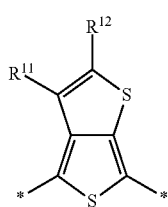 (A15)
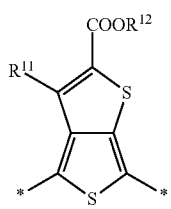 (A16)
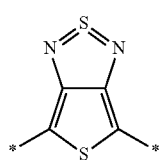 (A17)
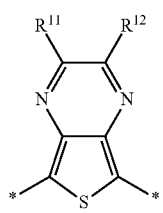 (A18)
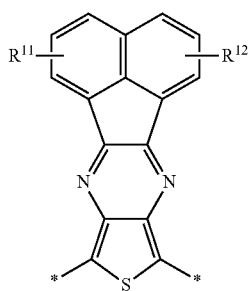 (A19)
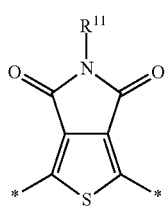 (A20)
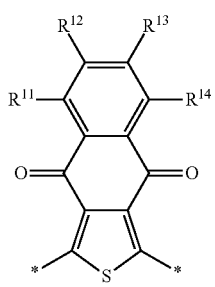 (A21)
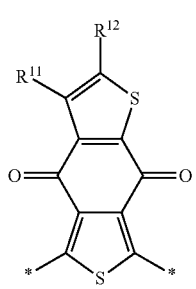 (A22)
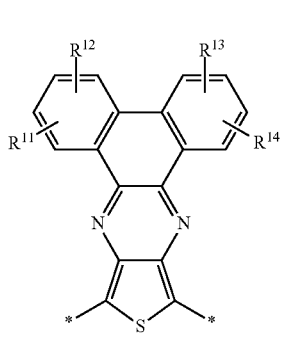 (A23)
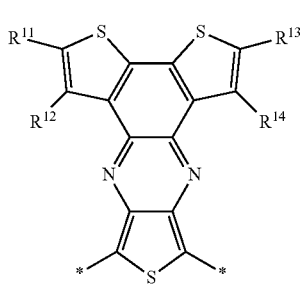 (A24)

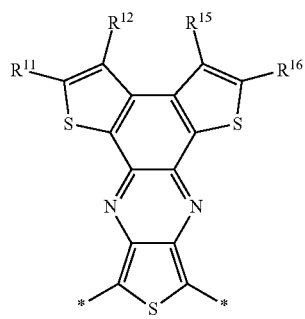
(A25)
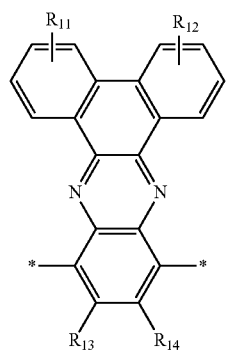
(A26)
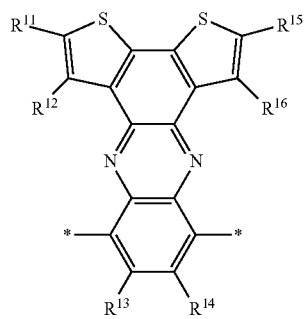
(A27)
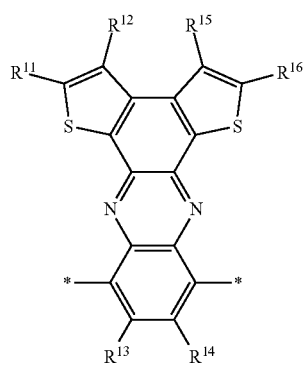
(A28)
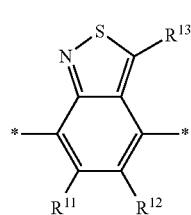
(A29)
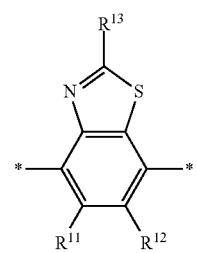
(A30)
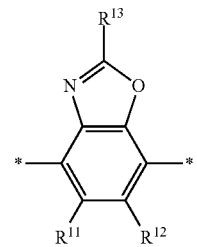
(A31)
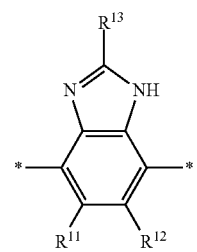
(A32)
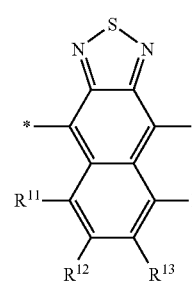
(A33)
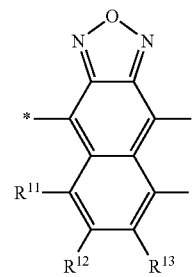
(A34)

-continued
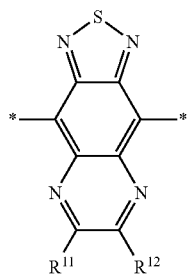
(A36)
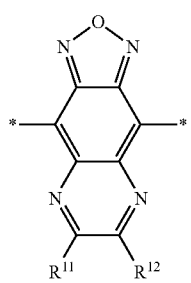
(A37)
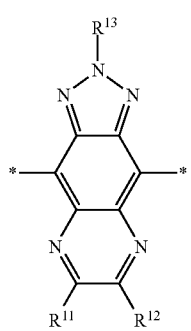
(A38)
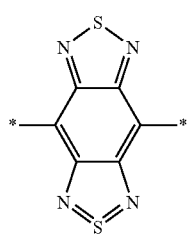
(A39)
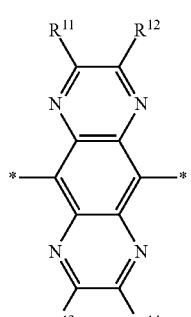
(A40)
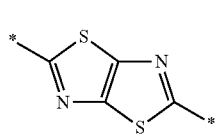
(A41)
-continued
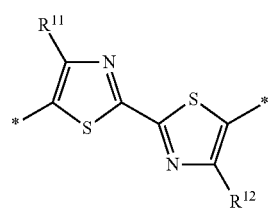
(A42)
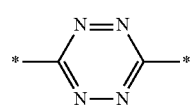
(A43)
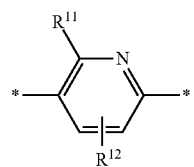
(A44)
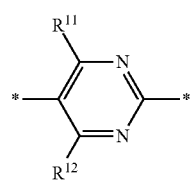
(A45)
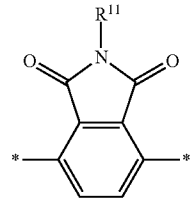
(A46)
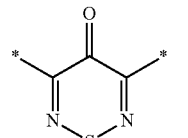
(A47)
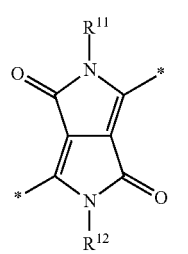
(A48)
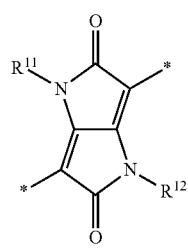
(A49)

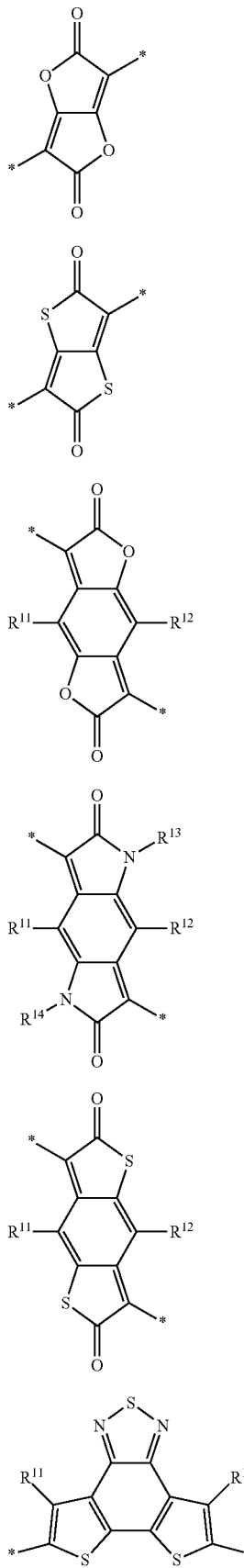
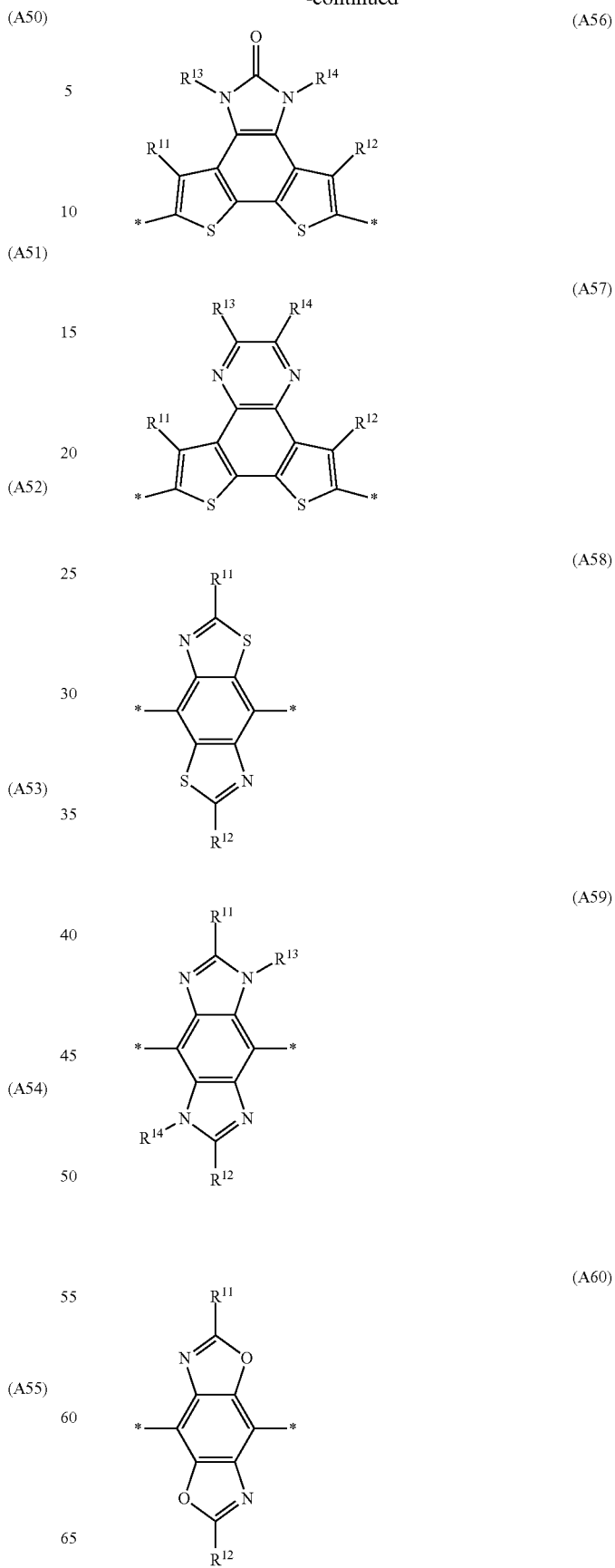

(A61) 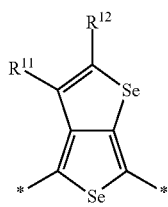
(A62) 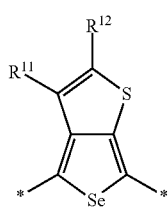
(A63) 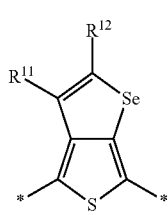
(A64) 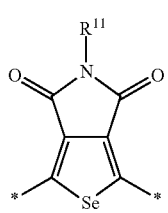
(A65) 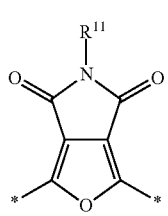
(A66) 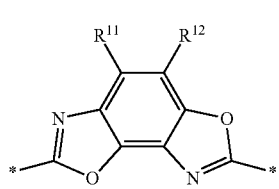
(A67) 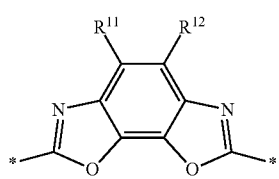
(A68) 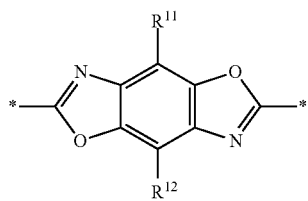
(A69) 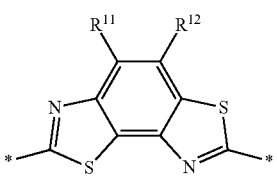
(A70) 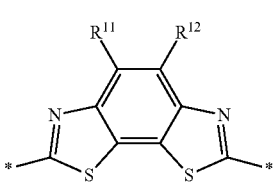
(A71) 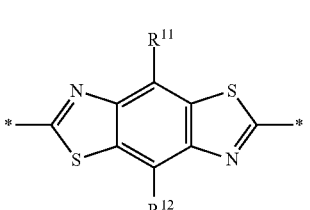
(A72) 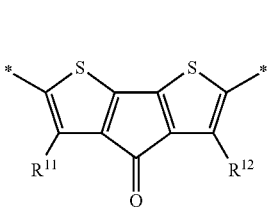
(A73) 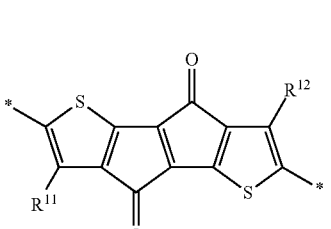
(A74) 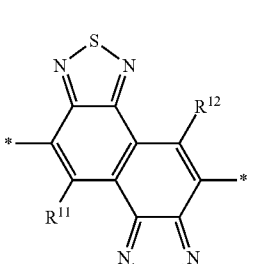
(A75) 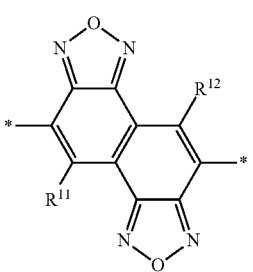

-continued
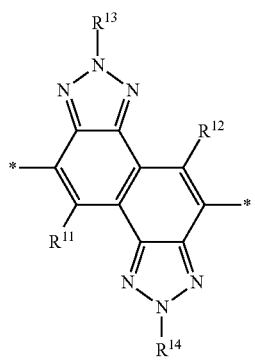
(A76)
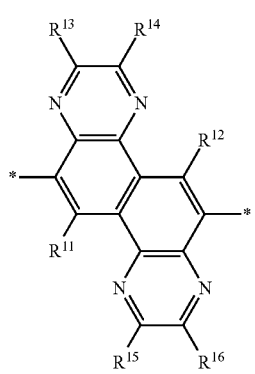
(A77)
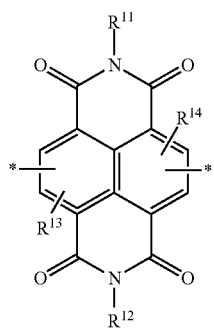
(A78)
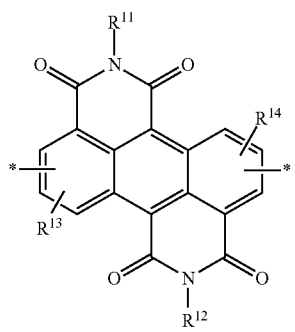
(A79)
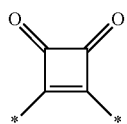
(A80)
-continued
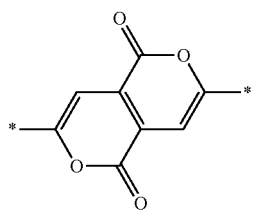
(A81)
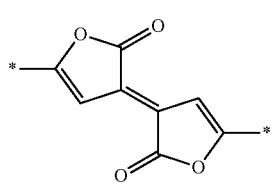
(A82)
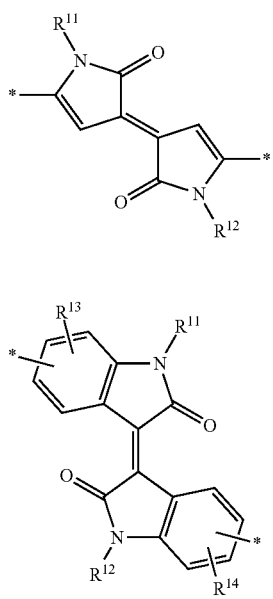
(A83)
(A84)
(A85)
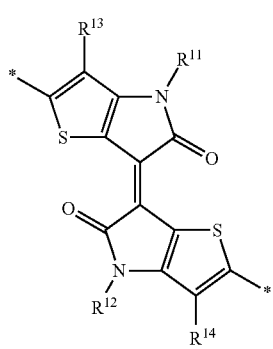
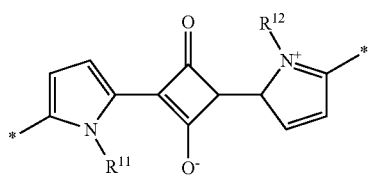
(A86)

(A87) 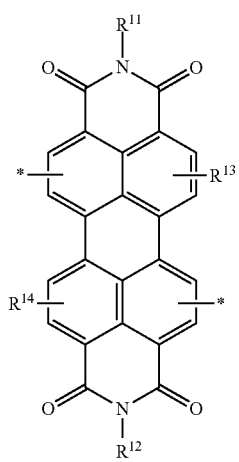

(A88) 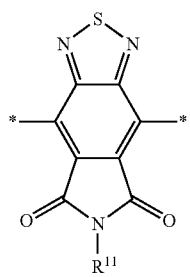

(A89) 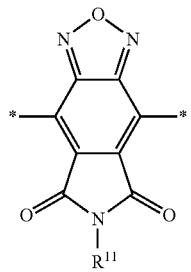

(A90) 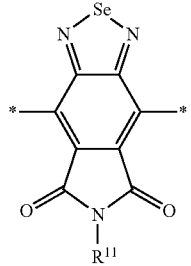

(A91) 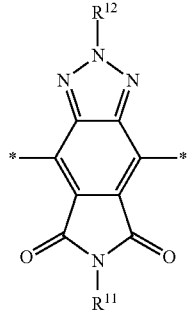

(A92) 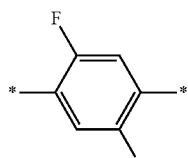

(A93) 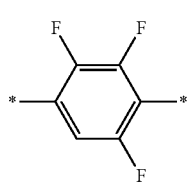

(A94) 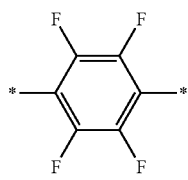

(A95) 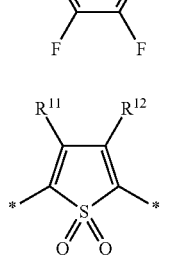

(A96) 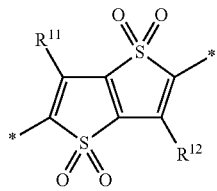

(A97) 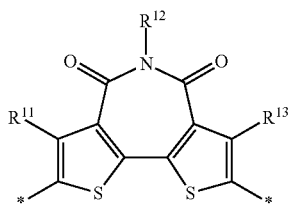

wherein $R^{11}$, $R^{12}$, $R^{13}$, $R^{14}$, $R^{15}$ and $R^{16}$ independently of each other denote H or have one of the meanings of $R^S$ as defined above and below.

Further preferred are repeating units, monomers and polymers of formulae I, I1, IIa, IIb, IIIa, IIIb, IV, IVa-IVm, P, wherein one or more of $Ar^1$, $Ar^2$ and $Ar^3$ denotes a spacer unit selected from the group consisting of the following formulae Sp1

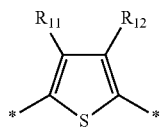

-continued

Sp2 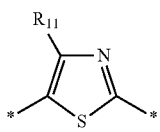

Sp3 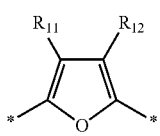

Sp4 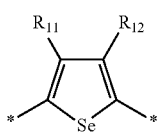

Sp5 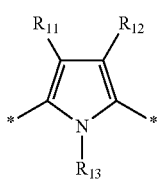

Sp6 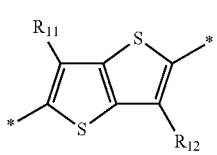

Sp7 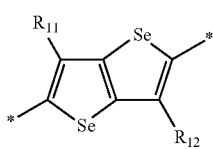

Sp8 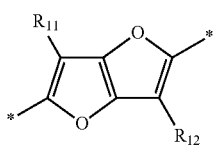

Sp9 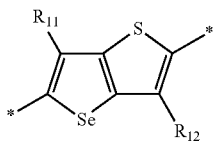

Sp10 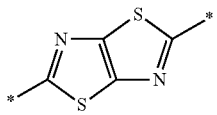

-continued

Sp11

Sp12

Sp13

Sp14

Sp15

Sp16 wherein $R^{11}$ and $R^{12}$ independently of each other denote H or have one of the meanings of $R^S$ as defined above and below.

Preferred donor units D, $Ar^1$, $Ar^2$ and $Ar^3$ are selected from formulae D1, D10, D19, D22, D25, D35, D36, D37, D44, D84, D93, D94, D103, D108, D111, D137, D139, D140 or D141 wherein at least one of $R^{11}$, $R^{12}$, $R^{13}$ and $R^{14}$ is different from H.

Preferred acceptor units $Ar^1$, $Ar^2$ and $Ar^3$ are selected from formulae A1, A2, A3, A20, A41, A48, A74, A85 or A94 wherein at least one of $R^{11}$, $R^{12}$, $R^{13}$ and $R^{14}$ is different from H.

Preferred spacer units, $Ar^1$, $Ar^2$ and $Ar^3$ are selected from formula Sp1, Sp4, Sp6, wherein preferably one of $R^{11}$ and $R^{12}$ is H or both $R^{11}$ and $R^{12}$ are H.

Preferred polymers are selected from the following sub-formulae

IV1 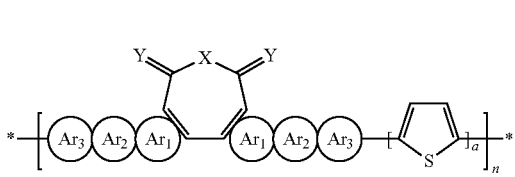

IV2 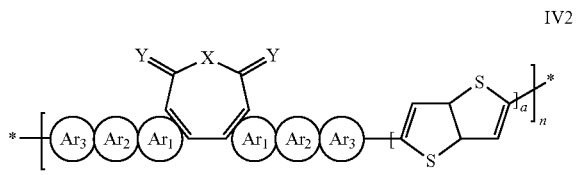

-continued
IV3
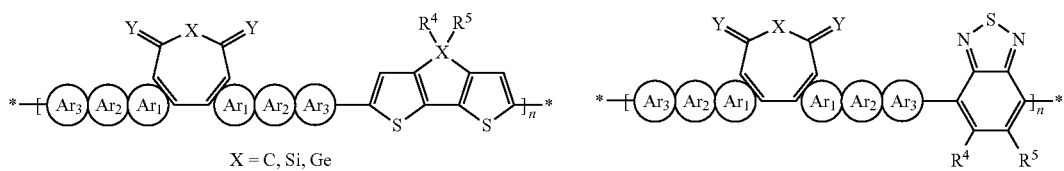
X = C, Si, Ge
IV4
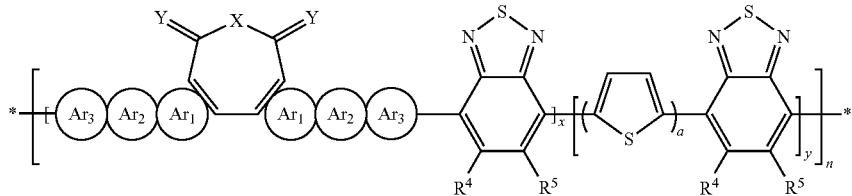
IV5
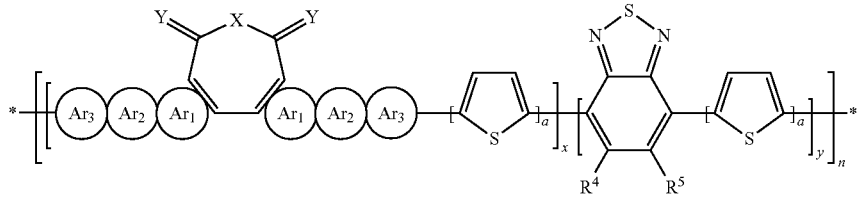
IV6
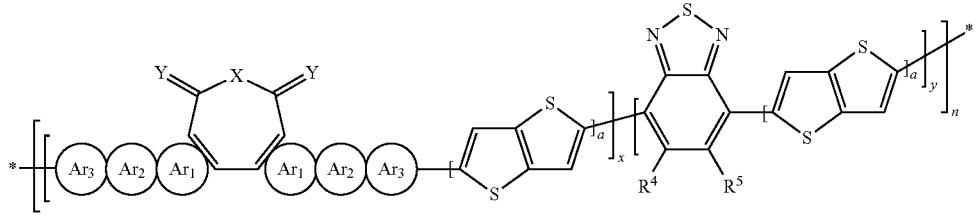
IV7
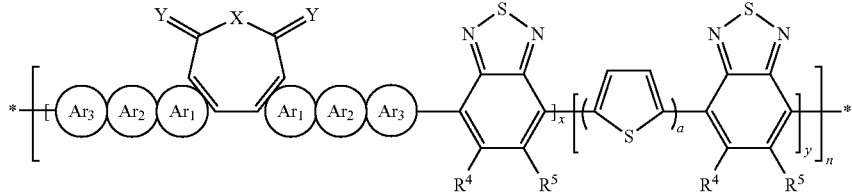
IV8
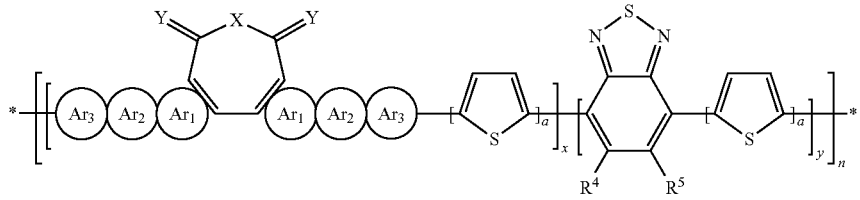
IV9
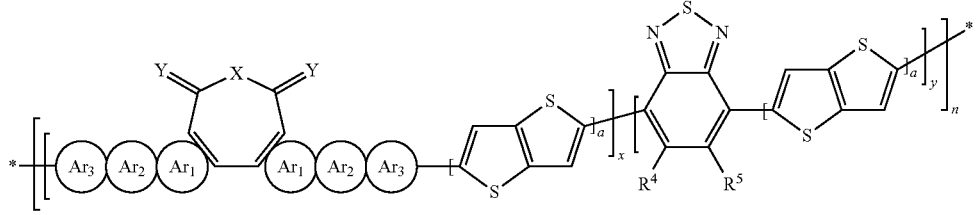
IV10

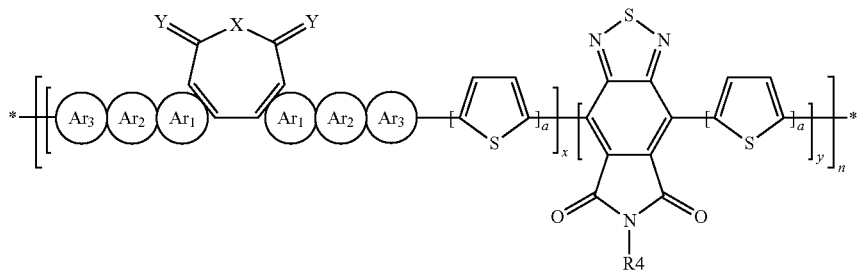
IV11
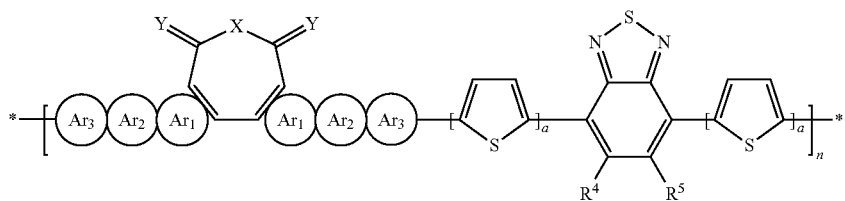
IV12
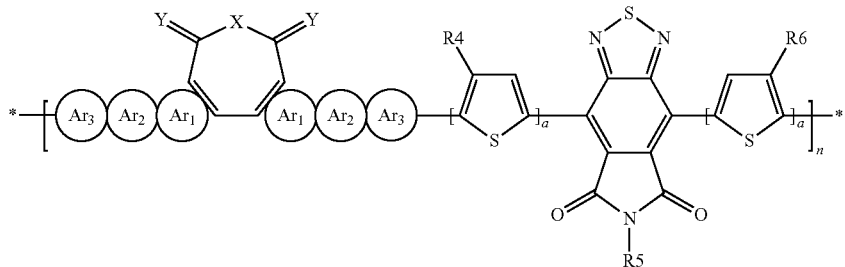
IV13
wherein $Ar^1$, $Ar^2$, $Ar^3$, a, b, c, d, x, y, n, $R^1$, $R^2$, $R^3$, $R^4$, $R^5$ and $R^6$ are as defined above.
Very preferred polymers are selected from the following subformulae
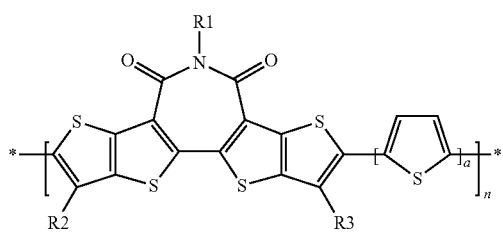
IV21
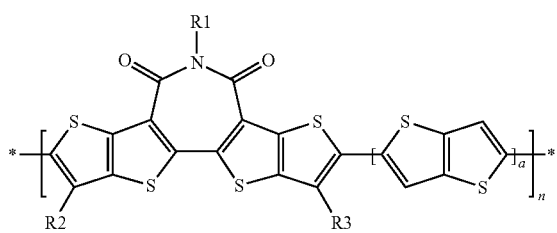
IV22
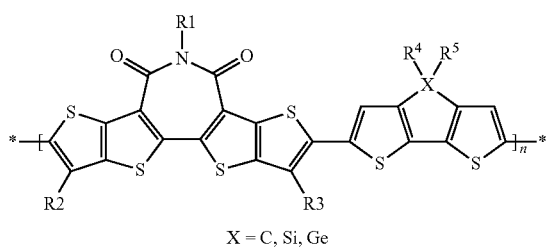
IV23
X = C, Si, Ge
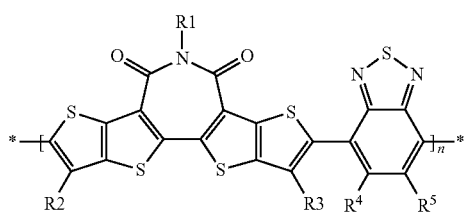
IV24

-continued
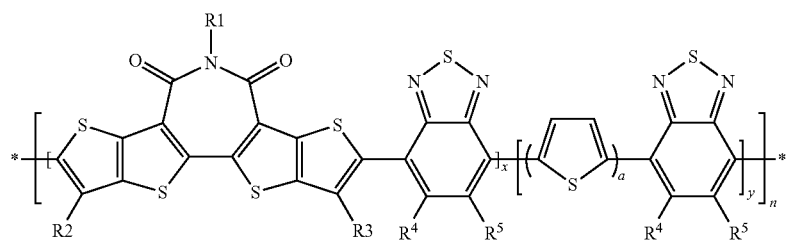
IV25
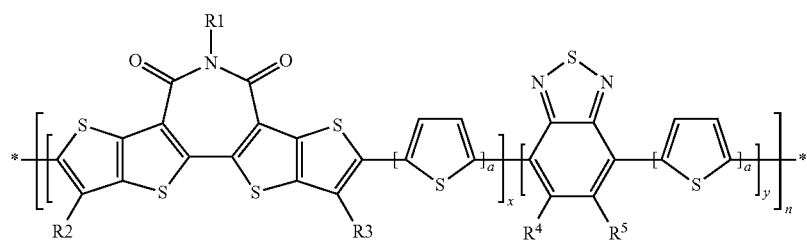
IV26
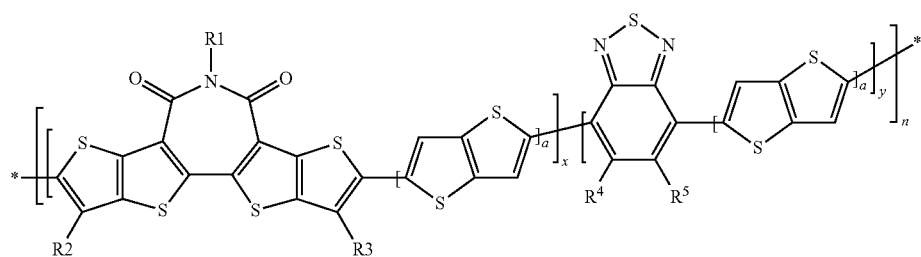
IV27
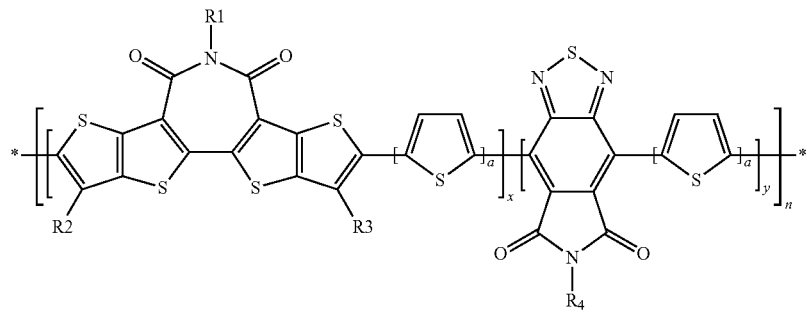
IV28
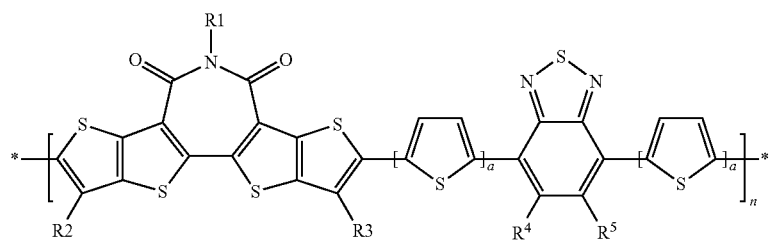
IV29
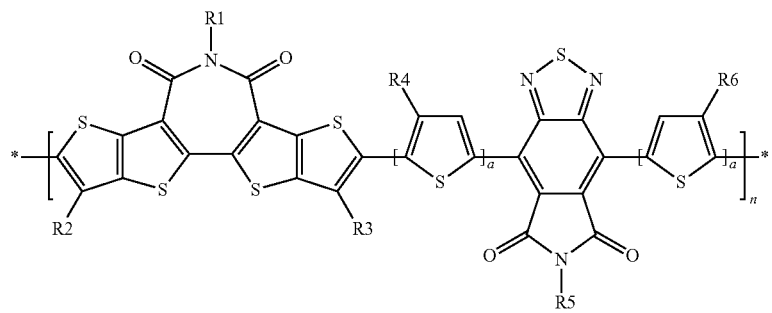
IV30 wherein a, b, c, d, x, y, n, $R^1$, $R^2$, $R^3$, $R^4$, $R^5$ and $R^6$ are as defined above.

In the conjugated polymer according to the present invention, the total number of repeating units n is preferably from 2 to 10,000. The total number of repeating units n is preferably ≥5, very preferably ≥10, most preferably ≥50, and preferably ≤500, very preferably ≤1,000, most preferably ≤2,000, including any combination of the aforementioned lower and upper limits of n.

Further preferred is conjugated polymer according to the present invention selected of formula P

wherein "chain" denotes a polymer chain selected of formulae IV, IVa-IVm, IV1-IV30, and $R^{21}$ and $R^{22}$ have independently of each other one of the meanings of $R^S$ as defined above, or denote, independently of each other, H, F, Br, Cl, I, —CH$_2$Cl, —CHO, —CR'=CR''$_2$, —SiR'R''R''', —SiR'X'X'', —SiR'R''X', —SnR'R''R''', —BR'R'', —B(OR')(OR''), —B(OH)$_2$, —O—SO$_2$—R', —C≡CH, —C≡C—SiR'$_3$, —ZnX' or an endcap group, X' and X'' denote halogen, R', R'' and R''' have independently of each other one of the meanings of $R^0$ given in formula I, and preferably denote alkyl with 1 to 12 C atoms, and two of R', R'' and R''' may also form a cyclosilyl, cyclostannyl, cycloborane or cycloboronate group with 2 to 20 C atoms together with the respective hetero atom to which they are attached.

Preferred endcap groups $R^{21}$ and $R^{22}$ are H, $C_{1-20}$ alkyl, or optionally substituted $C_{6-12}$ aryl or $C_{2-10}$ heteroaryl, very preferably H or phenyl.

The conjugated polymer can be prepared for example by copolymerising one or more monomers selected from the following formulae in an aryl-aryl coupling reaction $R^{23}$—U—$R^{24}$    MI $R^{23}$-(Sp)$_x$-U-(Sp)$_y$-$R^{24}$    MII $R^{23}$-Sp-$R^{24}$    MIII $R^{23}$-D-$R^{24}$    MIV $R^{23}$-(Sp)$_x$-D-(Sp)$_y$-$R^{24}$    MV $R^{23}$-A$^c$-$R^{24}$    MVI $R^{23}$-(Sp)$_x$-A$^c$-(Sp)$_y$-$R^{24}$    MVII wherein at least one monomer is selected of formula MI or MII,
U denotes a unit of formula I or I1,
D denotes a donor unit as defined in formula IIIa,
A$^C$ denotes a unit Ar$^1$ as defined in formula IIa which is selected from arylene or heteroarylene groups having electron acceptor properties,
Sp denotes a spacer unit as defined above,
x and y are independently of each other 0, 1 or 2, and
$R^{23}$ and $R^{24}$ are, independently of each other, selected from the group consisting of H which is preferably an activated C—H bond, Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —C≡CH, —C≡CSi(Z$^1$)$_3$, —ZnX$^0$ and —Sn(Z$^4$)$_3$, wherein X$^0$ is halogen, preferably Cl, Br or I, $Z^{1-4}$ are selected from the group consisting of alkyl, preferably $C_{1-10}$ alkyl and aryl, preferably $C_{6-12}$ aryl, each being optionally substituted, and two groups $Z^2$ may also form a cycloboronate group with 2 to 20 C atoms together with the B and O atoms.

The monomers of formula MI-MVII can be co-polymerised with each other and/or with other suitable co-monomers.

Further preferred are repeating units, monomers and polymers of formula I, I1, IIa, IIb, IIIa, IIIb, IV, IVa-IVm, IV1-IV30, P, MI-MVII selected from the following list of preferred embodiments, including any combination thereof:
n is at least 5, preferably at least 10, very preferably at least 50, and up to 2,000, preferably up to 500.
the weight average molecular weight $M_w$ is at least 5,000, preferably at least 8,000, very preferably at least 15,000, and preferably up to 500,000, very preferably up to 300,000,
R is different from H,
R denotes straight-chain or branched alkyl with 1 to 30 C atoms that is optionally fluorinated,
all groups $R^S$ denote H,
at least one group $R^S$ is different from H,
R, $R^S$, $R^{11}$, $R^{12}$, $R^{13}$, $R^{14}$, $R^{15}R^{16}R^{17}$, $R^{18}$ and $R^{19}$ are selected, on each occurrence identically or differently, from the group consisting of primary alkyl with 1 to 30 C atoms, secondary alkyl with 3 to 30 C atoms, and tertiary alkyl with 4 to 30 C atoms, wherein in all these groups one or more H atoms are optionally replaced by F,
$R^S$, $R^{11}$, $R^{12}$, $R^{13}$, $R^{14}$, $R^{15}R^{16}R^{17}$, $R^{18}$ and $R^{19}$ are selected, on each occurrence identically or differently, from the group consisting of aryl and heteroaryl, each of which is optionally fluorinated, alkylated or alkoxylated and has 4 to 30 ring atoms,
$R^S$, $R^{11}$, $R^{12}$, $R^{13}$, $R^{14}$, $R^{15}R^{16}R^{17}$, $R^{18}$ and $R^{19}$ are selected, on each occurrence identically or differently, from the group consisting of primary alkoxy or sulfanylalkyl with 1 to 30 C atoms, secondary alkoxy or sulfanylalkyl with 3 to 30 C atoms, and tertiary alkoxy or sulfanylalkyl with 4 to 30 C atoms, wherein in all these groups one or more H atoms are optionally replaced by F,
$R^S$, $R^{11}$, $R^{12}$, $R^{13}$, $R^{14}$, $R^{15}R^{16}R^{17}$, $R^{18}$ and $R^{19}$ are selected, on each occurrence identically or differently, from the group consisting of aryloxy and heteroaryloxy, each of which is optionally alkylated or alkoxylated and has 4 to 30 ring atoms,
$R^S$, $R^{11}$, $R^{12}$, $R^{13}$, $R^{14}$, $R^{15}R^{16}R^{17}$, $R^{18}$ and $R^{19}$ are selected, on each occurrence identically or differently, from the group consisting of alkylcarbonyl, alkoxycarbonyl and alkylcarbonyloxy, all of which are straight-chain or branched, are optionally fluorinated, and have from 1 to 30 C atoms,
$R^0$ and $R^{00}$ are selected from H or $C_1$-$C_{12}$-alkyl,
$R^{21}$ and $R^{22}$ are independently of each other selected from H, halogen, —CH$_2$Cl, —CHO, —CH=CH$_2$—SiR'R''R''', —SnR'R''R''', —BR'R'', —B(OR')(OR''), —B(OH)$_2$, P-Sp, $C_1$-$C_{20}$-alkyl, $C_1$-$C_{20}$-alkoxy, $C_2$-$C_{20}$-alkenyl, $C_1$-$C_{20}$-fluoroalkyl and optionally substituted aryl or heteroaryl, preferably phenyl,
$R^{23}$ and $R^{24}$ are independently of each other selected from the group consisting of an activated C—H bond, Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^4$)$_2$, —C≡CH, C≡CSi(Z$^1$)$_3$, —ZnX$^0$ and —Sn(Z$^4$)$_3$, wherein X$^0$ is halogen, $Z^{1-4}$ are selected from the group consisting of alkyl, preferably $C_{1-10}$ alkyl and aryl, preferably $C_{6-12}$ aryl, each being optionally substituted, and two groups $Z^2$ may also form a cycloboronate group with 2 to 20 C atoms together with the B and O atoms.

The polymer according to the present invention can be synthesized according to or in analogy to methods that are known to the skilled person and are described in the literature. Other methods of preparation can be taken from the examples.

For example, the polymers can be suitably prepared by aryl-aryl coupling reactions, such as Yamamoto coupling, C—H activation coupling, Suzuki coupling, Stille coupling, Sonogashira coupling, Heck coupling or Buchwald coupling. Suzuki coupling, Stille coupling and Yamamoto coupling are especially preferred. The monomers which are polymerised to form the repeat units of the polymers can be prepared according to methods which are known to the person skilled in the art.

Preferably the polymer is prepared from monomers selected from formulae MI-MVII as described above.

Another aspect of the invention is a process for preparing a polymer by coupling one or more identical or different monomers selected from formula MI-MVII with each other and/or with one or more co-monomers in a polymerisation reaction, preferably in an aryl-aryl coupling reaction.

Preferred aryl-aryl coupling and polymerisation methods used in the processes described above and below are Yamamoto coupling, Kumada coupling, Negishi coupling, Suzuki coupling, Stille coupling, Sonogashira coupling, Heck coupling, C—H activation coupling, Ullmann coupling or Buchwald coupling. Especially preferred are Suzuki coupling, Negishi coupling, Stille coupling and Yamamoto coupling. Suzuki coupling is described for example in WO 00/53656 A1. Negishi coupling is described for example in *J. Chem. Soc., Chem. Commun.*, 1977, 683-684. Yamamoto coupling is described in for example in T. Yamamoto et al., *Prog. Polym. Sci.*, 1993, 17, 1153-1205, or WO 2004/022626 A1. Stille coupling is described for example in Z. Bao et al., *J. Am. Chem. Soc.*, 1995, 117, 12426-12435. C—H activation is described for example for example in M. Leclerc et al, *Angew. Chem. Int. Ed.* 2012, 51, 2068-2071. For example, when using Yamamoto coupling, monomers having two reactive halide groups are preferably used. When using Suzuki coupling, monomers having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used. When synthesizing a linear polymer by C—H activation polymerisation, preferably a monomer as described above is used wherein at least one reactive group is an activated hydrogen bond.

Preferred catalysts, especially for Suzuki, Negishi or Stille coupling, are selected from Pd(0) complexes or Pd(II) salts. Preferred Pd(0) complexes are those bearing at least one phosphine ligand such as $Pd(Ph_3P)_4$. Another preferred phosphine ligand is tris(ortho-tolyl)phosphine, i.e. $Pd(o-Tol_3P)_4$. Preferred Pd(II) salts include palladium acetate, i.e. $Pd(OAc)_2$ or trans-di(p-acetato)-bis[o-(di-o-tolylphosphino)benzyl]dipalladium(II). Alternatively the Pd(0) complex can be prepared by mixing a Pd(0) dibenzylideneacetone complex, for example tris(dibenzyl-ideneacetone)dipalladium (0), bis(dibenzylideneacetone)palladium(0), or Pd(II) salts e.g. palladium acetate, with a phosphine ligand, for example triphenylphosphine, tris(ortho-tolyl)phosphine, tris(o-methoxyphenyl)phosphine or tri(tert-butyl)phosphine. Suzuki polymerisation is performed in the presence of a base, for example sodium carbonate, potassium carbonate, cesium carbonated, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl) nickel(0).

Suzuki, Stille or C—H activation coupling polymerisation may be used to prepare homopolymers as well as statistical, alternating and block random copolymers. Statistical, random block copolymers or block copolymers can be prepared for example from the above monomers, wherein one of the reactive groups is halogen and the other reactive group is a C—H activated bond, boronic acid, boronic acid derivative group or and alkylstannane. The synthesis of statistical, alternating and block copolymers is described in detail for example in WO 03/048225 A2 or WO 2005/014688 A2.

As alternatives to halogen as described above, leaving groups of formula $—O—SO_2Z^1$ can be used wherein $Z^1$ is as defined above. Particular examples of such leaving groups are tosylate, mesylate and triflate.

The generic preparation of the units of formula I and I1 and the corresponding monomers has been described for example in WO 2012/149189 A2 and in *Chem. Comm.* 2013, 49, 2409-2411.

Suitable and preferred methods for preparing a random polymer according to the present invention are illustrated in the reaction Schemes below.

The central azepine-4,6-dione ring fused with 1-3 aromatic rings can be synthesis following the general synthesis pathway illustrated in Scheme 1 (where Q is hydrogen or a protecting group, such as $SiR_3$, R is alkyl or substituted alkyl, X is halogen).

Scheme 1

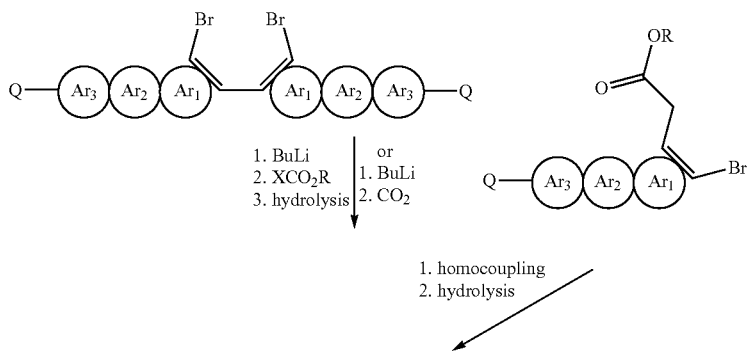

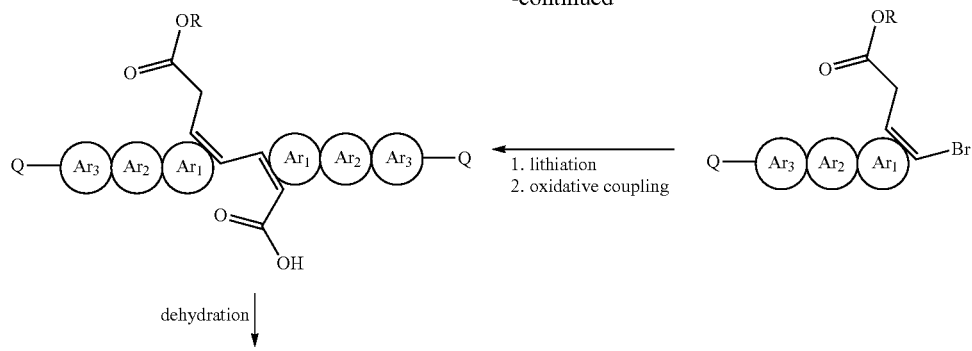
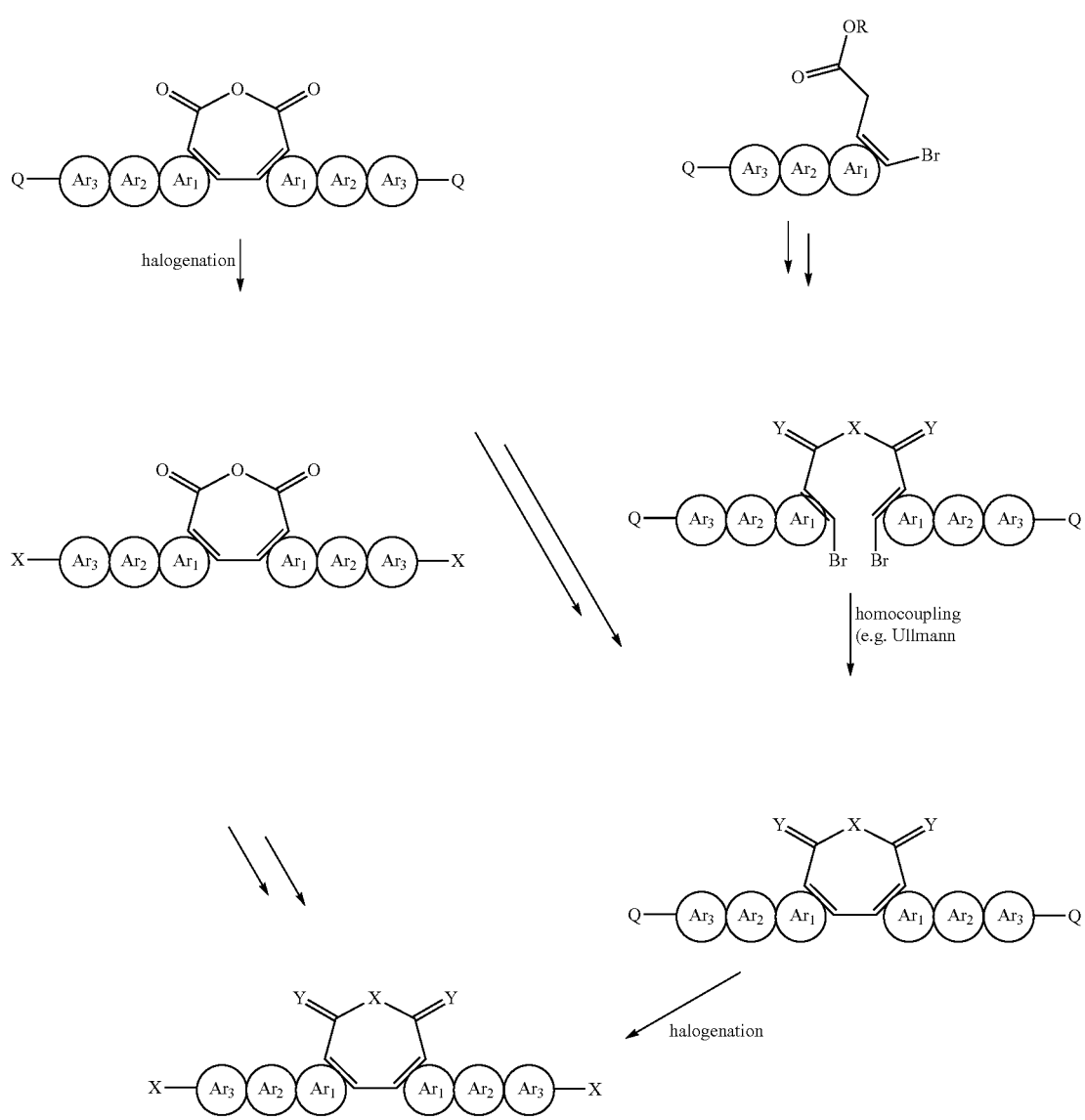
The synthesis of the bis(thienothiophene)imide unit, its functional derivatives and co-polymers is illustrated hereinafter. The bis(thienothiophene)imide unit can be synthesised via three alternative routes as shown in Schemes 2-4.

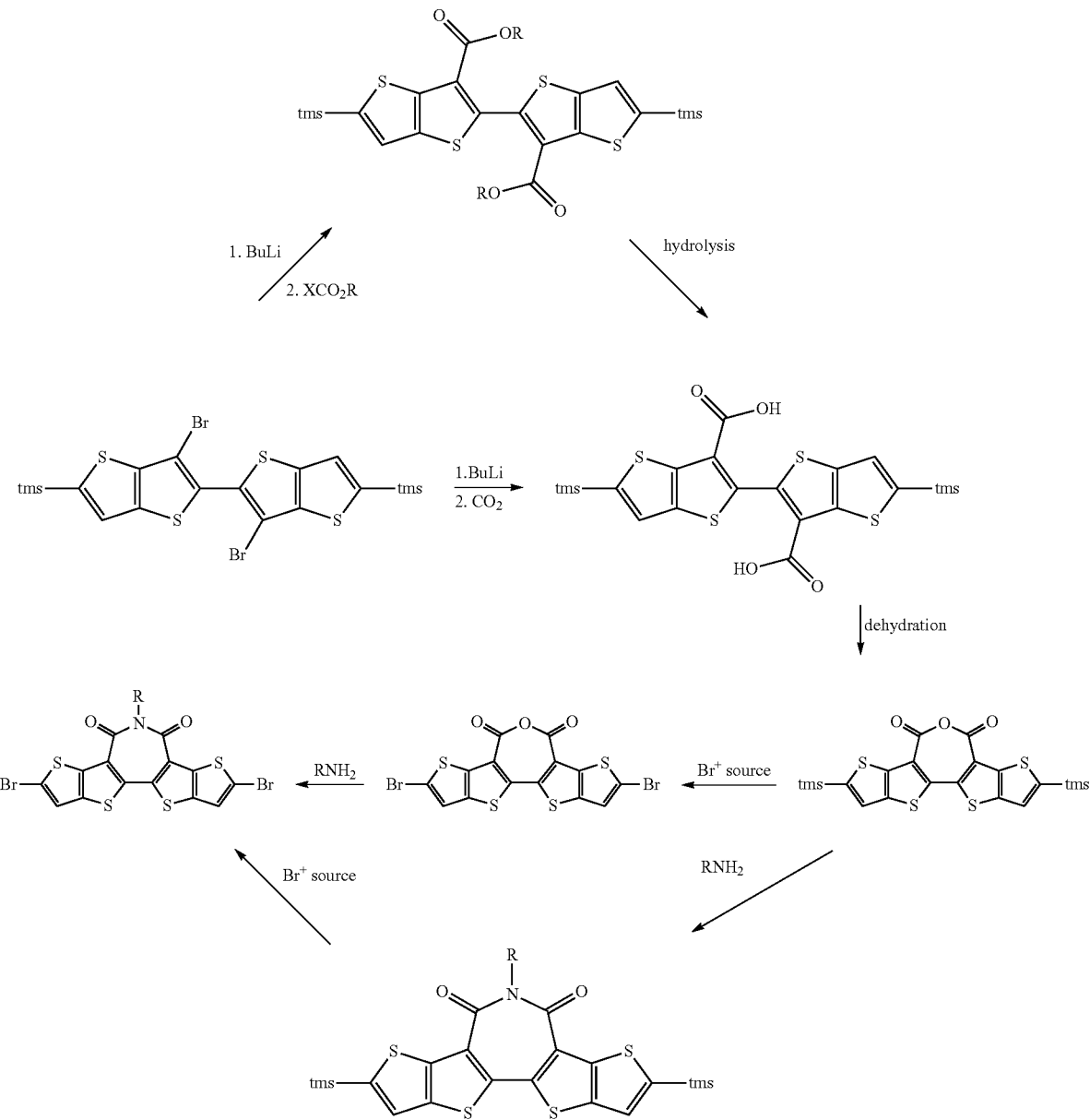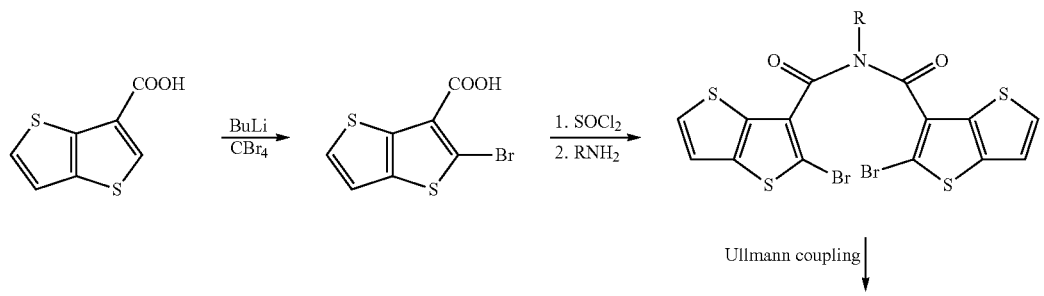

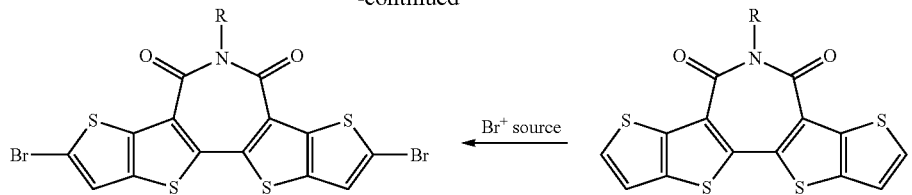
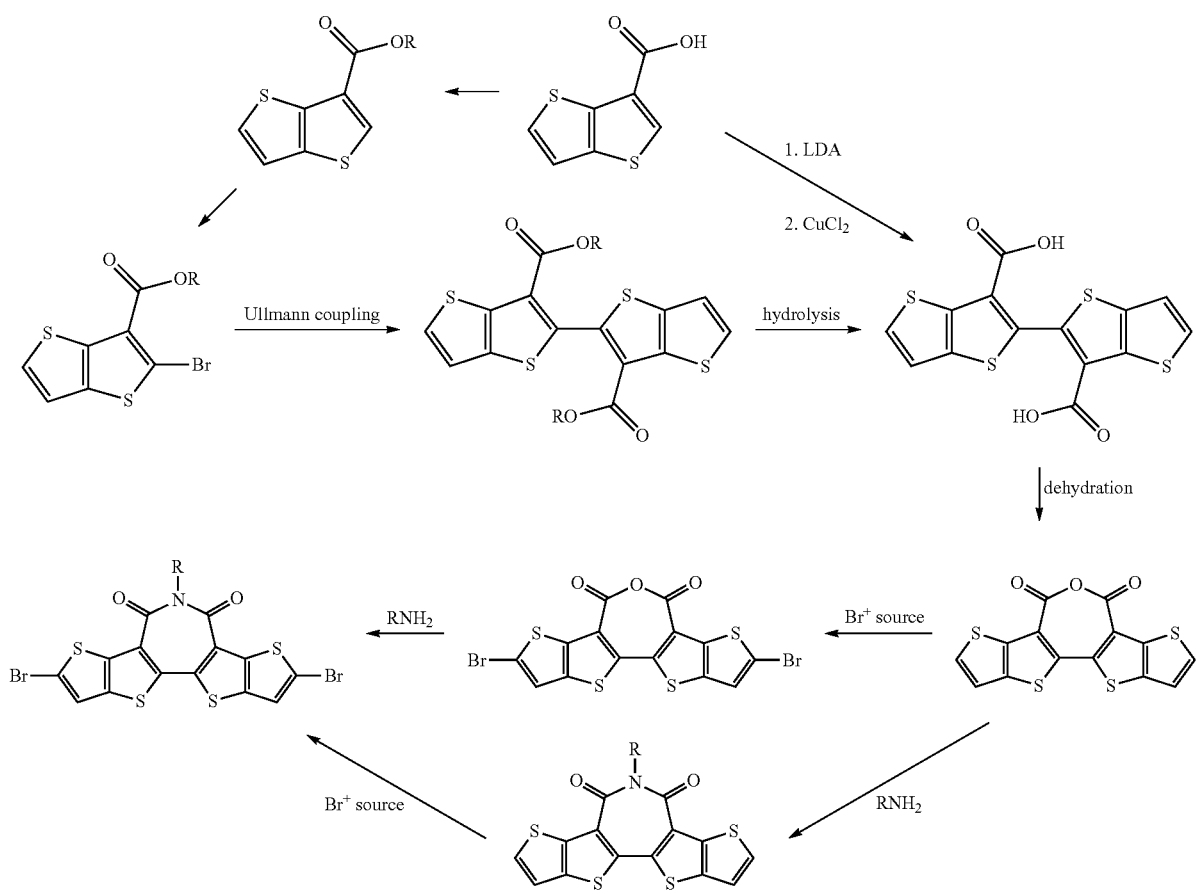
The preparation of monomers for Stille and Suzuki polymerisation is shown in Scheme 5
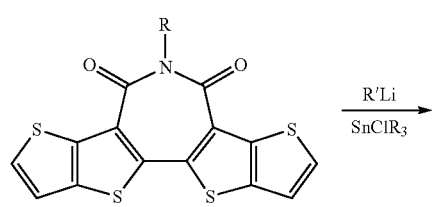
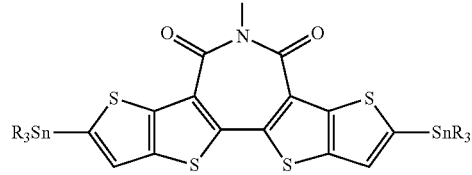
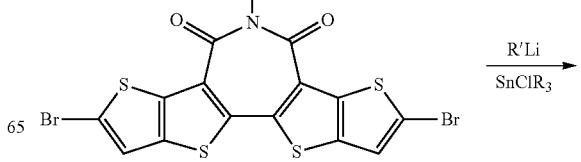

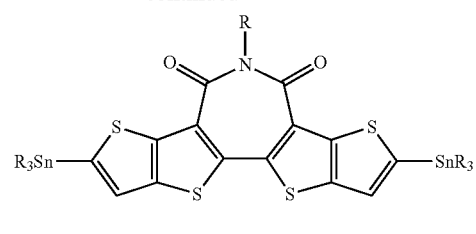

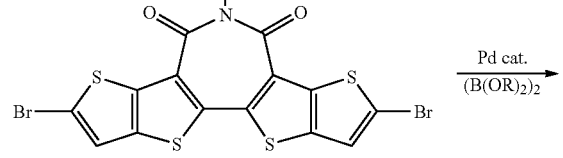

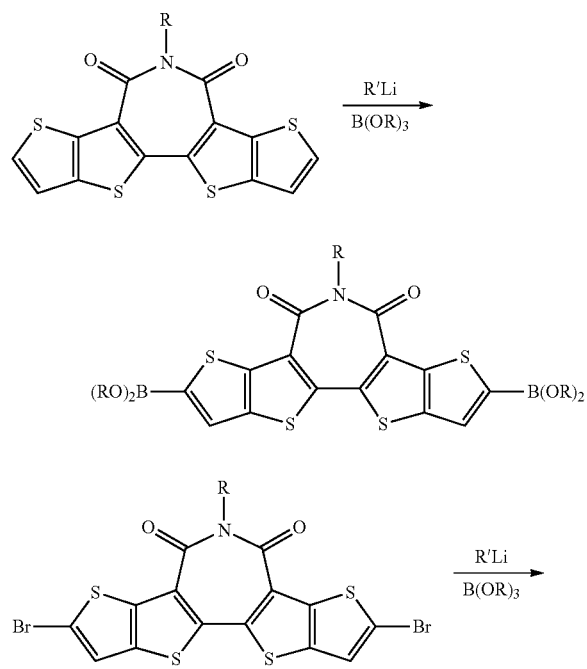

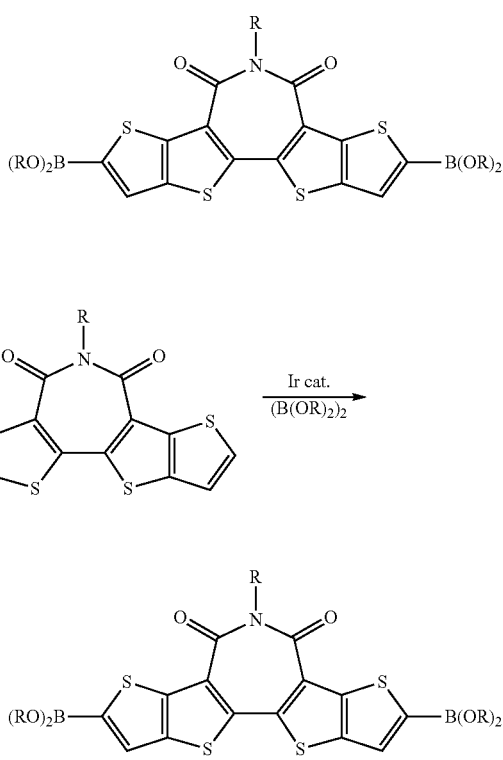

Scheme 6

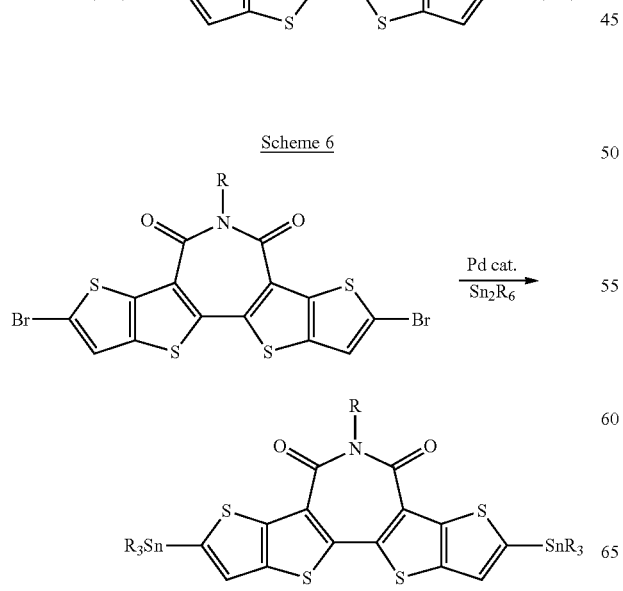

Preferred polymerisation conditions lead to alternating polymers which are particularly preferred for OTFT application, whereas statistical block co-polymers are prepared preferably for OPV and OPD application. Preferred polycondensation are Suzuki coupling, Stille coupling, Sonogashira coupling, Heck coupling or Buchwald coupling, Negishi coupling or C—H activation coupling where the first set of reactive groups is composed of —Cl, —Br, —I, O-tosylate, O-triflate, O-mesylate and O-nonaflate and the second set of reactive groups is composed of —H, —SiR$_2$F, —SiRF$_2$, —B(OR)$_2$, —CR=CHR', —C≡CH, —ZnX, —MgX and —Sn(R)$_3$. If a Yamamoto coupling reaction is used to prepare the polymer, the reactive monomer ends are both composed independently of —Cl, —Br, —I, O-tosylate, O-triflate, O-mesylate and O-nonaflate.

The schematic polymerization reactions to regular and random copolymers are shown in Schemes 7-12:

Scheme 7
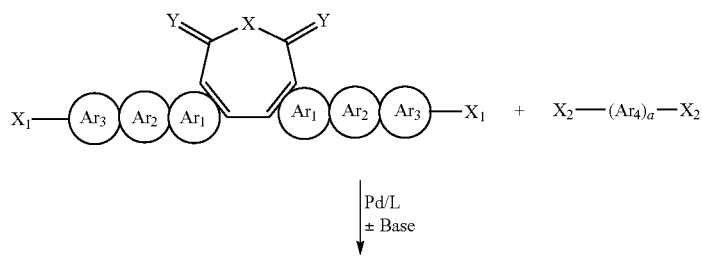
Pd/L
± Base
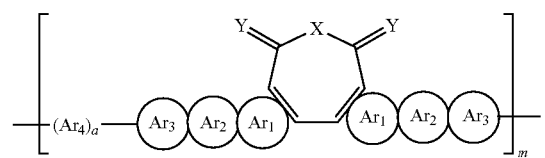
Scheme 8
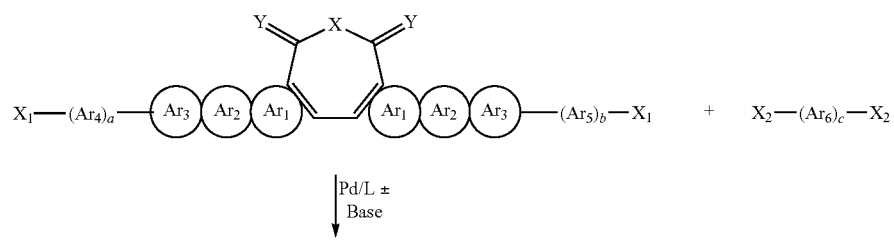
Pd/L ± Base
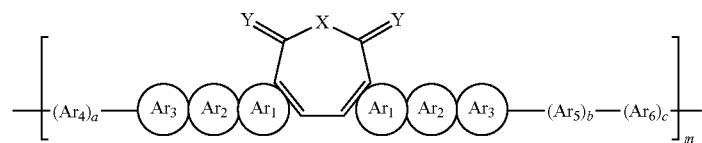
Scheme 9
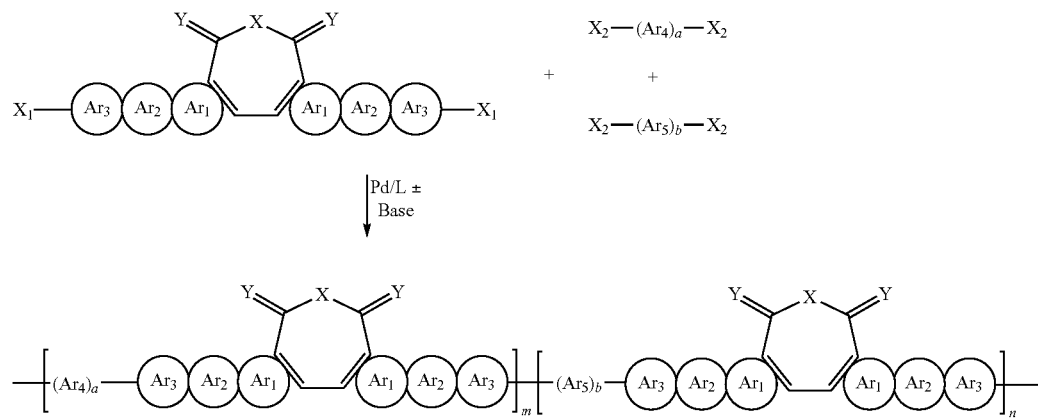

Scheme 10
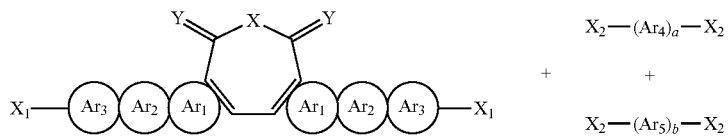
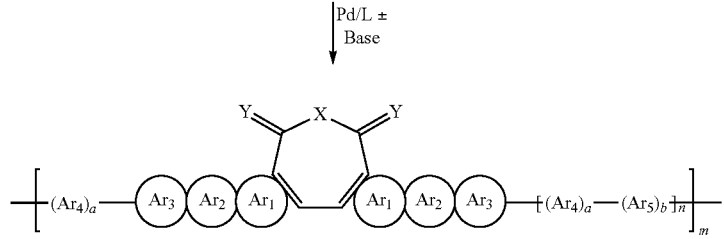
Scheme 11
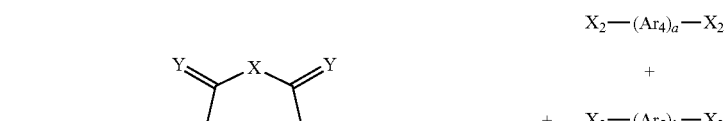
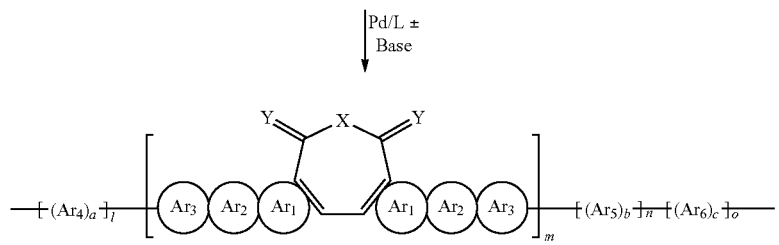
Scheme 12
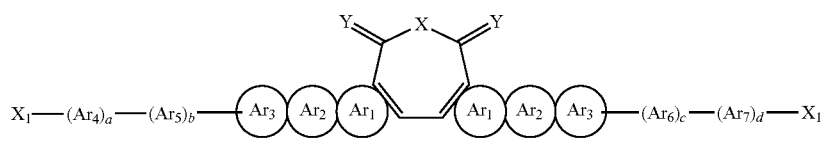
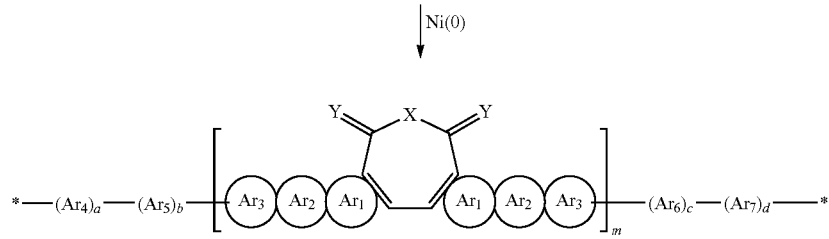

The novel methods of preparing a polymer as described above and below, and the novel monomers used therein, are further aspects of the invention.

The polymer according to the present invention can also be used in mixtures or polymer blends, for example together with monomeric compounds or together with other polymers having charge-transport, semiconducting, electrically conducting, photoconducting and/or light-emitting semiconducting properties, or for example with polymers having hole blocking, electron blocking properties for use as interlayers, charge blocking layers, charge transporting layer in OLED devices, OPV devices or pervorskite based solar cells. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more polymers, polymer blends or mixtures as described above and below and one or more organic solvents.

Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetra-methyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, N,N-dimethylformamide, 2-chloro-6-fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylanisole, 3-methylanisole, 4-fluoro-3-methylanisole, 2-fluorobenzonitrile, 4-fluoroveratrol, 2,6-dimethylanisole, 3-fluorobenzo-nitrile, 2,5-dimethylanisole, 2,4-dimethylanisole, benzonitrile, 3,5-dimethyl-anisole, N,N-dimethylaniline, ethyl benzoate, 1-fluoro-3,5-dimethoxy-benzene, 1-methylnaphthalene, N-methylpyrrolidinone, 3-fluorobenzo-trifluoride, benzotrifluoride, dioxane, trifluoromethoxy-benzene, 4-fluorobenzotrifluoride, 3-fluoropyridine, toluene, 2-fluoro-toluene, 2-fluorobenzotrifluoride, 3-fluorotoluene, 4-isopropylbiphenyl, phenyl ether, pyridine, 4-fluorotoluene, 2,5-difluoro-toluene, 1-chloro-2,4-difluorobenzene, 2-fluoropyridine, 3-chlorofluoro-benzene, 1-chloro-2,5-difluorobenzene, 4-chlorofluorobenzene, chloro-benzene, o-dichlorobenzene, 2-chlorofluorobenzene, p-xylene, m-xylene, o-xylene or mixture of o-, m-, and p-isomers. Solvents with relatively low polarity are generally preferred. For inkjet printing solvents and solvent mixtures with high boiling temperatures are preferred. For spin coating alkylated benzenes like xylene and toluene are preferred.

Examples of especially preferred solvents include, without limitation, dichloromethane, trichloromethane, tetrachloromethane, chlorobenzene, o-dichlorobenzene, 1,2,4-trichlorobenzene, 1,2-dichloroethane, 1,1,1-trichloroethane, 1,1,2,2-tetrachloroethane, 1,8-diiodooctane, 1-chloronaphthalene, 1,8-octane-dithiol, anisole, 2,5-di-methylanisole, 2,4-dimethylanisole, toluene, o-xylene, m-xylene, p-xylene, mixture of o-, m-, and p-xylene isomers, 1,2,4-trimethylbenzene, mesitylene, cyclohexane, 1-methylnaphthalene, 2-methylnaphthalene, 1,2-dimethylnaphthalene, tetraline, decaline, indane, 1-methyl-4-(1-methylethenyl)-cyclohexene (d-Limonene), 6,6-dimethyl-2-methylenebicyclo[3.1.1] heptanes (β-pinene), methyl benzoate, ethyl benzoate, nitrobenzene, benzaldehyde, tetrahydrofuran, 1,4-dioxane, 1,3-dioxane, morpholine, acetone, methylethylketone, ethyl acetate, n-butyl acetate, N,N-dimethylformamide, dimethylacetamide, dimethylsulfoxide and/or mixtures thereof.

The concentration of the polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., *Journal of Paint Technology,* 1966, 38 (496), 296". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

The polymer according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Ink jet printing is particularly preferred when high resolution layers and devices needs to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the compound or polymer, which reduces or prevents clogging of the jets and separation of the components during spraying. The solvent(s) may include those selected from the following list of examples: dodecylbenzene, 1-methyl-4-tert-butylbenzene, terpineol, limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers, polymer blends, mixtures and formulations according to the present invention can additionally comprise one or more further components or additives selected for example from surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

The polymers, polymer blends and mixtures according to the present invention are useful as charge transport, semiconducting, electrically conducting, photoconducting or light emitting material in optical, electrooptical, electronic, electroluminescent or photoluminescent components or devices. In these devices, a polymer, polymer blend or mixture of the present invention is typically applied as a thin layer or film.

Thus, the present invention also provides the use of the polymer, polymer blend, mixture or layer in an electronic device. The formulation may be used as a high mobility semiconducting material in various devices and apparatus. The formulation may be used, for example, in the form of a semiconducting layer or film. Accordingly, in another aspect, the present invention provides a semiconducting layer for use in an electronic device, the layer comprising a polymer, mixture or polymer blend according to the invention. The layer or film may be less than about 30 microns. For various electronic device applications, the thickness may be less than about 1 micron thick. The layer may be deposited, for example on a part of an electronic device, by any of the aforementioned solution coating or printing techniques.

The invention additionally provides an electronic device comprising a polymer, polymer blend, mixture or organic semiconducting layer according to the present invention. Especially preferred devices are OFETs, TFTs, ICs, logic circuits, capacitors, RFID tags, OLEDs, OLETs, OPEDs, OPVs, OPDs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns.

Especially preferred electronic device are OFETs, OLEDs, OPV and OPD devices, in particular bulk heterojunction (BHJ) OPV devices. In an OFET, for example, the active semiconductor channel between the drain and source may comprise the layer of the invention. As another example, in an OLED device, the charge (hole or electron) injection or transport layer may comprise the layer of the invention.

For use in OPV or OPD devices the polymer according to the present invention is preferably used in a formulation that comprises or contains, more preferably consists essentially of, very preferably exclusively of, one or more p-type (electron donor) semiconductor and one or more n-type (electron acceptor) semiconductor. The p-type semiconductor is constituted of a least one polymer according to the present invention. The n-type semiconductor can be an inorganic material such as zinc oxide ($ZnO_x$), zinc tin oxide (ZTO), titanium oxide ($TiO_x$), molybdenum oxide ($MoO_x$), nickel oxide ($NiO_x$), or cadmium selenide (CdSe), or an organic material such as graphene or a fullerene, a conjugated polymer or substituted fullerene, for example a (6,6)-phenyl-butyric acid methyl ester derivatized methano $C_{60}$ fullerene, also known as "PCBM-$C_{60}$" or "$C_{60}$PCBM", as disclosed for example in Science 1995, 270, 1789 and having the structure shown below, or structural analogous compounds with e.g. a $C_{70}$ fullerene group or an organic polymer (see for example Coakley, K. M. and McGehee, M. D. Chem. Mater. 2004, 16, 4533).

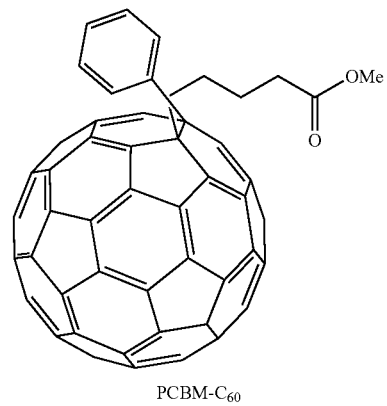 [SMILES: COC(=O)CCCCC12c3c4c5c6c7c3c3c1c1c8c9cc%10cc%11c%12c%13c(c7c7c%12c%10c8c37)C6C(C=C5CC4=CC2(c2ccccc2)C=C1C9)C=C%13C%11]

PCBM-$C_{60}$

Preferably the polymer according to the present invention is blended with an n-type semiconductor such as a fullerene or substituted fullerene of formula XII to form the active layer in an OPV or OPD device wherein,

XII

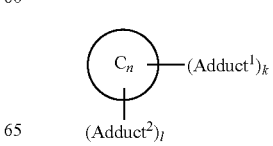

$C_n$ denotes a fullerene composed of n carbon atoms, optionally with one or more atoms trapped inside, Adduct[1] is a primary adduct appended to the fullerene $C_n$ with any connectivity, Adduct[2] is a secondary adduct, or a combination of secondary adducts, appended to the fullerene $C_n$ with any connectivity, k is an integer ≥1, and l is 0, an integer ≥1, or a non-integer >0.

In the formula XII and its subformulae, k preferably denotes 1, 2, 3 or 4, very preferably 1 or 2.

The fullerene $C_n$ in formula XII and its subformulae may be composed of any number n of carbon atoms Preferably, in the compounds of formula XII and its subformulae the number of carbon atoms n of which the fullerene $C_n$ is composed is 60, 70, 76, 78, 82, 84, 90, 94 or 96, very preferably 60 or 70.

The fullerene $C_n$ in formula XII and its subformulae is preferably selected from carbon based fullerenes, endohedral fullerenes, or mixtures thereof, very preferably from carbon based fullerenes.

Suitable and preferred carbon based fullerenes include, without limitation, $(C_{60-Ih})$[5,6]fullerene, $(C_{70-D5h})$[5,6]fullerene, $(C_{76-D2*})$[5,6]fullerene, $(C_{84-D2*})$[5,6]fullerene, $(C_{84-D2d})$[5,6]fullerene, or a mixture of two or more of the aforementioned carbon based fullerenes.

The endohedral fullerenes are preferably metallofullerenes. Suitable and preferred metallofullerenes include, without limitation, La@$C_{60}$, La@$C_{82}$, Y@$C_{82}$, $Sc_3$N@$C_{80}$, $Y_3$N@$C_{80}$, $Sc_3C_2$@$C_{80}$ or a mixture of two or more of the aforementioned metallofullerenes.

Preferably the fullerene $C_n$ is substituted at a [6,6] and/or [5,6] bond, preferably substituted on at least one [6,6] bond.

Primary and secondary adduct, named "Adduct" in formula XII and its subformulae, is preferably selected from the following formulae

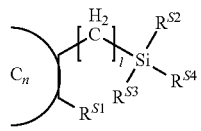  S-1

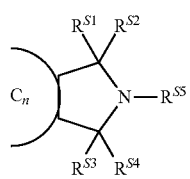  S-2

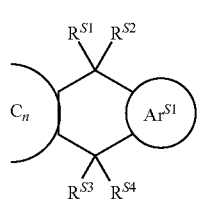  S-3

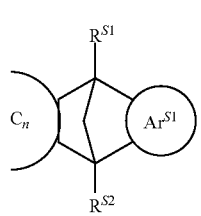  S-4

-continued

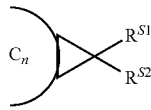  S-5

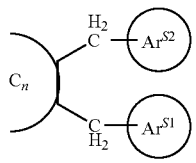  S-6

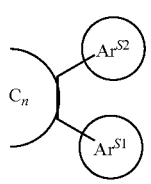  S-7

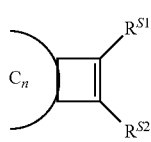  S-8

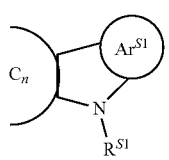  S-9

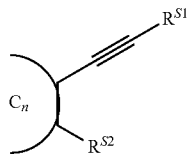  S-10

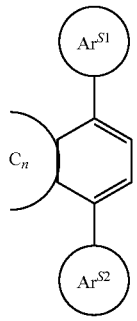  S-11

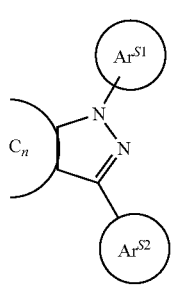  S-12

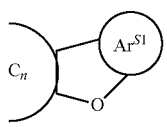 S-13

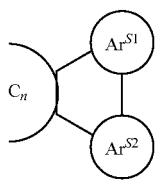 S-14

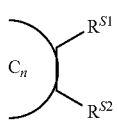 S-15

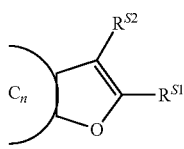 S-16

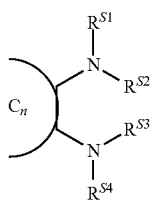 S-17

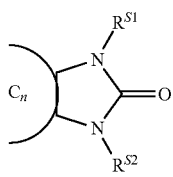 S-18

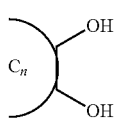 S-19

 S-20

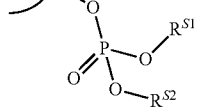 S-21

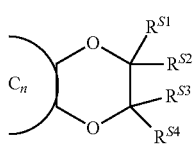

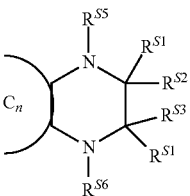 S-22

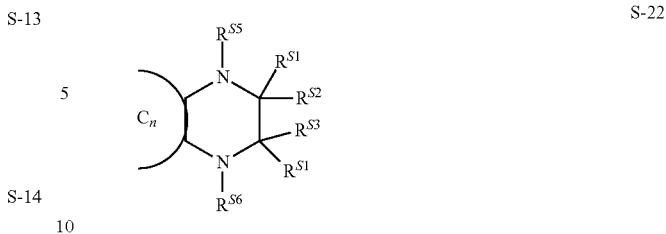

wherein $Ar^{S1}$, $Ar^{S2}$ denote, independently of each other, an arylene or heteroarylene group with 5 to 20, preferably 5 to 15, ring atoms, which is mono- or polycyclic, and which is optionally substituted by one or more identical or different substituents having one of the meanings of $R^S$ as defined above and below, $R^{S1}$, $R^{S2}$, $R^{S3}$, $R^{S4}$, $R^{S5}$ and $R^{S6}$ independently of each other denote H, CN or have one of the meanings of $R^S$ as defined above and below.

Preferred compounds of formula XII are selected from the following subformulae:

XIIa

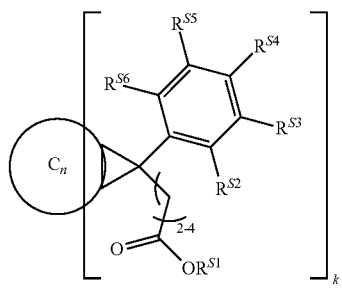

XIIb

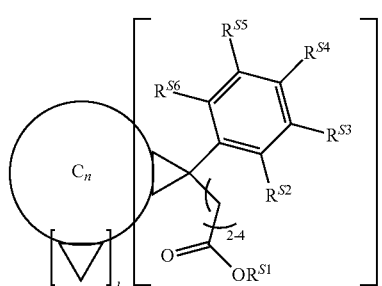

XIIc

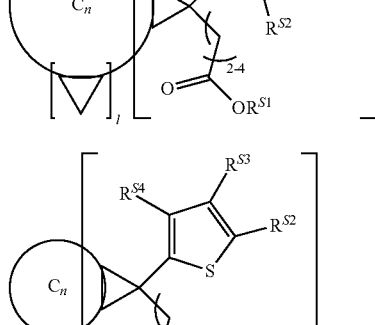

XIId

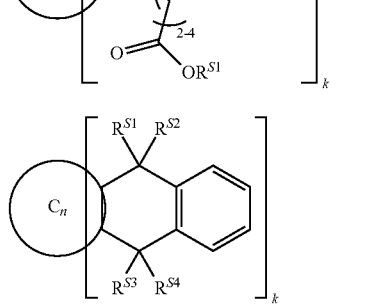

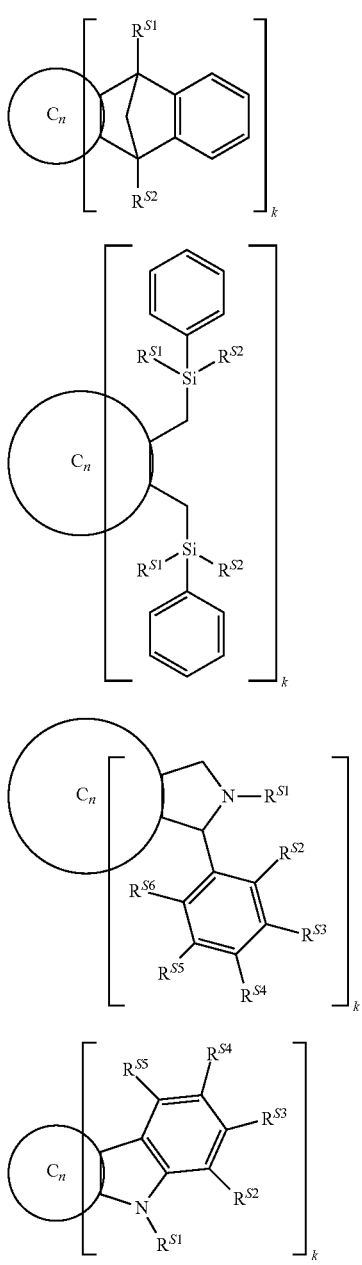

wherein
$R^{S1}$, $R^{S2}$, $R^{S3}$, $R^{S4}$ $R^{S5}$ and $R^{S6}$ independently of each other denote H or have one of the meanings of $R^S$ as defined above and below.

Also preferably the polymer according to the present invention is blended with other type of n-type semiconductor such as graphene, a metal oxide, like for example, ZnOx, TiOx, ZTO, MoOx, NiOx, quantum dots, like for example, CdSe or CdS, or a conjugated polymer, like for example a polynaphthalenediimide or polyperylenediimide as described, for example, in WO2013142841 A1 to form the active layer in an OPV or OPD device.

The device preferably further comprises a first transparent or semi-transparent electrode on a transparent or semi-transparent substrate on one side of the active layer, and a second metallic or semi-transparent electrode on the other side of the active layer.

Preferably, the active layer according to the present invention is further blended with additional organic and inorganic compounds to enhance the device properties. For example, metal particles such as Au or Ag nanoparticules or Au or Ag nanoprism for enhancements in light harvesting due to near-field effects (i.e. plasmonic effect) as described, for example in Adv. Mater. 2013, 25 (17), 2385-2396 and Adv. Ener. Mater. 10.1002/aenm.201400206, a molecular dopant such as 2,3,5,6-tetrafluoro-7,7,8,8-tetracyanoquinodimethane for enhancement in photoconductivity as described, for example in Adv. Mater. 2013, 25(48), 7038-7044, or a stabilising agent consisting of a UV absorption agent and/or anti-radical agent and/or antioxidant agent such as 2-hydroxybenzophenone, 2-hydroxyphenylbenzotriazole, oxalic acid anilides, hydroxyphenyl triazines, merocyanines, hindered phenol, N-aryl-thiomorpholine, N-aryl-thiomorpholine-1-oxide, N-aryl-thiomorpholine-1,1-dioxide, N-aryl-thiazolidine, N-aryl-thiazolidine-1-oxide, N-aryl-thiazolidine-1,1-dioxide and 1,4-diazabicyclo[2.2.2]octane as described, for example, in WO2012095796 A1 and in WO2013021971 A1.

The device preferably may further comprise a UV to visible photo-conversion layer such as described, for example, in J. Mater. Chem. 2011, 21, 12331 or a NIR to visible or IR to NIR photo-conversion layer such as described, for example, in J. Appl. Phys. 2013, 113, 124509.

Further preferably the OPV or OPD device comprises, between the active layer and the first or second electrode, one or more additional buffer layers acting as hole transporting layer and/or electron blocking layer, which comprise a material such as metal oxides, like for example, ZTO, $MoO_x$, $NiO_x$, a doped conjugated polymer, like for example PEDOT:PSS and polypyrrole-polystyrene sulfonate (PPy:PSS), a conjugated polymer, like for example polytriarylamine (PTAA), an organic compound, like for example substituted triaryl amine derivatives such as N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD), graphene based materials, like for example, graphene oxide and graphene quantum dots or alternatively as hole blocking layer and/or electron transporting layer, which comprise a material such as metal oxide, like for example, $ZnO_x$, $TiO_x$, AZO (aluminium doped zinc oxide), a salt, like for example LiF, NaF, CsF, a conjugated polymer electrolyte, like for example poly[3-(6-trimethylammoniumhexyl) thiophene], poly(9,9-bis(2-ethylhexyl)-fluorene]-b-poly[3-(6-trimethylammoniumhexyl)thiophene], or poly[(9,9-bis (3"-(N,N-dimethylamino)propyl)-2,7-fluorene)-alt-2,7-(9,9-dioctylfluorene)], a polymer, like for example poly (ethyleneimine) or crosslinked N-containing compound derivatives or an organic compound, like for example tris (8-quinolinolato)-aluminium(III) ($Alq_3$), phenanthroline derivative or $C_{60}$ or $C_{70}$ based fullerenes, like for example, as described in Adv. Energy Mater. 2012, 2, 82-86.

In a blend or mixture of a polymer according to the present invention with a fullerene or modified fullerene, the ratio polymer:fullerene is preferably from 5:1 to 1:5 by weight, more preferably from 2:1 to 1:3 by weight, most preferably 1:1 to 1:2 by weight. A polymeric binder may also be included, from 5 to 95% by weight. Examples of binder include polystyrene (PS), polypropylene (PP) and polymethylmethacrylate (PMMA).

To produce thin layers in BHJ OPV devices the polymers, polymer blends or mixtures of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. For the fabrication of OPV devices and modules area printing method compatible with flexible substrates are preferred, for example slot dye coating, spray coating and the like.

Suitable solutions or formulations containing a blend or mixture of a polymer according to the present invention with a fullerene or modified fullerene like PCBM are preferably prepared. In the preparation of such a formulation, suitable solvents are preferably selected to ensure full dissolution of both component, p-type and n-type and take into account the boundary conditions (for example rheological properties) introduced by the chosen printing method.

Organic solvent are generally used for this purpose. Typical solvents can be aromatic solvents, halogenated solvents or chlorinated solvents, including chlorinated aromatic solvents. Examples include, but are not limited to dichloromethane, trichloromethane, tetrachloromethane, chlorobenzene, o-dichlorobenzene, 1,2,4-trichlorobenzene, 1,2-dichloroethane, 1,1,1-trichloroethane, 1,1,2,2-tetrachloroethane, 1,8-diiodooctane, 1-chloronaphthalene, 1,8-octane-dithiol, anisole, 2,5-di-methylanisole, 2,4-dimethylanisole, toluene, o-xylene, m-xylene, p-xylene, mixture of xylene o-, m-, and p-isomers, 1,2,4-trimethylbenzene, mesitylene, cyclohexane, 1-methylnaphthalene, 2-methylnaphthalene, 1,2-dimethylnaphthalene, tetraline, decaline, indane, 1-methyl-4-(1-methylethenyl)-cyclohexene (d-Limonene), 6,6-dimethyl-2-methylenebicyclo[3.1.1]heptanes (β-pinene), methyl benzoate, ethyl benzoate, nitrobenzene, benzaldehyde, tetrahydrofuran, 1,4-dioxane, 1,3-dioxane, morpholine, acetone, methylethylketone, ethyl acetate, n-butyl acetate, N,N-dimethylformamide, dimethylacetamide, dimethylsulfoxide and/or mixtures thereof.

The OPV device can for example be of any type known from the literature (see e.g. Waldauf et al., *Appl. Phys. Lett.*, 2006, 89, 233517).

A first preferred OPV device according to the invention comprises the following layers (in the sequence from bottom to top):
  optionally a substrate,
  a high work function electrode, preferably comprising a metal oxide, like for example ITO and FTO, serving as anode,
  an optional conducting polymer layer or hole transport layer, preferably comprising an organic polymer or polymer blend, for example PEDOT:PSS (poly(3,4-ethylenedioxythiophene):poly(styrene-sulfonate), substituted triaryl amine derivatives, for example, TBD (N,N'-dyphenyl-N—N'-bis(3-methylphenyl)-1,1'biphenyl-4,4'-diamine) or NBD (N,N'-dyphenyl-N—N'-bis(1-napthylphenyl)-1,1'biphenyl-4,4'-diamine),
  a layer, also referred to as "active layer", comprising of at least one p-type and at least one n-type organic semiconductor, which can exist for example as a p-type/n-type bilayer or as distinct p-type and n-type layers, or as blend or p-type and n-type semiconductor, forming a BHJ,
  optionally a layer having electron transport properties, for example comprising LiF, $TiO_x$, $ZnO_x$, PFN, a poly (ethyleneimine) or crosslinked nitrogen containing compound derivatives or a phenanthroline derivatives
  a low work function electrode, preferably comprising a metal like for example aluminum, serving as cathode,
  wherein at least one of the electrodes, preferably the anode, is transparent to visible and/or NIR light, and
  wherein at least one p-type semiconductor is a polymer according to the present invention.

A second preferred OPV device according to the invention is an inverted OPV device and comprises the following layers (in the sequence from bottom to top):
  optionally a substrate,
  a high work function metal or metal oxide electrode, comprising for example ITO and FTO, serving as cathode,
  a layer having hole blocking properties, preferably comprising a metal oxide like $TiO_x$ or $ZnO_x$, or comprising an organic compound such as polymer like poly(ethyleneimine) or crosslinked nitrogen containing compound derivatives or phenanthroline derivatives,
  an active layer comprising at least one p-type and at least one n-type organic semiconductor, situated between the electrodes, which can exist for example as a p-type/n-type bilayer or as distinct p-type and n-type layers, or as blend or p-type and n-type semiconductor, forming a BHJ,
  an optional conducting polymer layer or hole transport layer, preferably comprising an organic polymer or polymer blend, for example of PEDOT:PSS or substituted triaryl amine derivatives, for example, TBD or NBD,
  an electrode comprising a high work function metal like for example silver, serving as anode,
  wherein at least one of the electrodes, preferably the cathode, is transparent to visible and/or NIR light, and
  wherein at least one p-type semiconductor is a polymer according to the present invention.

In the OPV devices of the present invention the p-type and n-type semiconductor materials are preferably selected from the materials, like the polymer/fullerene systems or polymer/polymer systems, as described above When the active layer is deposited on the substrate, it forms a BHJ that phase separates at nanoscale level. For discussion on nanoscale phase separation see Dennler et al, *Proceedings of the IEEE*, 2005, 93 (8), 1429 or Hoppe et al, *Adv. Func. Mater*, 2004, 14(10), 1005. An optional annealing step may be then necessary to optimize blend morpohology and consequently OPV device performance.

Another method to optimize device performance is to prepare formulations for the fabrication of OPV(BHJ) devices that may include high boiling point additives to promote phase separation in the right way. 1,8-Octanedithiol, 1,8-diiodooctane, nitrobenzene, 1-chloronaphthalene, N,N-dimethylformamide, dimethylacetamide, dimethylsulfoxide and other additives have been used to obtain high-efficiency solar cells. Examples are disclosed in J. Peet, et al, *Nat. Mater.*, 2007, 6, 497 or Fréchet et al. *J. Am. Chem. Soc.*, 2010, 132, 7595-7597.

The polymers, polymer blends, mixtures and layers of the present invention are also suitable for use in an OFET as the semiconducting channel. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a polymer, polymer blend, mixture or organic semiconducting layer according to the present invention. Other features of the OFET are well known to those skilled in the art.

OFETs where an OSC material is arranged as a thin film between a gate dielectric and a drain and a source electrode, are generally known, and are described for example in U.S. Pat. Nos. 5,892,244, 5,998,804, 6,723,394 and in the references cited in the background section. Due to the advantages, like low cost production using the solubility properties of the compounds according to the invention and thus the processibility of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises:
  a source electrode,
  a drain electrode,
  a gate electrode,
  a semiconducting layer,
  one or more gate insulator layers,
  optionally a substrate.
wherein the semiconductor layer preferably comprises a polymer, polymer blend or mixture according to the present invention.

The OFET device can be a top gate device or a bottom gate device. Suitable structures and manufacturing methods of an OFET device are known to the skilled in the art and are described in the literature, for example in US 2007/0102696 A1.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a low permittivity (or dielectric constant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetary value, like stamps, tickets, shares, cheques etc.

Alternatively, the polymers, polymer blends and mixtures according to the invention can be used in OLEDs, e.g. as the active display material in a flat panel display applications, or as backlight of a flat panel display like e.g. a liquid crystal display. Common OLEDs are realized using multilayer structures. An emission layer is generally sandwiched between one or more electron-transport and/or hole-transport layers. By applying an electric voltage electrons and holes as charge carriers move towards the emissive layer where their recombination leads to the excitation and hence luminescence of the lumophor units contained in the emission layer.

The polymers, polymer blends and mixtures according to the invention can be employed in one or more of a buffer layer, electron or hole transport layer, electron or hole blocking layer and emissive layer, corresponding to their electrical and/or optical properties. Furthermore their use within the emissive layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Müller et al, *Synth. Metals,* 2000, 111-112, 31-34, Alcala, *J. Appl. Phys.,* 2000, 88, 7124-7128 and the literature cited therein.

According to another use, the polymers, polymer blends and mixtures according to this invention, especially those showing photoluminescent properties, may be employed as materials of light sources, e.g. in display devices, as described in EP 0 889 350 A1 or by C. Weder et al., *Science,* 1998, 279, 835-837.

A further aspect of the invention relates to both the oxidised and reduced form of a polymer according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantation of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2\pm)$ $(BF_4^-)$, $AgClO_4$, $H_2IrCl_6$, $La(NO_3)_3 \cdot 6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of a polymer of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

The polymers, polymer blends and mixtures according to the present invention may also be suitable for use in organic plasmon-emitting diodes (OPEDs), as described for example in Koller et al., Nat. Photonics, 2008, 2, 684.

According to another use, the polymers according to the present invention can be used alone or together with other materials in or as alignment layers in LCD or OLED devices, as described for example in US 2003/0021913. The use of charge transport polymers according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The polymers according to the present invention having mesogenic or liquid crystalline properties can form oriented anisotropic films as described above, which are especially useful as alignment layers to induce or enhance alignment in a liquid crystal medium provided onto said anisotropic film. The polymers according to the present invention may also be combined with photoisomerisable compounds and/or chromophores for use in or as photoalignment layers, as described in US 2003/0021913 A1.

According to another use the polymers, polymer blends and mixtures according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A., 1999, 96, 12287; D. Wang, X. Gong, P. S. Heeger, F. Rininsland, G. C. Bazan and A. J. Heeger, Proc. Natl. Acad. ScL U.S.A., 2002, 99, 49; N. DiCesare, M. R. Pinot, K. S. Schanze and J. R. Lakowicz, Langmuir, 2002, 18, 7785; D. T. McQuade, A. E. Pullen, T. M. Swager, Chem. Rev., 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius. The values of the dielectric constant ε ("permittivity") refer to values taken at 20° C. and 1,000 Hz.

The invention will now be described in more detail by reference to the following examples, which are illustrative only and do not limit the scope of the invention.

EXAMPLES

Example 1—Monomer 1

Example 1.1. Thieno[3,2-b]thiophene-3-carboxylic acid

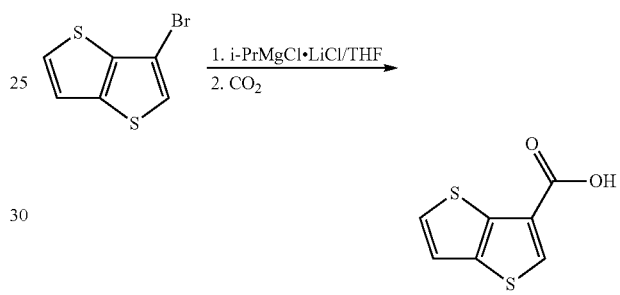

Isopropylmagnesium chloride lithium chloride complex (128 cm$^3$, 166 mmol, 1.3 M solution in tetrahydrofuran) is added to tetrahydrofuran (230 cm$^3$) and cooled to 0° C. 3-Bromo-thieno[3,2-b]thiophene (30.4 g, 139 mmol) is slowly added and the resulting mixture stirred for 30 minutes. Subsequently, the cooling bath is removed and the mixture stirred for a further 2 hours. Then, the mixture is cooled to 0° C. and gaseous carbon dioxide is bubbled through the solution for 16 hours. The mixture is allowed to warm to 23° C. and is quenched by addition of 1 M aq. hydrochloric acid (200 cm$^3$ followed by an additional portion of 1 M hydrochloric acid until pH<5). The phases are separated and the water phase extracted with tetrahydrofuran (2×300 cm$^3$). Combined organic phases are dried over anhydrous magnesium sulfate, filtered and evaporated to dryness. The residue is purified by column chromatography on silica (dichloromethane/tetrahydrofuran; 8:2). Yield 23.2 g (91%), off-white solid.

$^1$H-NMR (300 MHz, DMSO-d$_6$): δ ppm 7.30 (d, J=5.3 Hz, 1H), 7.52 (dd, J=5.3, 1.5 Hz, 1H), 8.33 (d, J=1.5 Hz, 1H).

Example 1.2. [2,2']Bi[thieno[3,2-b]thiophenyl]-3,3'-dicarboxylic acid

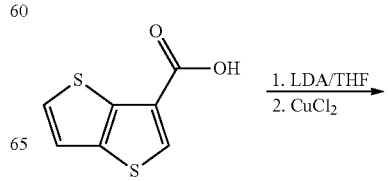

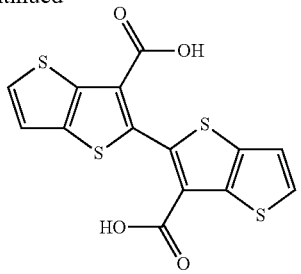

To a solution of thieno[3,2-b]thiophene-3-carboxylic acid (1.00 g, 5.43 mmol) in tetrahydrofuran (30 cm³) cooled to −78° C. is added lithium diisopropylamide (5.7 cm³, 11.4 mmol, 2 M in tetrahydrofuran). The mixture is stirred for 1 hour at −78° C. and subsequently transferred to a dry flask containing copper (II) chloride (1.6 g, 112 mmol) at −78° C. The resultant mixture is allowed to warm up to 23° C. and stirred for 16 hours. Subsequently, the reaction is quenched by addition of methanol (80 cm³). The precipitate is filtered off, washed with tetrahydrofuran (10 cm³), water (100 cm³) and dissolved in 10% aq. sodium hydroxide (200 cm³). The solution is filtered, poured onto ice and acidified with 36% aq. hydrochloric acid. The resultant precipitate is filtered, washed with water and dried in air. Yield: 402 mg (40%), yellow powder.

$^1$H-NMR (300 MHz, DMSO-d$_6$): δ ppm 7.52 (d, J=5.3 Hz, 2H), 7.82 (d, J=5.3 Hz, 2H).

Example 1.3. Diethyl 5,5'-bis(trimethylsilyl)-[2,2]bi[thieno[3,2-b]thiophenyl]-3,3'-dicarboxylate

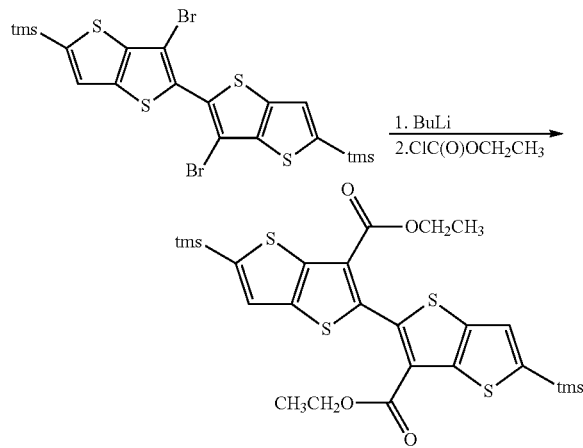

n-Butyllithium (44.9 cm³, 71.9 mmol, 1.6 M solution in hexanes) is added dropwise to a stirred solution of 3,3'-dibromo-2,2'-bithieno[3,2-b]thiene-5,5'-diylbis(trimethylsilane) (16.0 g, 27.6 mmol) in anhydrous diethyl ether (700 cm³) at −90° C. under an argon atmosphere. The reaction mixture is stirred for 30 minutes before a solution of ethyl chloroformate (7.4 cm³, 78 mmol) in anhydrous diethyl ether (10 cm³) is added in one portion. Once the addition is complete, the reaction mixture is allowed to warm to 23° C. overnight and quenched with water. The crude product is then extracted with hexane (200 cm³) and the combined organics were washed with water (3×200 cm³) and brine (200 cm³). The organic layer is then dried over anhydrous magnesium sulfate and the volatiles removed in vacuo. Purification by column chromatography on silica (hexane: ethyl acetate; 5:1). Yield: 7.4 g, (47%), brown oil.

$^1$H NMR (400 MHz, CDCl$_3$) δ ppm, 0.38 (s, 18H), 1.18 (t, 6H), 4.23 (q, 4H), 7.34 (s, 2H); $^{13}$C NMR (100 MHz, CDCl$_3$) δ ppm −0.16, 14.02, 60.98, 124.09, 124.68, 139.14, 142.18, 144.92, 146.09, 161.85; ESI (m/z) 567 ([M+H]$^+$, 60%), Calc. 567.0644, Found. 567.0656.

Example 1.4. [2,2']Bi[thieno[3,2-b]thiophenyl]-3,3'-dicarboxylic acid (Alternative Method)

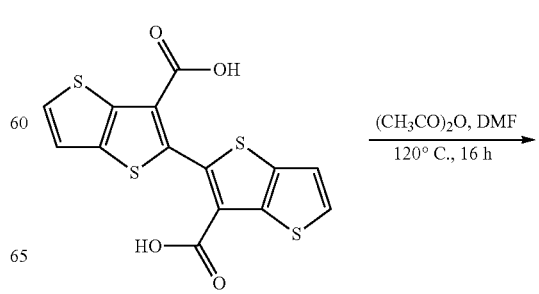

Sodium hydroxide (1.1 g, 27 mmol) is added to a stirred solution of diethyl 5,5'-bis(trimethylsilyl)-[2,2]bi[thieno[3,2-b]thiophenyl]-3,3'-dicarboxylate (1.5 g, 2.7 mmol) in methanol (110 cm³) and tetrahydrofuran (110 cm³) and heated at reflux for 16 hours. The reaction mixture is then cooled to 0° C. before the volatiles are removed in vacuo. Concentrated hydrochloric acid (100 cm³) is added to the resulting residue, the precipitate collected and dried under high vacuum. Yield: 0.9 g (93%), yellow solid.

$^1$H NMR (400 MHz, DMSO-d$_6$) δ ppm 7.51 (d, 2H), 7.82 (d, 2H); $^{13}$C NMR (100 MHz, CDCl$_3$) δ ppm 119.73, 125.15, 130.49, 137.07, 139.72, 140.38, 162.81; ESI (m/z) 367 ([M+H]$^+$, 100%), Calc. 366.9227, Found. 366.9240.

Example 1.5. [2,2']Bi[thieno[3,2-b]thiophenyl]-3,3'-dicarboxylic acid anhydride

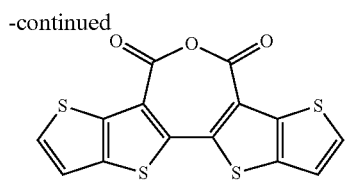

[2,2']Bi[thieno[3,2-b]thiophenyl]-3,3'-dicarboxylic acid (1.00 g, 2.73 mmol) is stirred with acetic anhydride (50 cm³) and N,N-dimethylformamide (20 cm³) at 120° C. for 16 hours. The mixture is subsequently cooled to 0° C. and the golden solid filtered out, washed with cold acetic anhydride (10 cm³) and diethyl ether (100 cm³) and dried under vacuum. Yield 0.62 g (65%).

¹H-NMR (300 MHz, DMSO-$d_6$): δ ppm 7.60 (d, J=5.27 Hz, 1H) 7.98 (d, J=5.37 Hz, 1H).

Example 1.6. N-2-Octyl-dodecyl-[2,2]bi[thieno[3,2-b]thiophenyl]-3,3'-dicarboximide

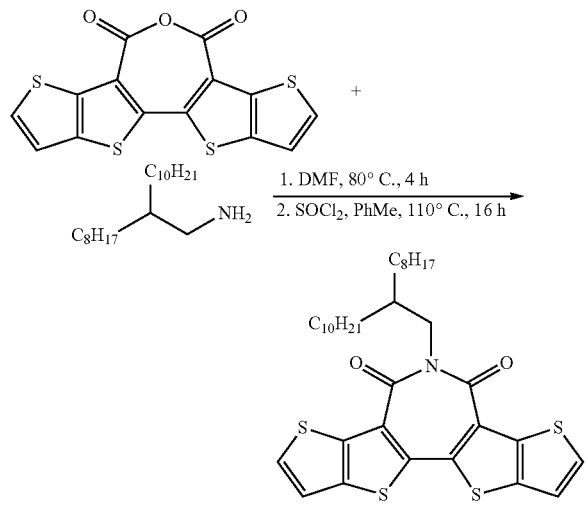

[2,2']Bi[thieno[3,2-b]thiophenyl]-3,3'-dicarboxylic acid anhydride (1.29 g, 3.70 mmol) and 2-octyl-dodecylamine (1.1 g, 3.7 mmol) are dissolved in N,N-dimethylformamide (30 cm³). The mixture is stirred for 4 hours at 80° C. Subsequently, the solvent is removed in vacuo. The residue is dissolved in toluene (10 cm³) and thionyl chloride (4.0 cm³, 56 mmol) is added and the mixture heated at reflux for 16 hours. The mixture is then cooled to 23° C. and stirred with ice-water under nitrogen for 2 hours. The phases are separated and the organic phase washed with water and aq. sodium carbonate, dried over anhydrous magnesium sulfate, filtered and the solvent removed in vacuo. The residue passed through a silica plug (DCM). The residue is further purified by column chromatography on silica (petroleum ether 40-60 and dichloromethane, gradient from 1:0 to 0:1). Yield: 1.58 g (67%), yellow solid.

¹H-NMR (300 MHz, CDCl₃): δ ppm 0.86 (m, 6H) 1.13-1.45 (m, 32H) 2.05 (m, 1H) 4.44 (d, J=7.4 Hz, 2H) 7.30 (d, J=5.4 Hz, 2H) 7.63 (d, J=5.4 Hz, 2H).

Example 1.7. Monomer 1

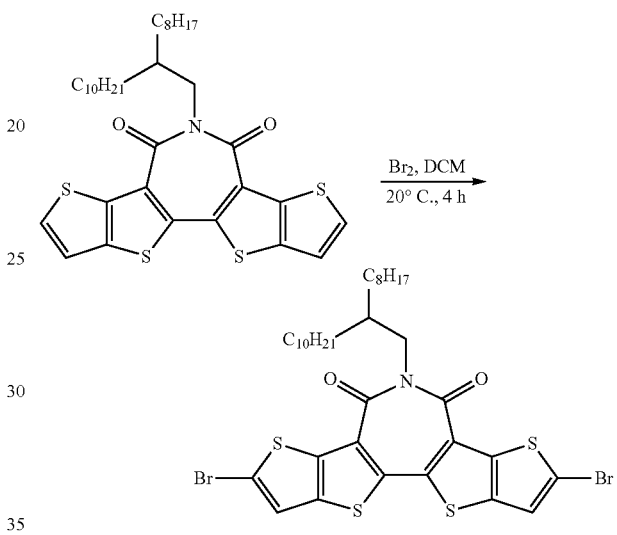

N-2-Octyl-dodecyl-[2,2']bi[thieno[3,2-b]thiophenyl]-3,3'-dicarboximide (600 mg, 0.96 mmol) is dissolved in dichloromethane (20 cm³) and stirred at 20° C. Bromine (313 mg, 1.96 mmol) is added and the mixture stirred for 4 hours. Subsequently, the product is triturated by the addition of methanol (100 cm³), filtered off, washed with methanol (200 cm³) and dried in air. The solid is purified by column chromatography on silica (petroleum ether 40-60 and dichloromethane, gradient from 1:0 to 0:1). Yield: 512 mg (68%), yellow powder.

¹H-NMR (300 MHz, CDCl₃): δ ppm 0.87 (m, 6H), 1.14-1.48 (m, 32H), 1.99 (m, 1H), 4.37 (d, J=7.35 Hz, 2H), 7.28 (s, 2H).

Example 2—Polymer 1

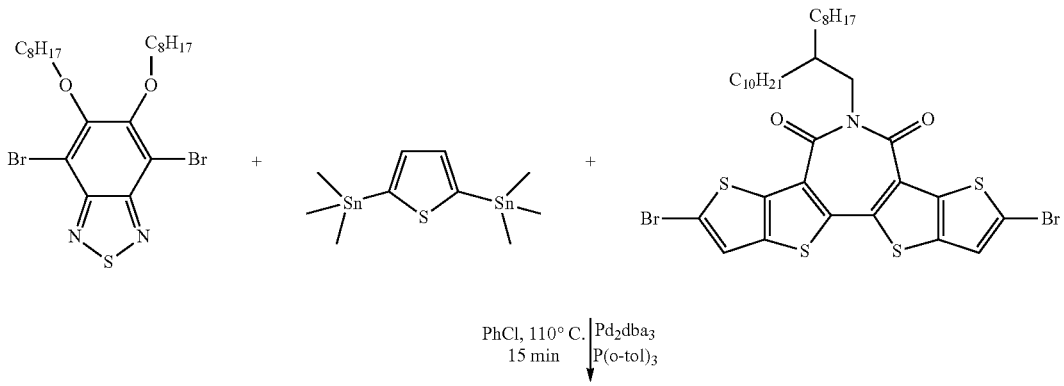

-continued

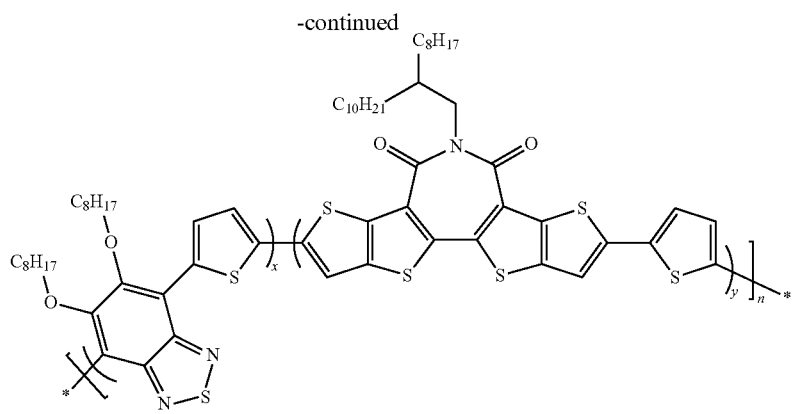

2,5-Bis-trimethylstannanyl-thiophene (297.8 mg; 0.73 mmol; 2.00 eq.), monomer 1 (285.5 mg; 0.36 mmol; 1.00 eq.), 4,7-dibromo-5,6-bis-octyloxy-benzo[1,2,5]thiadiazole (200.00 mg; 0.36 mmol; 1.00 eq.), tri-o-tolyl-phosphine (17.7 mg; 58.1 μmol; 0.16 eq.) and Pd2(dba)3 (13.3 mg; 14.5 μmol; 0.04 eq.) are placed in a 20 cm³ flask equipped with a side arm and an air condenser with a bubbler and nitrogen inlet. Degassed chlorobenzene (7.4 cm³) is added and the mixture purged with nitrogen for 10 minutes. The flask is heated to 110° C. in a metal heating block for 15 minutes. The mixture is transferred into a flask containing 200 cm³ of methanol, the precipitate collected by filtration and subjected to Soxhlet extraction with, subsequently, acetone, petroleum ether (40-60° C.), cyclohexane, chloroform and chlorobenzene. The chlorobenzene fraction is triturated by addition of excess methanol, the precipitate is collected by filtration and dried in vacuo to give a black solid (96 mg, 22.4%). GPC (50° C., chlorobenzene) Mn=47.1 kg mol$^{-1}$; Mw=88.6 kg mol$^{-1}$; PDI=1.88.

Example 3—Monomer 2

Example 3.1. N-Octyl-[2,2']bi[thieno[3,2-b]thiophenyl]-3,3'-dicarboximide

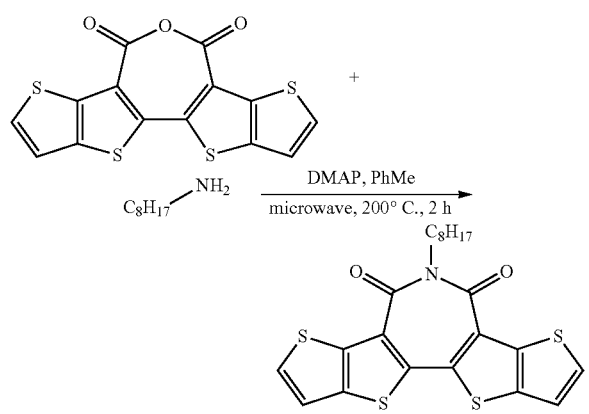

An oven-dried microwave vial equipped with a stir bar was charged with [2,2']bi[thieno[3,2-b]thiophenyl]-3,3'-dicarboxylic acid anhydride (64.8 mg, 0.186 mmol) and 4-(dimethylamino)pyridine (7.5 mg, 0.061 mmol). The vial was purged with argon before anhydrous toluene (1.0 cm³) was added. A solution of n-octylamine (30.7 μL, 0.186 mmol) in anhydrous toluene (0.5 cm³) was then added drop-wise and the reaction mixture was subjected to the following microwave conditions: 100° C. for 2 min, 140° C. for 2 min, 180° C. for 2 min, and 200° C. for 120 min. Once the reaction mixture had cooled, the crude product was extracted with diethyl ether (10 mL). The organics were washed with water (3×10 mL) and brine (10 mL) and dried (MgSO4), and the volatiles were removed in vacuo to yield the title compound as a brown solid (78.0 mg, 0.170 mmol, 91%). $^1$H NMR (400 MHz, CDCl$_3$) 7.63 (d, 2H, ArH), 7.30 (d, 2H, ArH), 4.37 (m, 2H, —NCH$_2$—), 1.28 (s, 12H, —CH$_2$—), 0.88 (t, 3H, —CH$_3$).

Example 3.2. Monomer 2

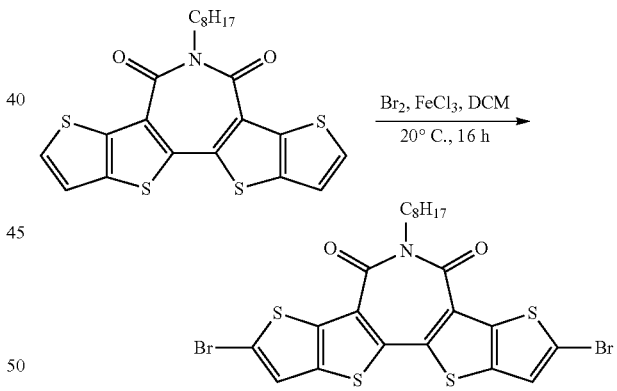

A solution of bromine (35.0 μL, 0.683 mmol) in anhydrous dichloromethane (2 cm³) was added drop-wise to a stirred solution of n-octyl-[2,2']bi[thieno[3,2-b]thiophenyl]-3,3'-dicarboximide (78.0 mg, 0.170 mmol) in anhydrous dichloromethane (20 cm³). Iron(III) chloride (0.6 mg, 0.003 mmol) was added and the reaction mixture was stirred in the dark, at 20° C. for 16 h. After this time, the reaction mixture was quenched with aqueous sodium sulphite and extracted with dichloromethane (25 cm³). The organics were washed with water (3×50 cm³) and brine (50 cm³) and dried (MgSO4), and the volatiles were removed in vacuo. Purification by column chromatography (silica gel, hexane:dichloromethane, 1:1, v:v) yielded the title compound. $^1$H NMR (400 MHz, CDCl$_3$) 7.30 (s, 2H, ArH), 4.33 (m, 2H, —NCH$_2$—), 1.25 (s, 12H, —CH$_2$—), 0.88 (t, 3H, —CH$_3$).

USE EXAMPLES

A) Bulk Heterojunction OPV Devices for Polymer 1

Organic photovoltaic (OPV) devices are fabricated on pre-patterned ITO-glass substrates (13 Ω/sq.) purchased from LUMTEC Corporation.

Substrates were cleaned using common solvents (acetone, iso-propanol, deionized-water) in an ultrasonic bath. A conducting polymer poly(ethylene dioxythiophene) doped with poly(styrene sulfonic acid) [Clevios VPAI 4083 (H. C. Starck)] is mixed in a 1:1 ratio with deionized-water. This solution was filtered using a 0.45 μm filter before spin-coating to achieve a thickness of 20 nm. Substrates were exposed to ozone prior to the spin-coating process to ensure good wetting properties. Films were then annealed at 140° C. for 30 minutes in a nitrogen atmosphere where they were kept for the remainder of the process. Active material solutions (i.e. polymer+PCBM) were prepared and stirred overnight to fully dissolve the solutes. Thin films were either spin-coated or blade-coated in a nitrogen atmosphere to achieve active layer thicknesses between 100 and 500 nm as measured using a profilometer. A short drying period followed to ensure removal of any residual solvent.

Typically, spin-coated films were dried at 23° C. for 10 minutes and blade-coated films were dried at 70° C. for 2 minutes on a hotplate. For the last step of the device fabrication, Ca (30 nm)/Al (125 nm) cathodes were thermally evaporated through a shadow mask to define the cells. Current—voltage characteristics were measured using a Keithley 2400 SMU while the solar cells were illuminated by a Newport Solar Simulator at 100 mW·cm-2 white light. The Solar Simulator was equipped with AM1.5G filters. The illumination intensity was calibrated using a Si photodiode. All the device preparation and characterization is done in a dry-nitrogen atmosphere.

Power conversion efficiency is calculated using the following expression $$\eta = \frac{V_{OC} \times J_{SC} \times FF}{P_{in}}$$

where FF is defined as $$FF = \frac{V_{max} \times J_{max}}{V_{OC} \times J_{SC}}$$

OPV devices were prepared wherein the photoactive layer contains a blend of Polymer 1 with the fullerene $PC_{60}BM$, which is coated from a o-dichlorobenzene solution at a total solid concentration as shown in Table 1 below. The OPV device characteristics are shown in Table 1.

TABLE 1

Photovoltaic cell characteristics.

| Polymer | ratio Polymer:PCBM-$C_{60}$ | conc$^n$ mg·ml$^{-1}$ | Voc mV | Jsc mA·cm$^{-2}$ | FF % | PCE % |
|---|---|---|---|---|---|---|
| Polymer 1 | 1.00:2.00 | 30 | 694 | 2.4 | 56 | 0.98 |

The invention claimed is:

1. A polymer comprising one or more units of formula I

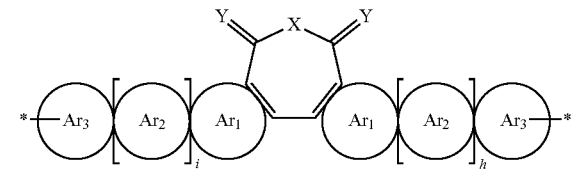

I wherein
$Ar_1$ is, on each occurrence identically or differently,

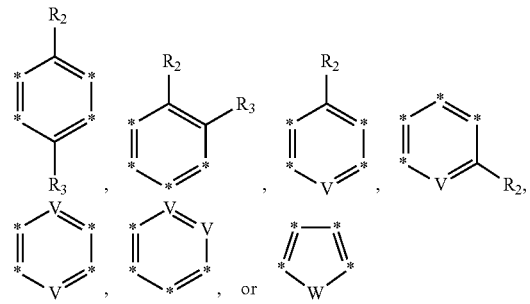

$Ar_2$ is, on each occurrence identically or differently,

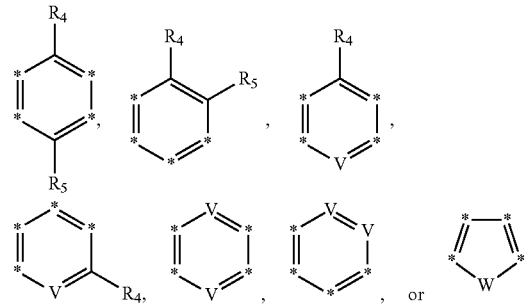

$Ar_3$ is, on each occurrence identically or differently,

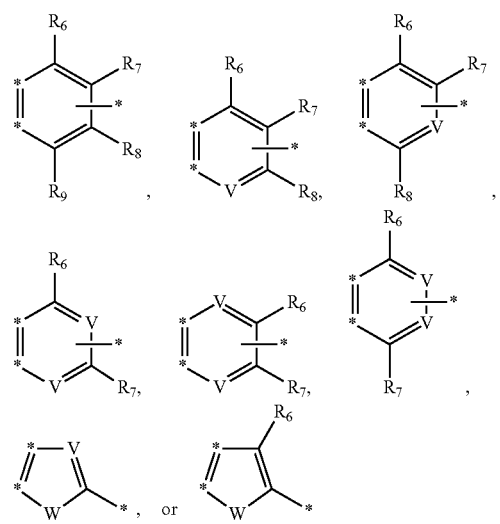

V is CR¹ or N,
W is S, O, Se or NR¹,
X is O or NR¹,
Y is O or S,
R¹ on each occurrence identically or differently, denotes H or straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —NR⁰—, —SiR⁰R⁰⁰—, —CF$_2$—, —CHR⁰=CR⁰⁰—, —CY¹=CY²— or —C≡C— in such a manner that O and/or S atoms are not linked directly to one another, and in which one or more H atoms are optionally replaced by F, Cl, Br, I or CN, or denotes aryl or heteroaryl with 5 to 15 ring atoms, which is mono- or polycyclic and unsubstituted or substituted by one or more groups $R^S$,
$R^{2-9}$ independently of each other, and on each occurrence identically or differently, denote H, halogen or straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —NR⁰—, —SiR⁰R⁰⁰—, —CF$_2$—, —CHR⁰=CR⁰⁰—, —CY¹=CY²— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or denotes aryl or heteroaryl with 5 to 15 ring atoms, which is mono- or polycyclic and unsubstituted or substituted by one or more groups $R^S$,
$R^S$ denotes, on each occurrence identically or differently, F, Br, Cl, —CN, —NC, —NCO, —NCS, —OCN, —SCN, —C(O)NR⁰R⁰⁰, —C(O)X⁰, —C(O)R⁰, —C(O)OR⁰, —NH$_2$, —NR⁰R⁰⁰, —SH, —SR⁰, —SO$_3$H, —SO$_2$R⁰, —OH, —NO$_2$, —CF$_3$, —SF$_5$, optionally substituted silyl, or carbyl or hydrocarbyl with 1 to 40 C atoms that is optionally substituted and optionally comprises one or more hetero atoms,
X⁰ is halogen,
Y¹ and Y² are independently of each other H, F, Cl or CN,
R⁰ and R⁰⁰ are independently of each other H or optionally substituted $C_{1-40}$ carbyl or hydrocarbyl, and
h and i independently of each other denote 0, 1, 2 or 3.

2. The polymer according to claim 1, wherein a unit of formula I is of formula I1

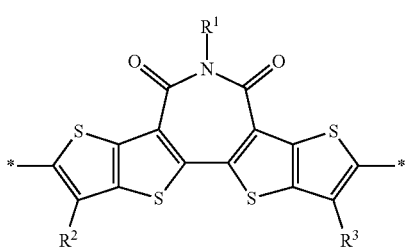

I1 wherein
R¹ on each occurrence identically or differently, denotes H or straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —NR⁰—, —SiR⁰R⁰⁰—, —CF$_2$—, —CHR⁰=CR⁰⁰—, —CY¹=CY²— or —C≡C— in such a manner that O and/or S atoms are not linked directly to one another, and in which one or more H atoms are optionally replaced by F, Cl, Br, I or CN, or denotes aryl or heteroaryl with 5 to 15 ring atoms, which is mono- or polycyclic and unsubstituted or substituted by one or more groups $R^S$,
$R^{2-3}$ independently of each other, and on each occurrence identically or differently, denote H, halogen or straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —NR⁰—, —SiR⁰R⁰⁰—, —CF$_2$—, —CHR⁰=CR⁰⁰—, —CY¹=CY²— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or denotes aryl or heteroaryl with 5 to 15 ring atoms, which is mono- or polycyclic and unsubstituted or substituted by one or more groups $R^S$,
$R^S$ denotes, on each occurrence identically or differently, F, Br, Cl, —CN, —NC, —NCO, —NCS, —OCN, —SCN, —C(O)NR⁰R⁰⁰, —C(O)X⁰, —C(O)R⁰, —C(O)OR⁰, —NH$_2$, —NR⁰R⁰⁰, —SH, —SR⁰, —SO$_3$H, —SO$_2$R⁰, —OH, —NO$_2$, —CF$_3$, —SF$_5$, optionally substituted silyl, or carbyl or hydrocarbyl with 1 to 40 C atoms that is optionally substituted and optionally comprises one or more hetero atoms,
X⁰ is halogen,
Y¹ and Y² are independently of each other H, F, Cl or CN,
R⁰ and R⁰⁰ are independently of each other H or optionally substituted $C_{1-40}$ carbyl or hydrocarbyl.

3. The polymer according to claim 1, which comprises one or more units selected from the following formulae

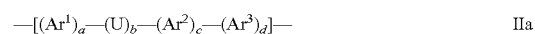     IIa

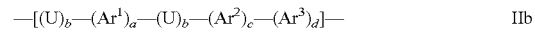     IIb wherein
U is a unit of formula I,
Ar¹, Ar², Ar³ are, on each occurrence identically or differently, and independently of each other, arylene or heteroarylene that is different from U, and is optionally substituted,
$R^S$ is on each occurrence identically or differently F, Br, Cl, —CN, —NC, —NCO, —NCS, —OCN, —SCN, —C(O)NR⁰R⁰⁰, —C(O)X⁰, —C(O)R⁰, —C(O)OR⁰, —NH$_2$, —NR⁰R⁰⁰, —SH, —SR⁰, —SO$_3$H, —SO$_2$R⁰, —OH, —NO$_2$, —CF$_3$, —SF$_5$, optionally substituted silyl, or carbyl or hydrocarbyl with 1 to 40 C atoms that is optionally substituted and optionally comprises one or more hetero atoms,
R⁰ and R⁰⁰ are independently of each other H or optionally substituted $C_{1-40}$ carbyl or hydrocarbyl,
X⁰ is halogen,
a, b, c are on each occurrence identically or differently 0, 1 or 2,
d is on each occurrence identically or differently 0 or an integer from 1 to 10,
wherein the polymer comprises at least one repeating unit of formula IIa or IIb and wherein b is at least 1.

4. The polymer according to claim 1, which further comprises one or more units selected from the following formulae

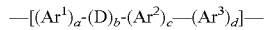　　　IIIa

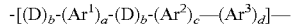　　　IIIb wherein
Ar$^1$, Ar$^2$, Ar$^3$ are, on each occurrence identically or differently, and independently of each other, arylene or heteroarylene that is different from a unit of formula I, and is optionally substituted,
a, b, c are on each occurrence identically or differently 0, 1 or 2,
d is on each occurrence identically or differently 0 or an integer from 1 to 10,
D is an arylene or heteroarylene group that is different from a unit of formula I and Ar$^{1-3}$, has 5 to 30 ring atoms, is optionally substituted by one or more groups R$^S$, and has electron donor properties,
R$^S$ is on each occurrence identically or differently F, Br, Cl, —CN, —NC, —NCO, —NCS, —OCN, —SCN, —C(O)NR$^0$R$^{00}$, —C(O)X$^0$, —C(O)R$^0$, —C(O)OR$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms,
R$^0$ and R$^{00}$ are independently of each other H or optionally substituted C$_{1-40}$ carbyl or hydrocarbyl, and
X$^0$ is halogen,
wherein the polymer comprises at least one repeating unit of formula IIIa or IIIb and wherein b is at least 1.

5. The polymer according to claim 1, which is of formula IV

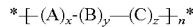　　　IV wherein
A, B, C independently of each other denote a distinct unit of formula I,
x is >0 and ≤1,
Y is ≥0 and <1,
z is ≥0 and <1,
x+y+z is 1, and
n is an integer >1.

6. The polymer according to claim 1, which is selected from the following formulae

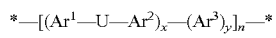　　　IVa

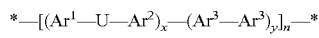　　　IVb

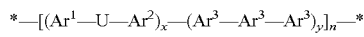　　　IVc

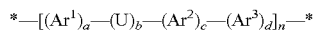　　　IVd

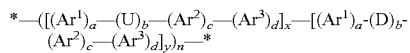　　　IVe

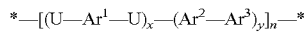　　　IVf

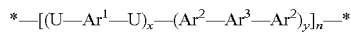　　　IVg

　　　IVh

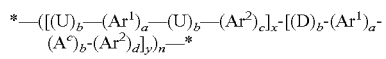　　　IVi

　　　IVk

　　　IVm wherein
U is a unit of formula I,
Ar$^1$, Ar$^2$, Ar$^3$ are, on each occurrence identically or differently, and independently of each other, arylene or heteroarylene that is different from U, and is optionally substituted,
R$^S$ is on each occurrence identically or differently F, Br, Cl, —CN, —NC, —NCO, —NCS, —OCN, —SCN, —C(O)NR$^0$R$^{00}$, —C(O)X$^0$, —C(O)R$^0$, —C(O)OR$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms,
R$^0$ and R$^{00}$ are independently of each other H or optionally substituted C$_{1-40}$ carbyl or hydrocarbyl,
X$^0$ is halogen,
a, b, c are on each occurrence identically or differently 0, 1 or 2,
d is on each occurrence identically or differently 0 or an integer from 1 to 10,
D is an arylene or heteroarylene group that is different from a unit of formula I and Ar$^{1-3}$, has 5 to 30 ring atoms, is optionally substituted by one or more groups R$^S$, and has electron donor properties,
x is >0 and ≤1,
Y is ≥0 and <1,
z is ≥0 and <1,
x+y+z is 1, and
n is an integer >1
which polymer can be alternating or random copolymers, and wherein in formula IVd and IVe in at least one of the repeating units [(Ar$^1$)$_a$—(U)$_b$-(Ar$^2$)$_c$-(Ar$^3$)$_d$] and in at least one of the repeating units [(Ar$^1$)$_a$-(D)$_b$-(Ar$^2$)$_c$-(Ar$^3$)$_d$] b is at least 1 and wherein in formula IVh and IVi in at least one of the repeating units [(U)$_b$—(Ar$^1$)$_a$—(U)$_b$-(Ar$^2$)$_d$] and in at least one of the repeating units [(U)$_b$—(Ar$^1$)$_a$—(U)$_b$-(Ar$^2$)$_d$] b is at least 1.

7. The polymer according to claim 4, wherein one or more of D, Ar$^1$, Ar$^2$ and Ar$^3$ denote arylene or heteroarylene having electron donor properties and being selected from the group consisting of the following formulae

(D1)

(D2)

(D3)

(D4)

(D5) 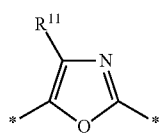
(D6) 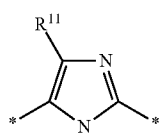
(D7) 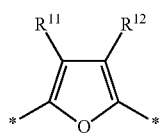
(D8) 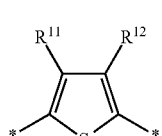
(D9) 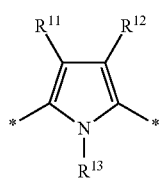
(D10) 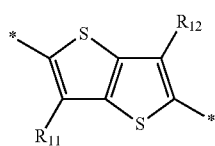
(D11) 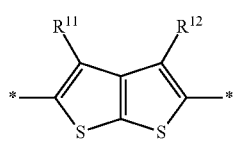
(D12) 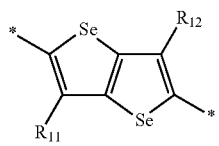
(D13) 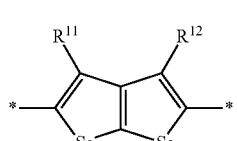
(D14) 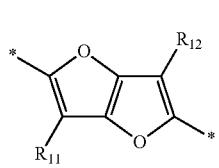
(D15) 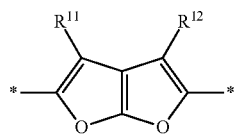
(D16) 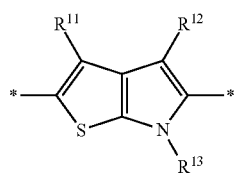
(D17) 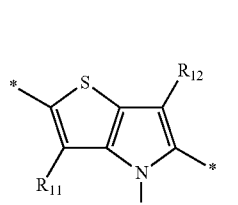
(D18) 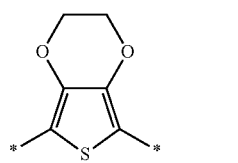
(D19) 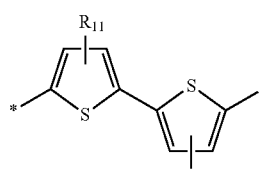
(D20) 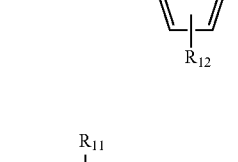
(D21) 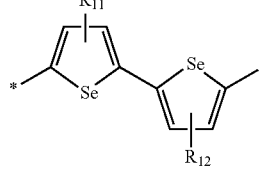
(D22) 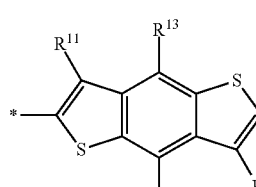

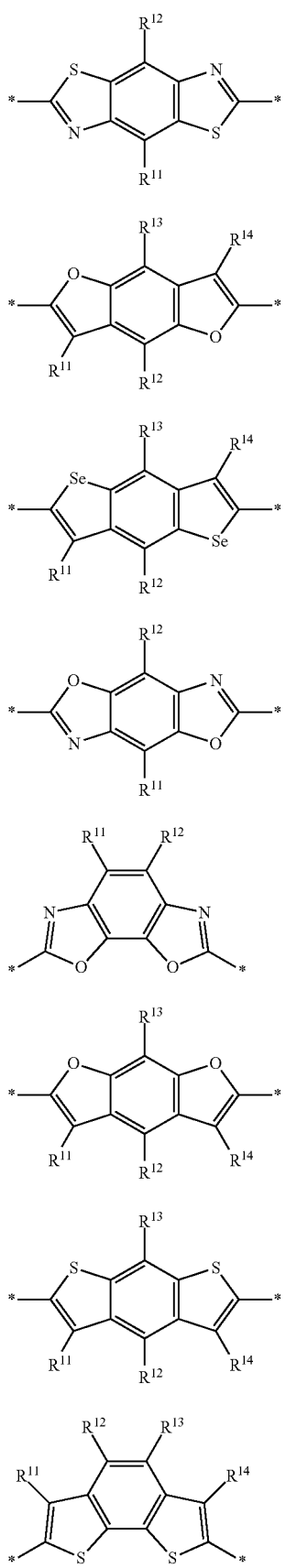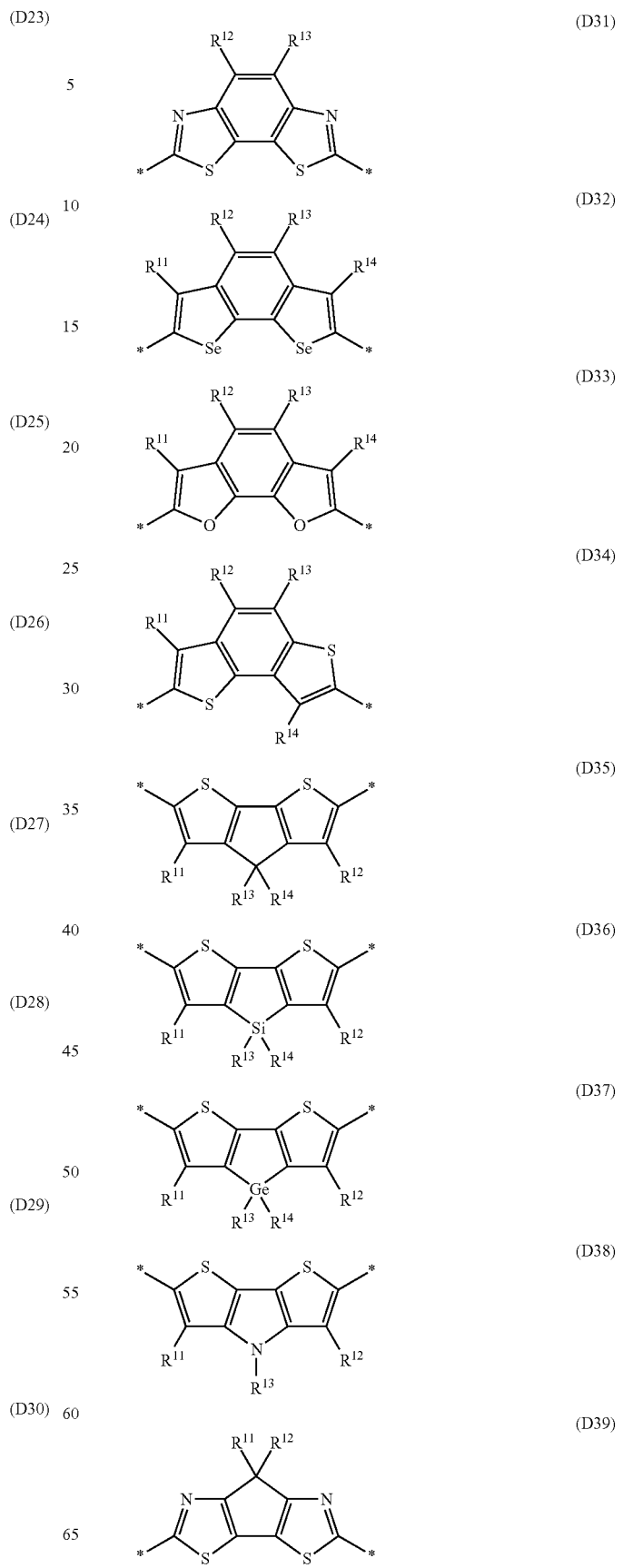

-continued
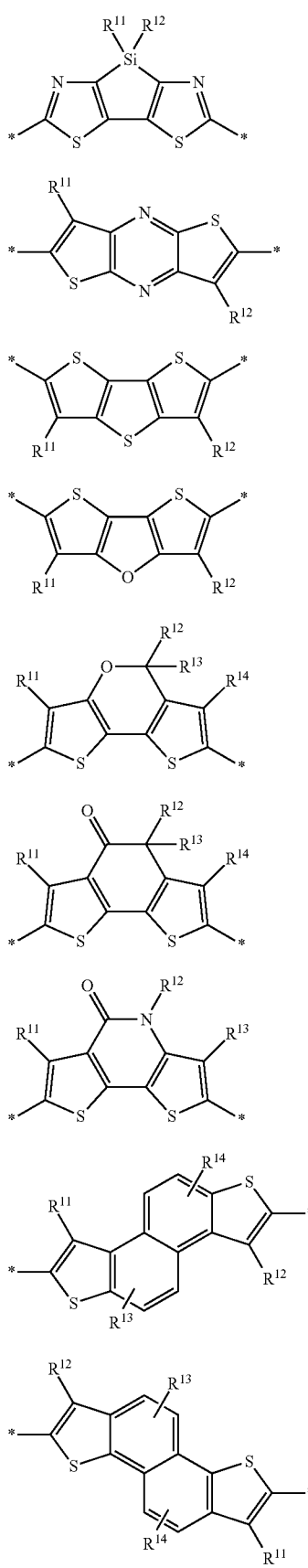
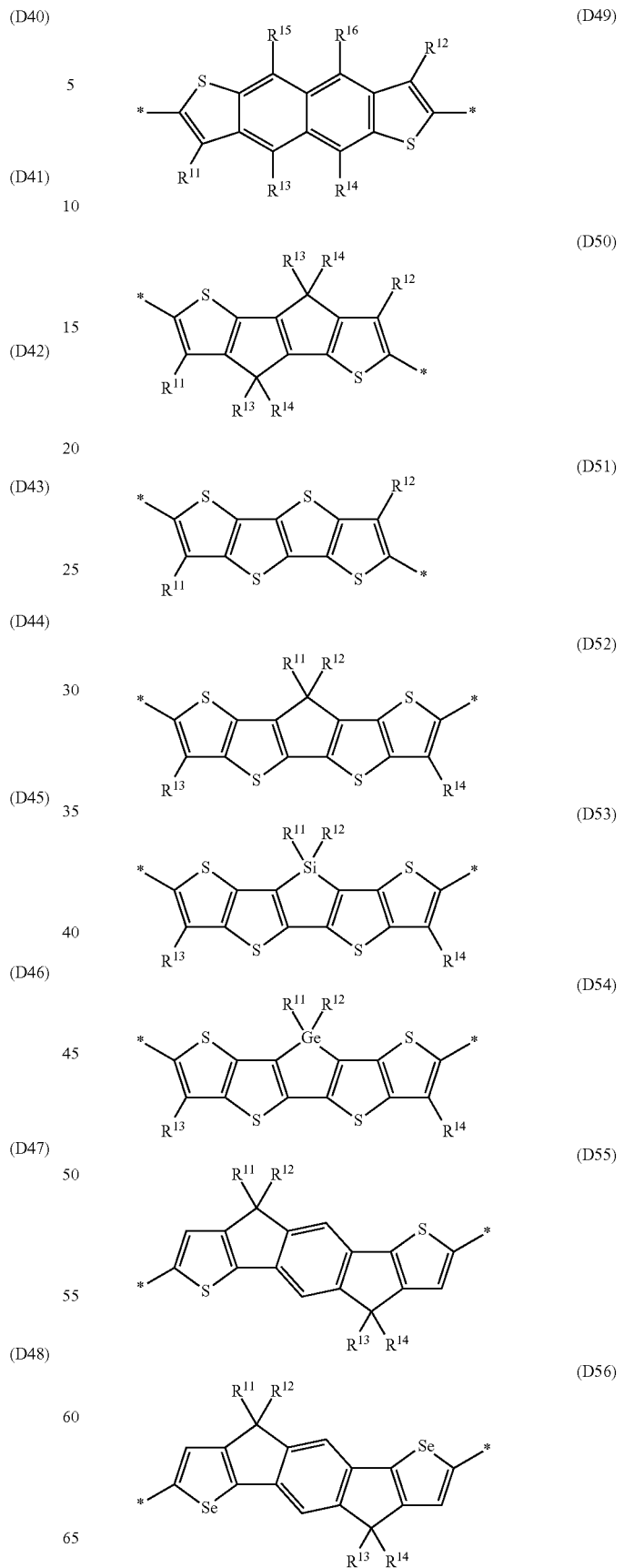

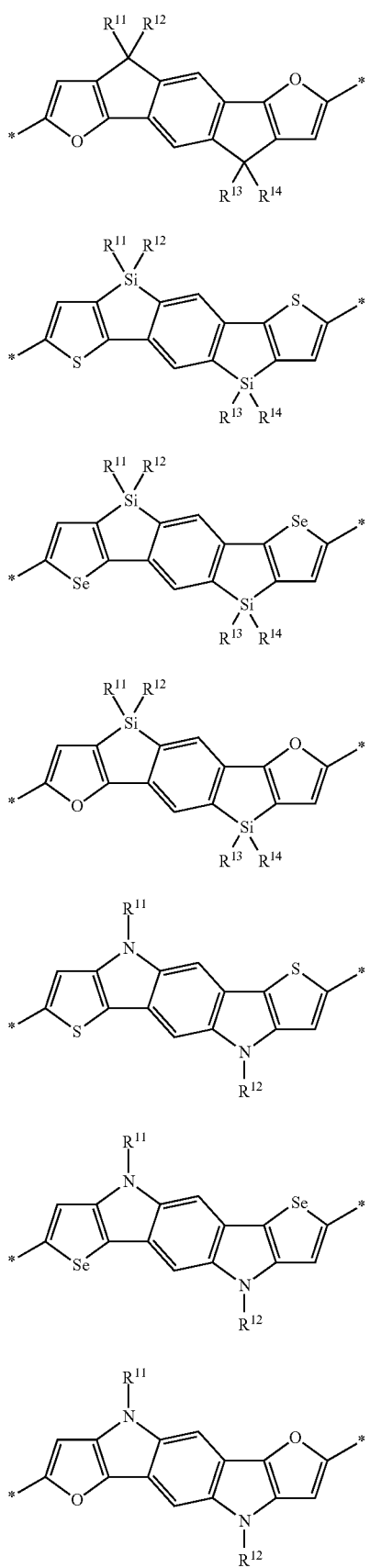
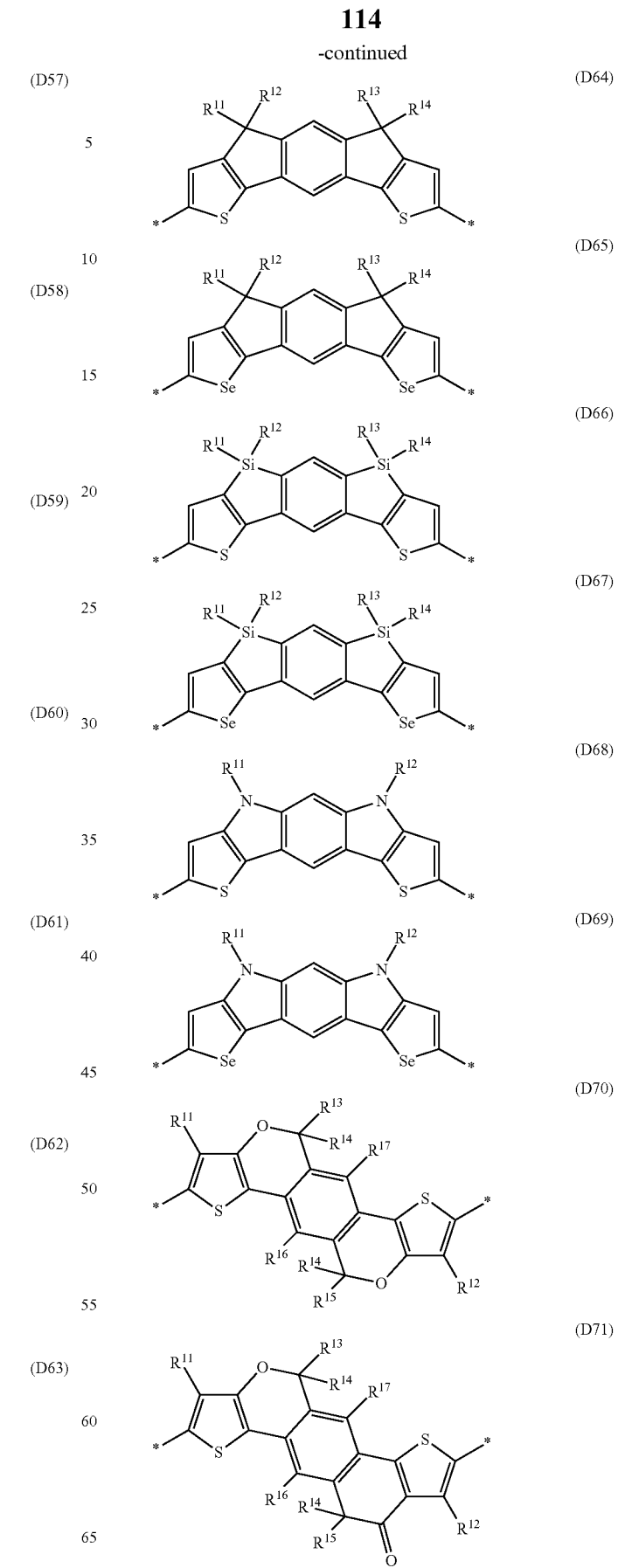

-continued
(D72)
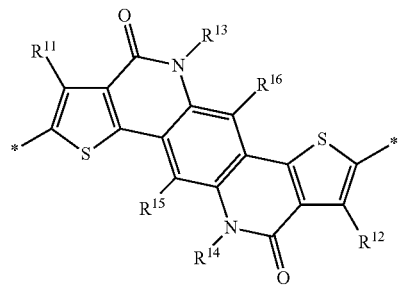
(D73)
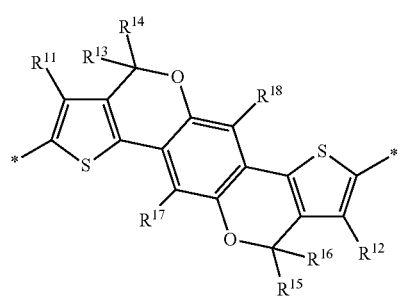
(D74)
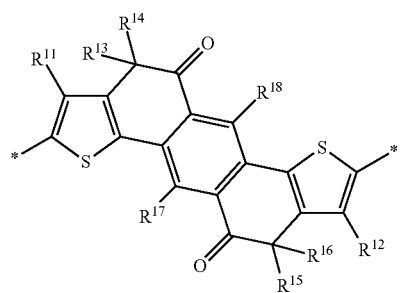
(D75)
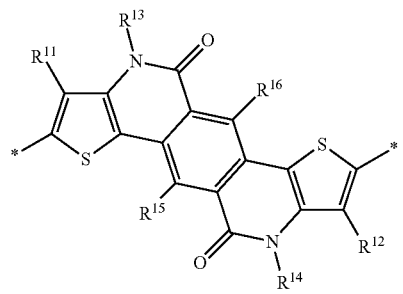
(D76)
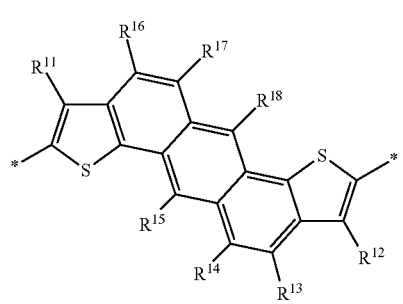
-continued
(D77)
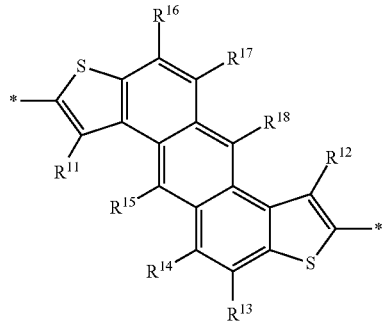
(D78)
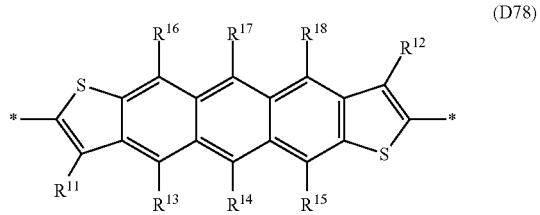
(D79)
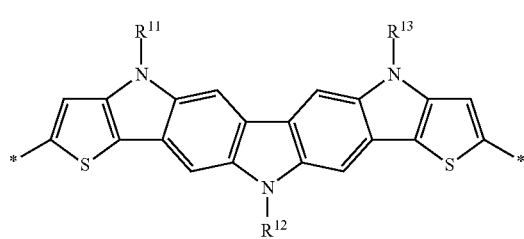
(D80)
(D81)
(D82)

(D83)
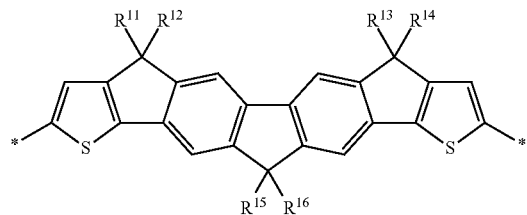
(D84)
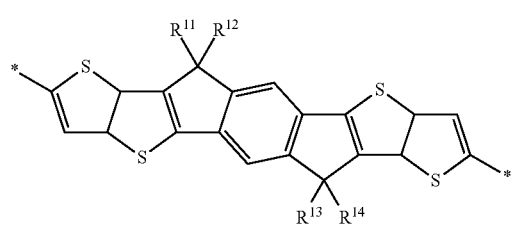
(D85)
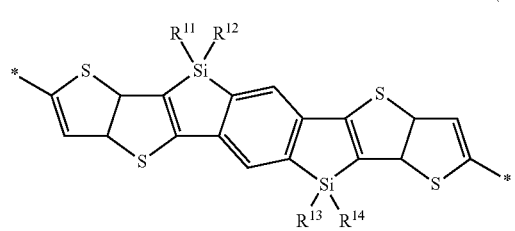
(D86)
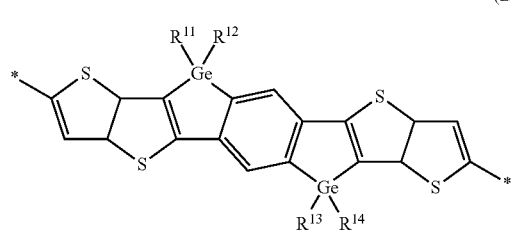
(D87)
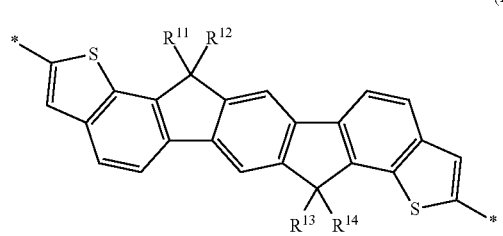
(D88)
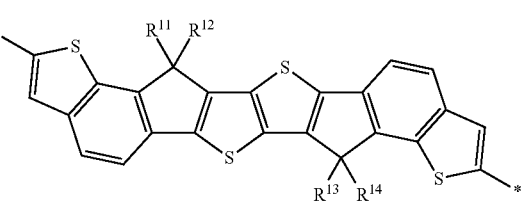
(D89)
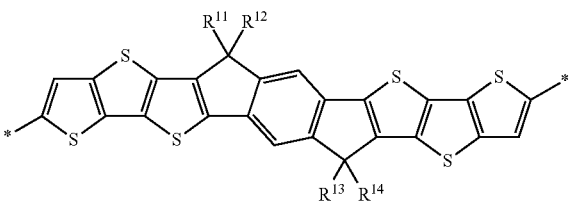
(D90)
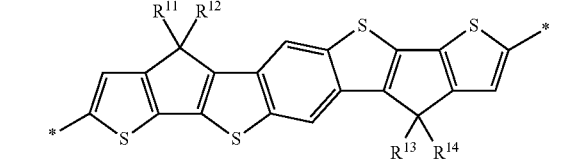
(D91)
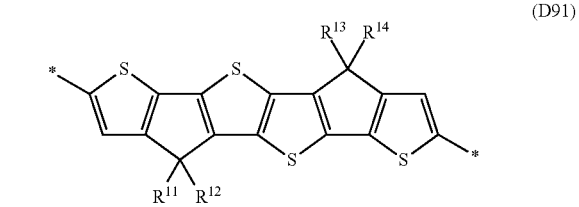
(D92)
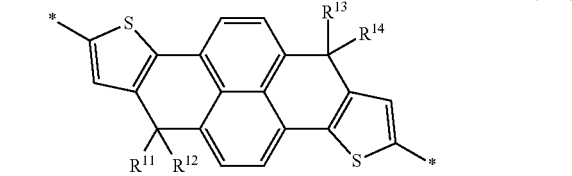
(D93)
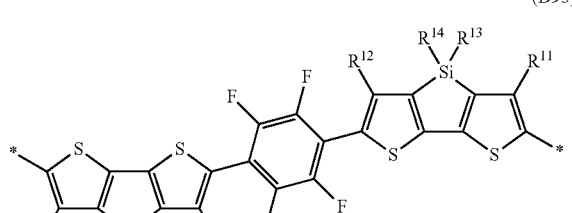
(D94)
(D95)
(D96)

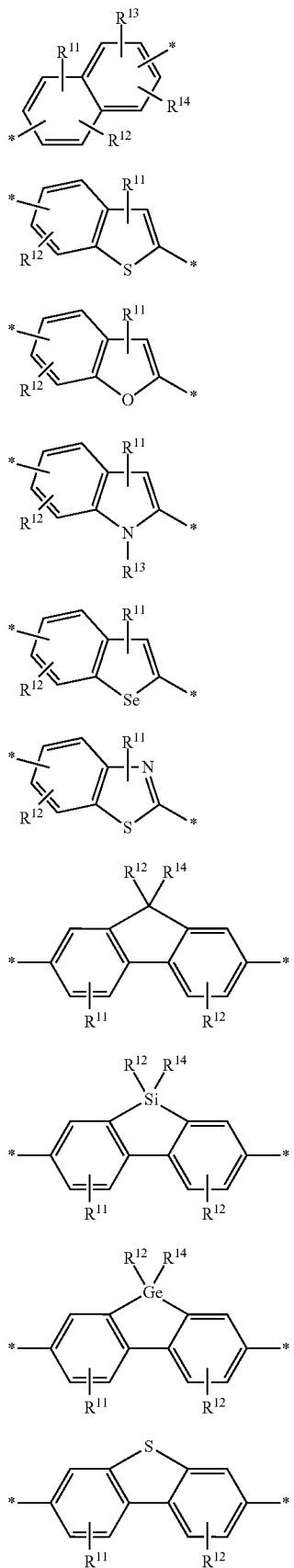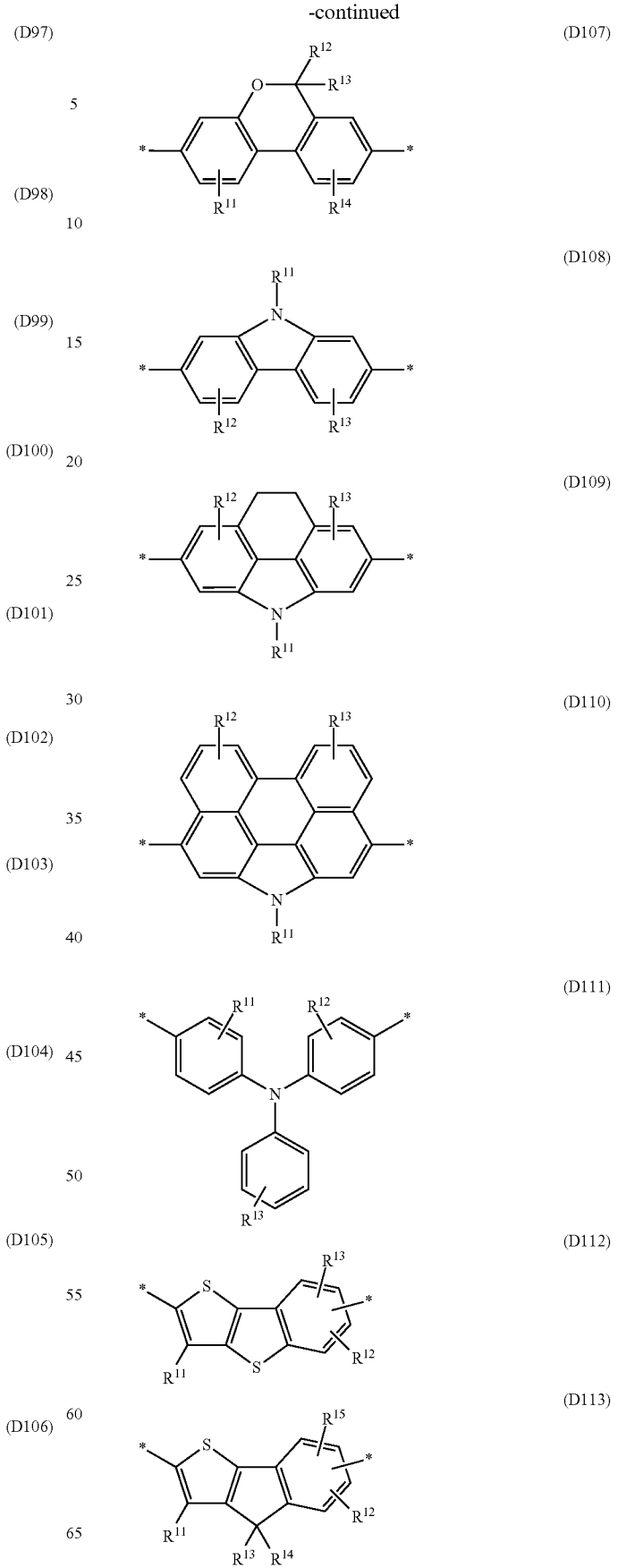

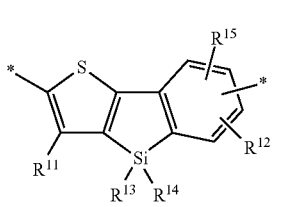
(D114)
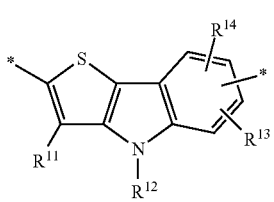
(D115)
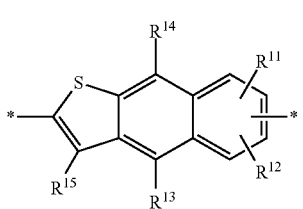
(D116)
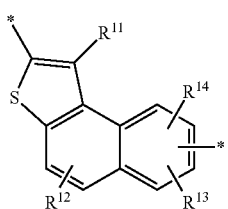
(D117)
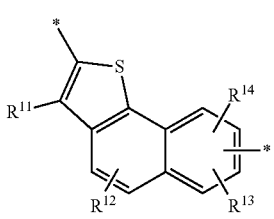
(D118)
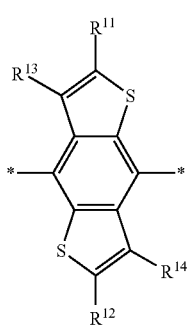
(D119)
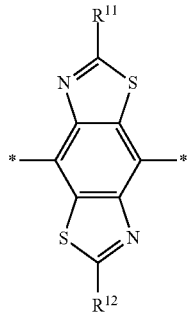
(D120)
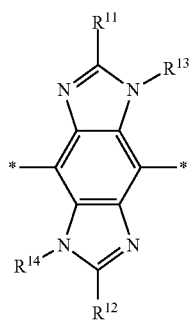
(D121)
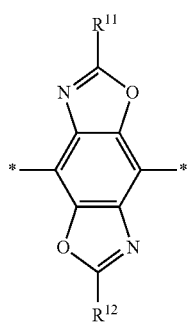
(D122)
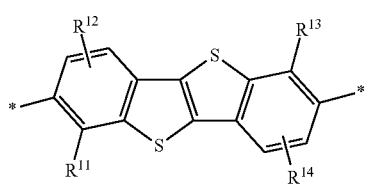
(D123)
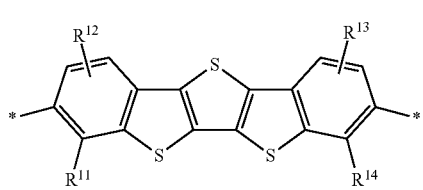
(D124)
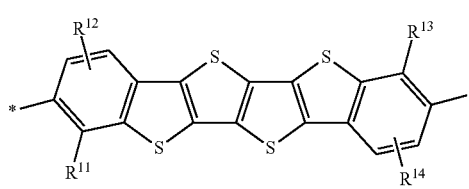
(D125)

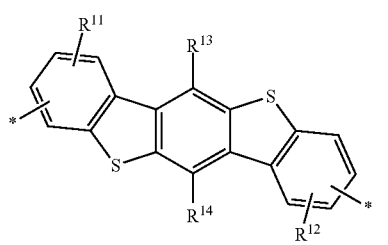
(D126)
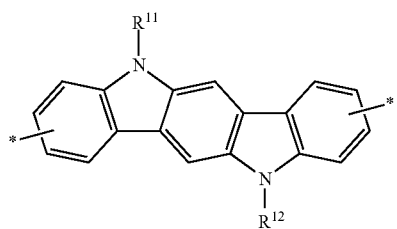
(D127)
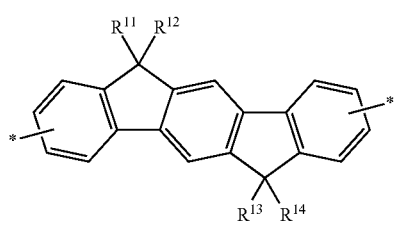
(D128)
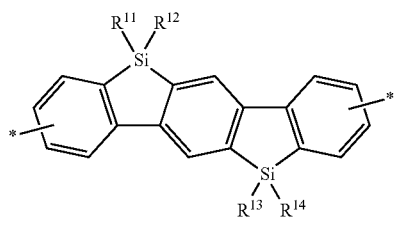
(D129)
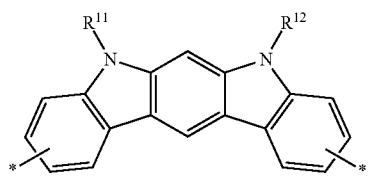
(D130)
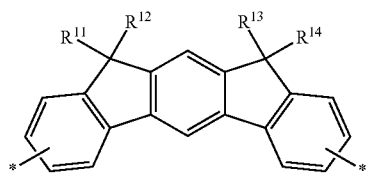
(D131)
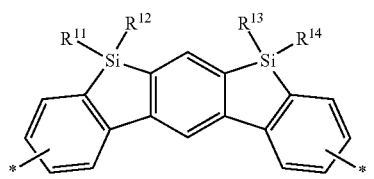
(D132)
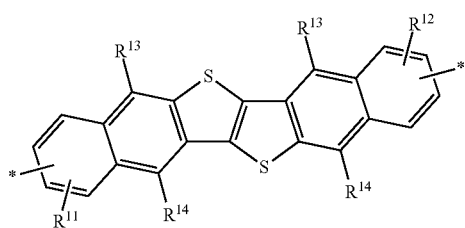
(D133)
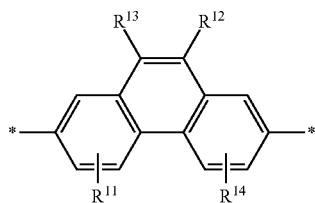
(D134)
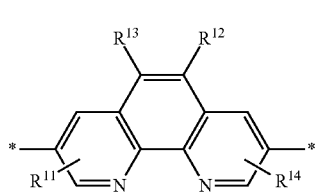
(D135)
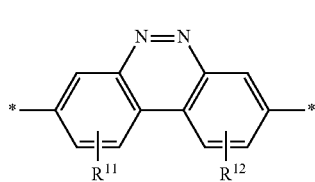
(D136)
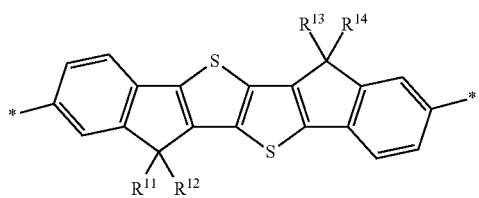
(D137)
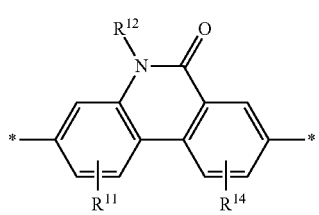
(D138)
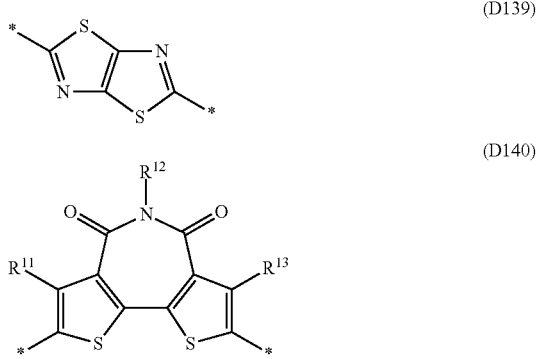
(D139)
(D140)

-continued

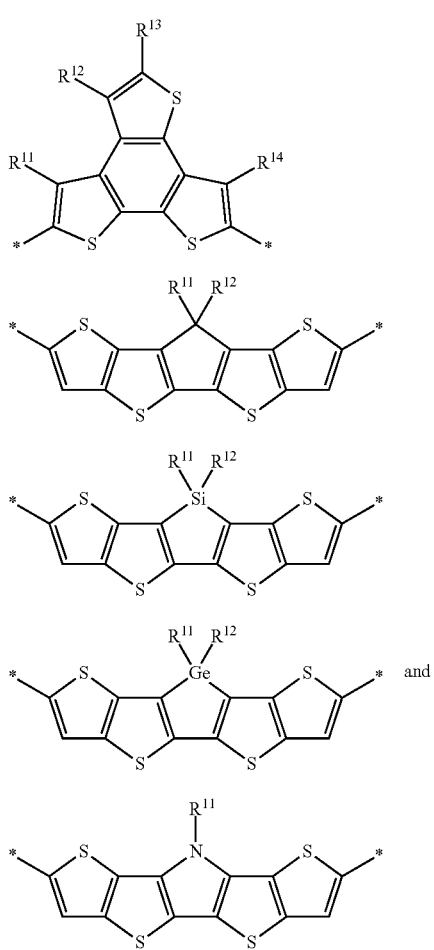

(D141)

(D142)

(D143)

(D144) and (D145)

wherein
R$^{11}$, R$^{12}$, R$^{13}$, R$^{14}$, R$^{15}$, R$^{16}$, R$^{17}$ and R$^{18}$ independently of each other denote H, F, Br, Cl, —CN, —NC, —NCO, —NCS, —OCN, —SCN, —C(O)NR$^0$R$^{00}$, —C(O)X$^0$, —C(O)R$^0$, —C(O)OR$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, R$^0$ and R$^{00}$ are independently of each other H or optionally substituted C$_{1-40}$ carbyl or hydrocarbyl, and X$^0$ is halogen.

8. The polymer according to claim 3, wherein one or more of Ar$^1$, Ar$^2$ and Ar$^3$ denotes arylene or heteroarylene having electron acceptor properties and is selected from the group consisting of the following formulae

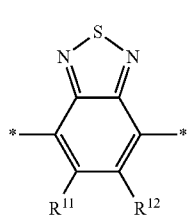

(A1)

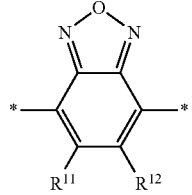

(A2)

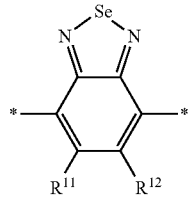

(A3)

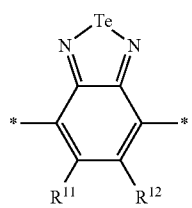

(A4)

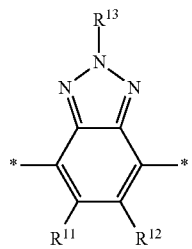

(A5)

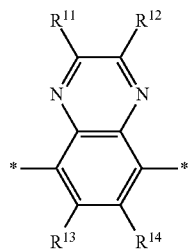

(A6)

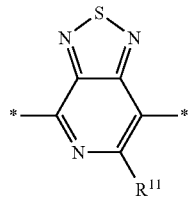

(A7)

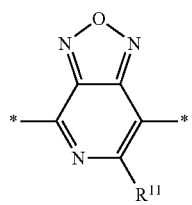

(A8)

-continued
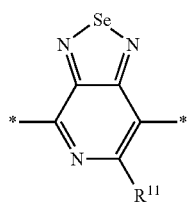 (A9)
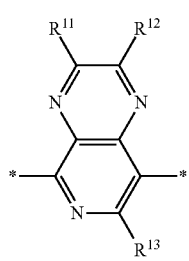 (A10)
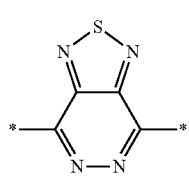 (A11)
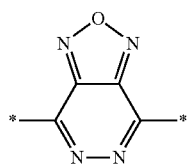 (A12)
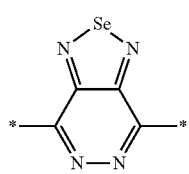 (A13)
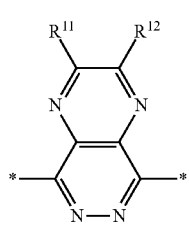 (A14)
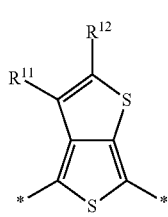 (A15)
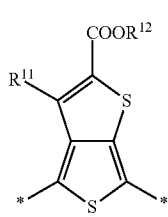 (A16)
-continued
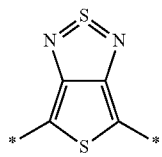 (A17)
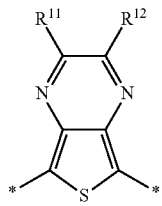 (A18)
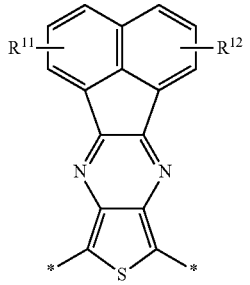 (A19)
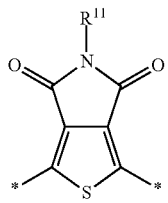 (A20)
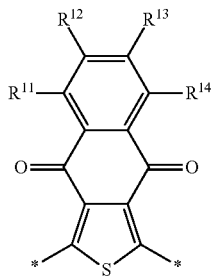 (A21)
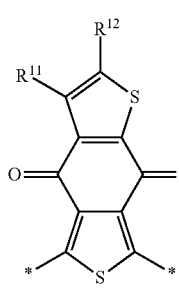 (A22)

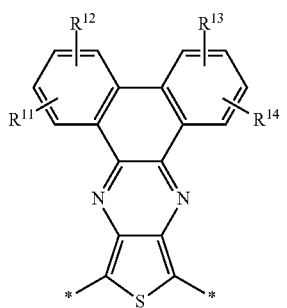
(A23)
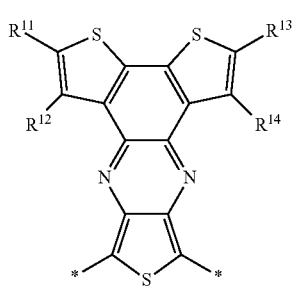
(A24)
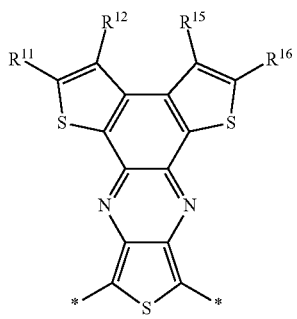
(A25)
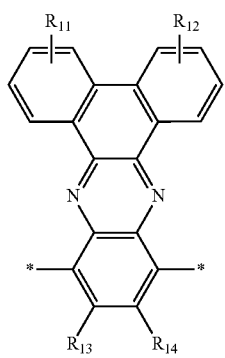
(A26)
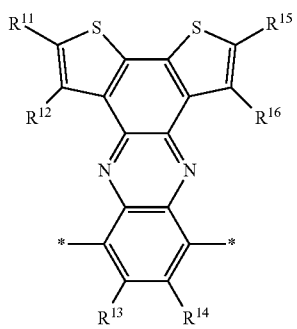
(A27)
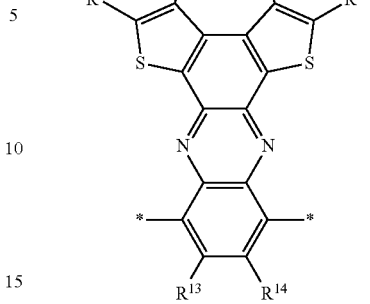
(A28)
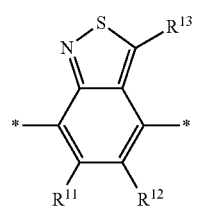
(A29)
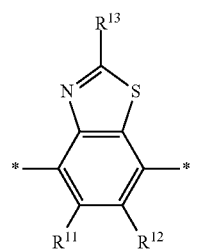
(A30)
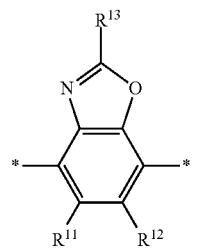
(A31)
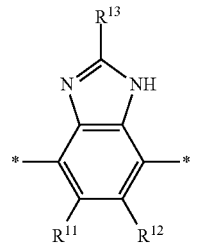
(A32)
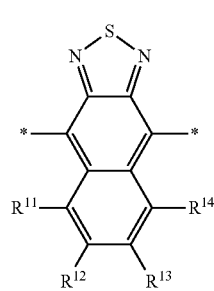
(A33)

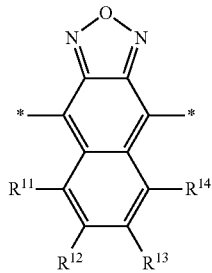 (A34)
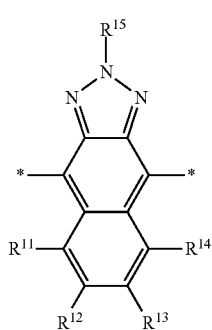 (A35)
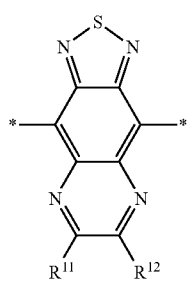 (A36)
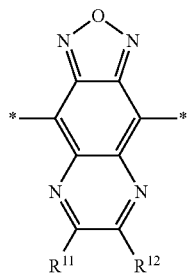 (A37)
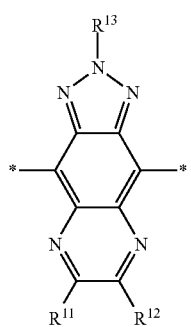 (A38)
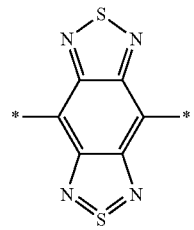 (A39)
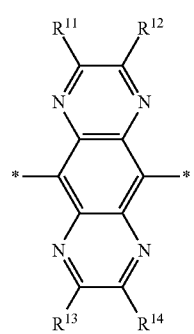 (A40)
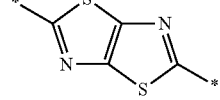 (A41)
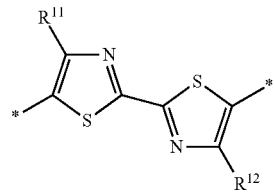 (A42)
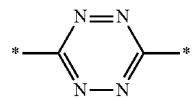 (A43)
(A44)
(A45)
(A46)

(A47) 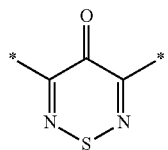
(A48) 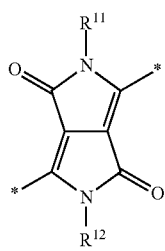
(A49) 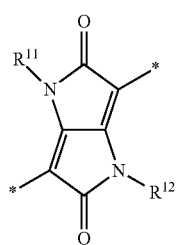
(A50) 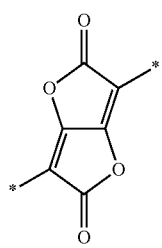
(A51) 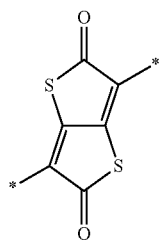
(A52) 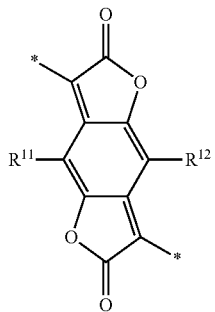
(A53) 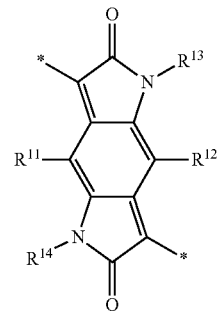
(A54) 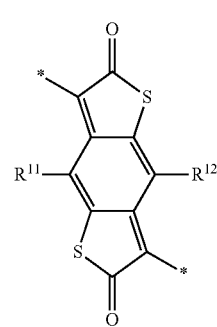
(A55) 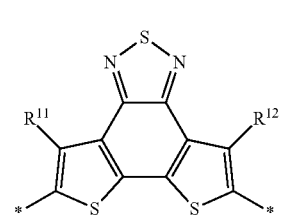
(A56) 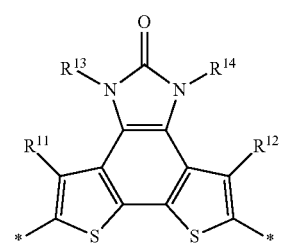
(A57) 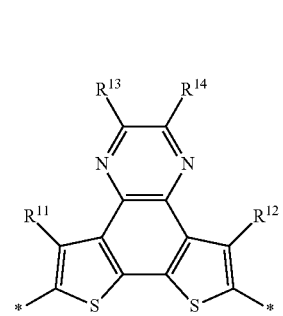

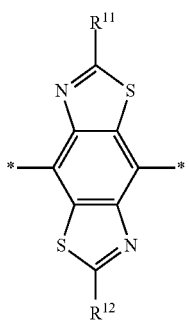
(A58)
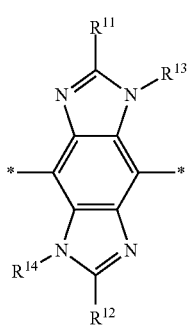
(A59)
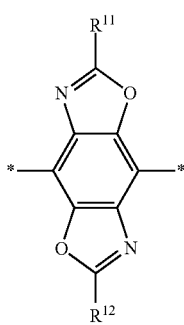
(A60)
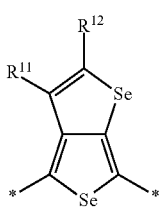
(A61)
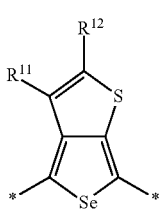
(A62)
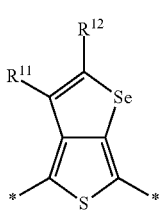
(A63)
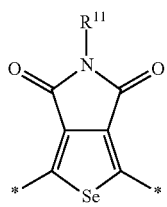
(A64)
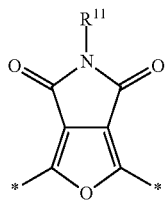
(A65)
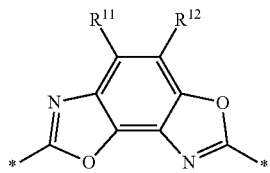
(A66)
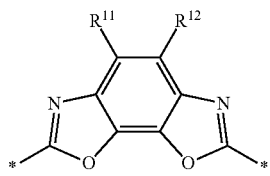
(A67)
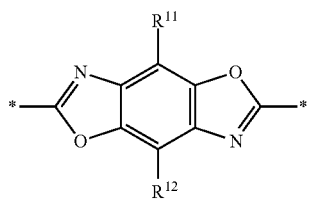
(A68)
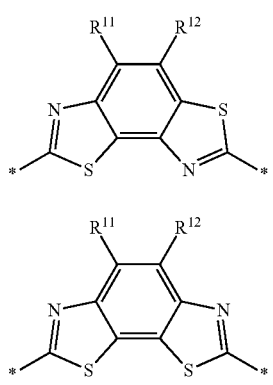
(A69)
(A70)
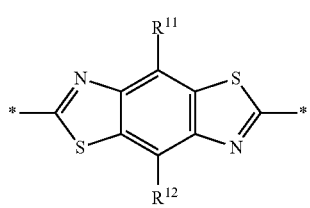
(A71)

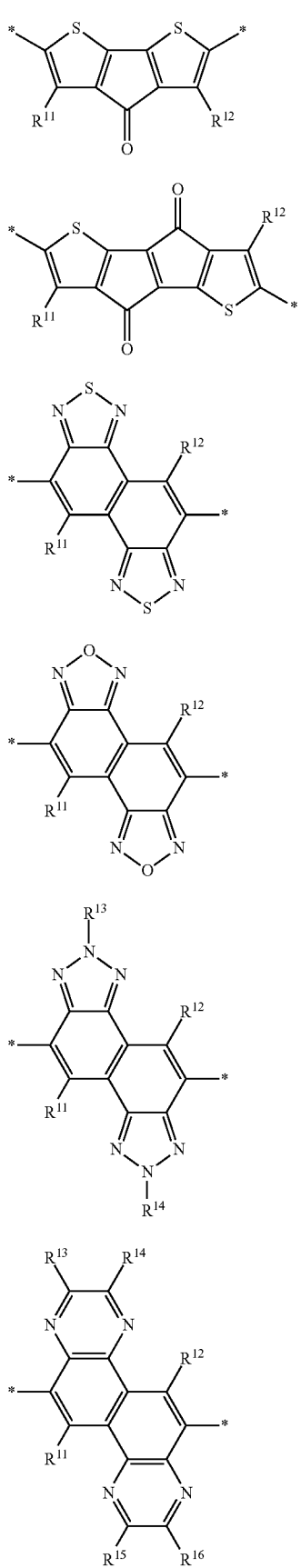
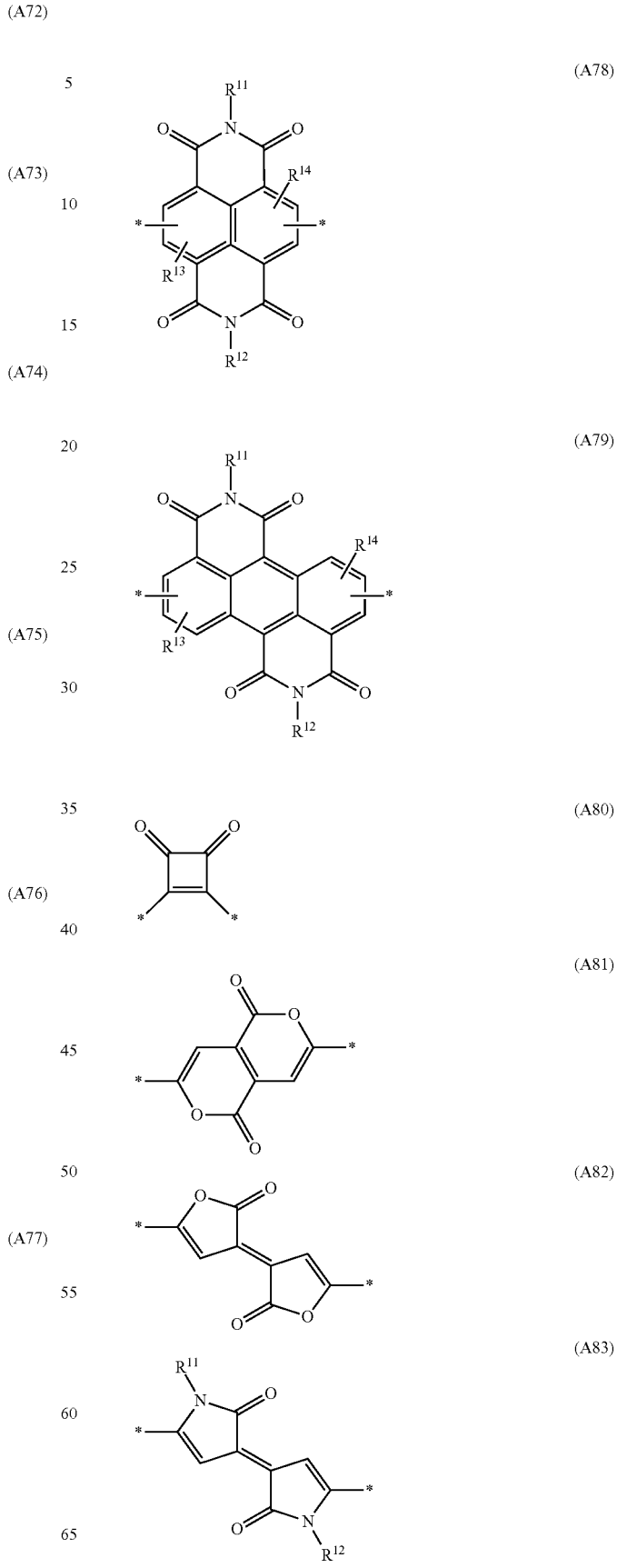

139
-continued
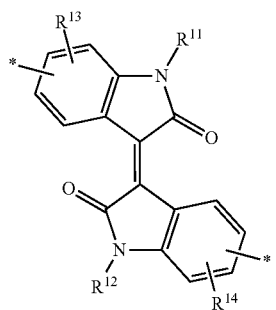 (A84)
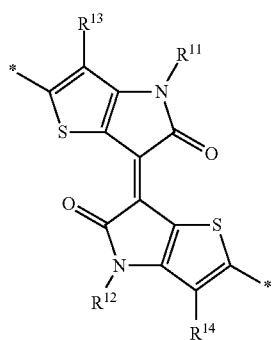 (A85)
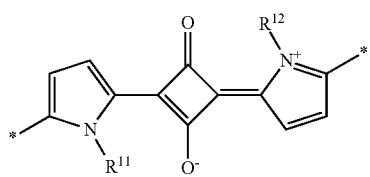 (A86)
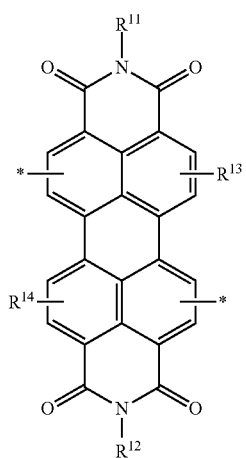 (A87)
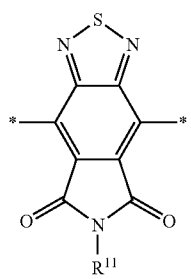 (A88)
140
-continued
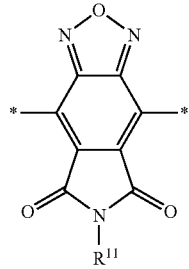 (A89)
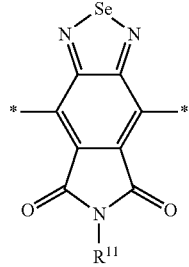 (A90)
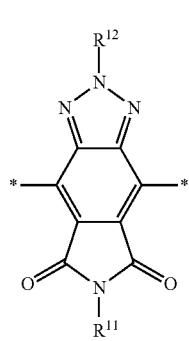 (A91)
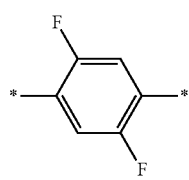 (A92)
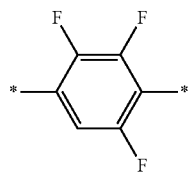 (A93)
(A94)
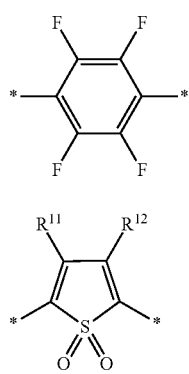 (A95)

-continued

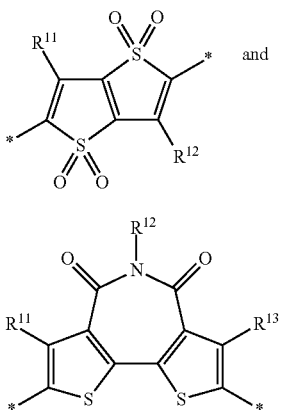

wherein
R$^{11}$, R$^{12}$, R$^{13}$, R$^{14}$, R$^{15}$ and R$^{16}$ independently of each other denote H, F, Br, Cl, —CN, —NC, —NCO, —NCS, —OCN, —SCN, —C(O)NR$^0$R$^{00}$, —C(O)X$^0$, —C(O)R$^0$, —C(O)OR$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms,
R$^0$ and R$^{00}$ are independently of each other H or optionally substituted C$_{1-40}$ carbyl or hydrocarbyl, and
X$^0$ is halogen.

9. The polymer according to claim 1, comprising one or more spacer units selected from the group consisting of the following formulae

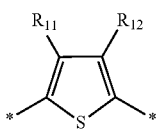 Sp1

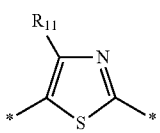 Sp2

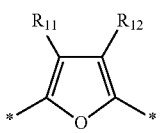 Sp3

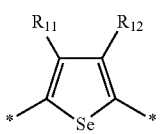 Sp4

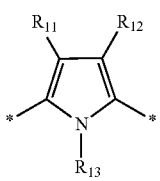 Sp5

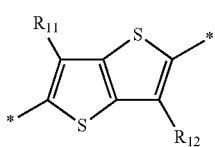 Sp6

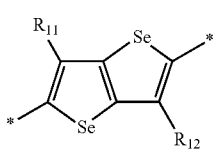 Sp7

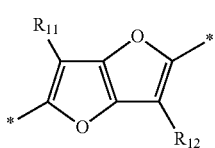 Sp8

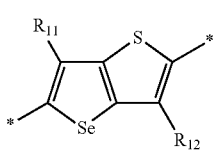 Sp9

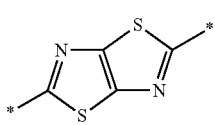 Sp10

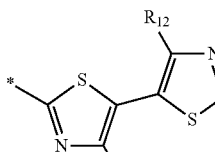 Sp11

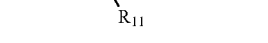 Sp12

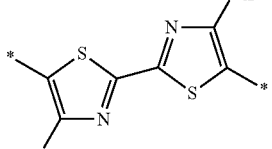

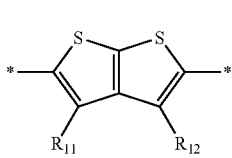 Sp13

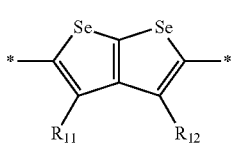 Sp14

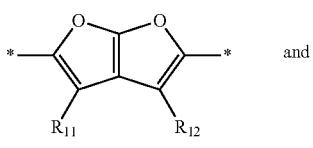 Sp15 and

-continued

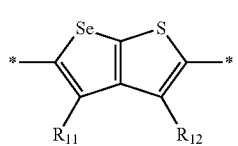

Sp16 wherein
R¹¹ and R¹² independently of each other denote H, F, Br, Cl, —CN, —NC, —NCO, —NCS, —OCN, —SCN, —C(O)NR⁰R⁰⁰, —C(O)X⁰, —C(O)R⁰, —C(O)OR⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl with 1 to 40 C atoms that is optionally substituted and optionally comprises one or more hetero atoms, R⁰ and R⁰⁰ are independently of each other H or optionally substituted $C_{1-40}$ carbyl or hydrocarbyl, and X⁰ is halogen.

10. The polymer according to claim 1, which is selected from the following formulae

IV1

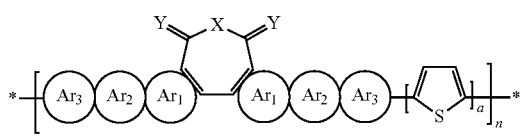

IV2

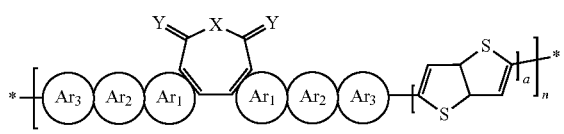

IV3

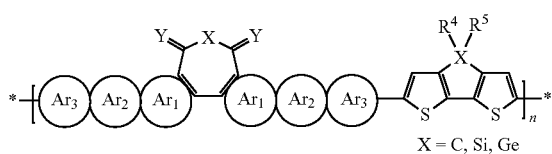

IV4

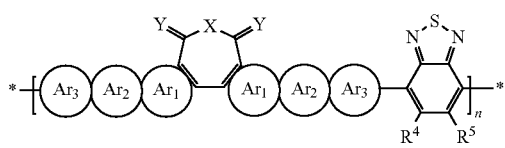

IV5

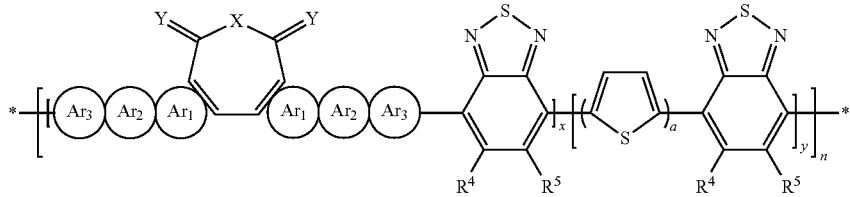

IV6

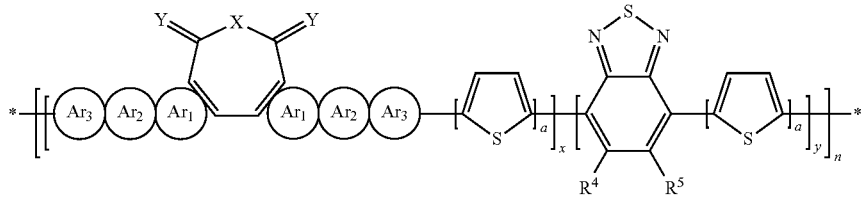

IV7

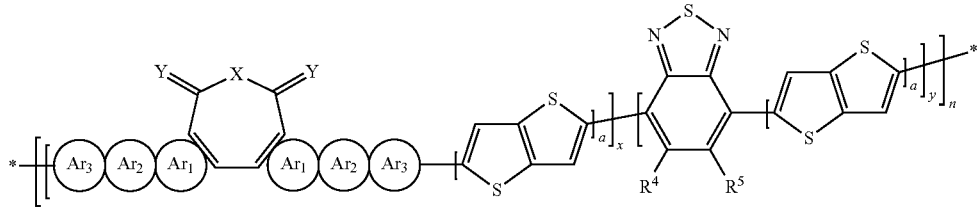

IV8

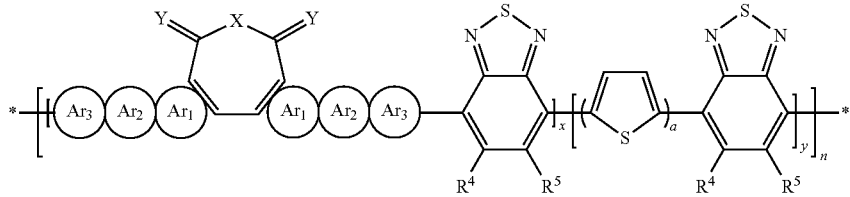

-continued

IV9
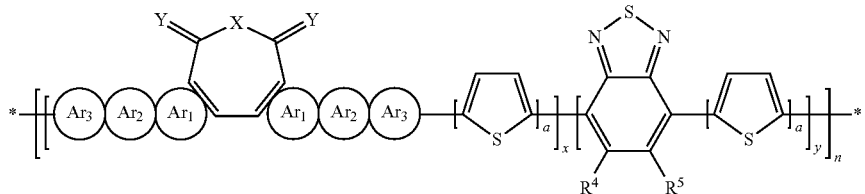

IV10
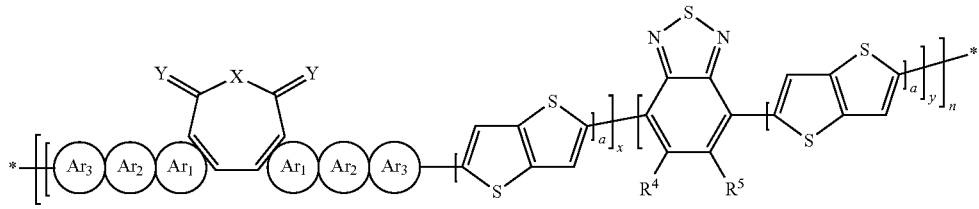

IV11
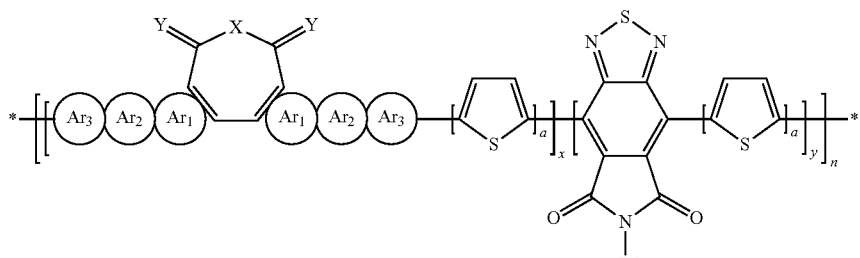

IV12
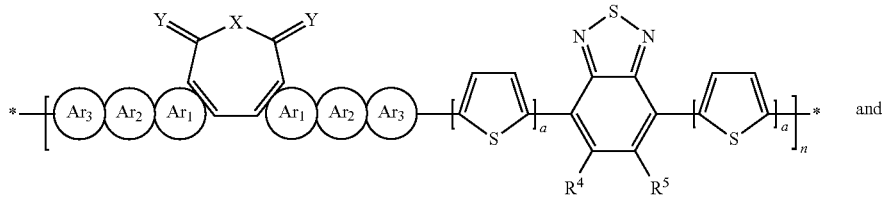

and

IV13
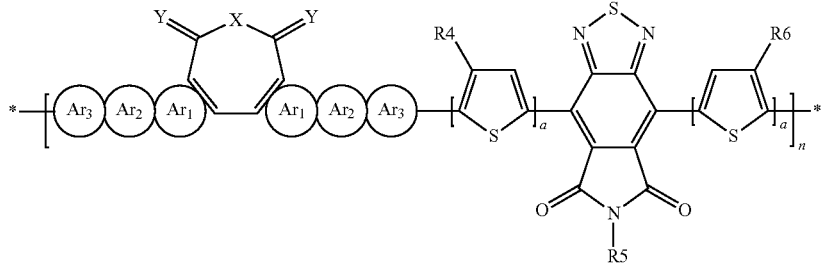

wherein $Ar^1$, $Ar^2$, $Ar^3$ are, on each occurrence identically or differently, and independently of each other, arylene or heteroarylene that is different from U, and is optionally substituted, $R^S$ is on each occurrence identically or differently F, Br, Cl, —CN, —NC, —NCO, —NCS, —OCN, —SCN, —C(O)NR°R°°, —C(O)X°, —C(O)R°, —C(O)OR°, —NH$_2$, —NR°R°°, —SH, —SR°, —SO$_3$H, —SO$_2$R°, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, R° and R°° are independently of each other H or optionally substituted $C_{1-40}$ carbyl or hydrocarbyl, X° is halogen, a, b, c are on each occurrence identically or differently 0, 1 or 2, d is on each occurrence identically or differently 0 or an integer from 1 to 10, x is >0 and ≤1, y is ≥0 and <1, x+y is 1, n is an integer >1, $R^1$ on each occurrence identically or differently, denotes H or straight-chain, branched or cyclic alkyl with 1 to 30 C atoms, in which one or more CH$_2$ groups are optionally replaced by —O—, —S—, —C(=O)—, —C(=S)—, —C(=O)—O—, —O—C(=O)—, —NR°—, —SiR°R°°—, —CF$_2$—, —CHR°=CR°°—, —CY$^1$=CY$^2$— or —C≡C— in such a manner that O and/or S atoms are not linked directly to one another, and in which one or more H atoms are optionally replaced by F, Cl, Br, I or CN, or denotes aryl or heteroaryl with 5 to 15 ring atoms, which is mono- or polycyclic and unsubstituted or substituted by one or more groups $R^S$, $R^{2-6}$ independently of each other, and on each occurrence identically or differently, denote H, halogen or straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —$NR^0$—, —$SiR^0R^{00}$—, —$CF_2$—, —$CHR^0=CR^{00}$—, —$CY^1=CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or denotes aryl or heteroaryl with 5 to 15 ring atoms, which is mono- or polycyclic and unsubstituted or substituted by one or more groups $R^S$.

11. The polymer according to claim 10, which is selected from the following formulae

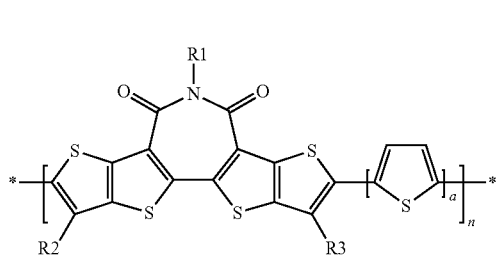

IV21

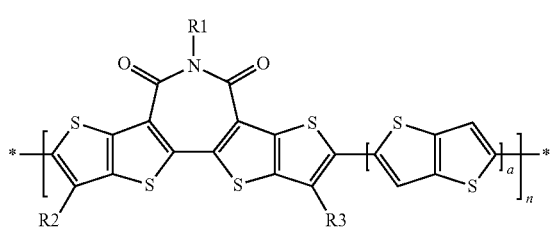

IV22

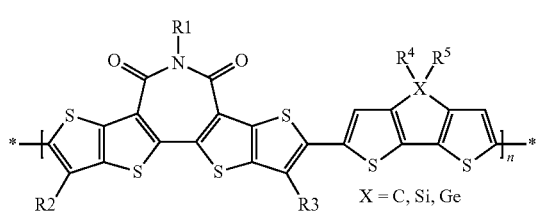

IV23

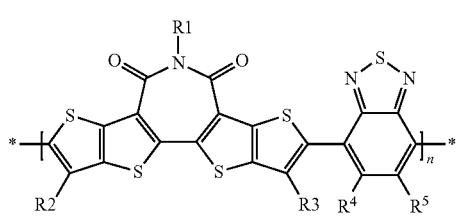

IV24

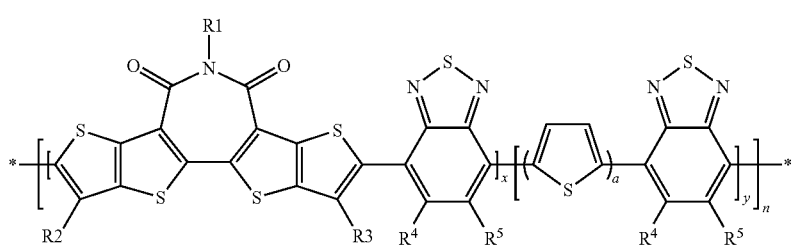

IV25

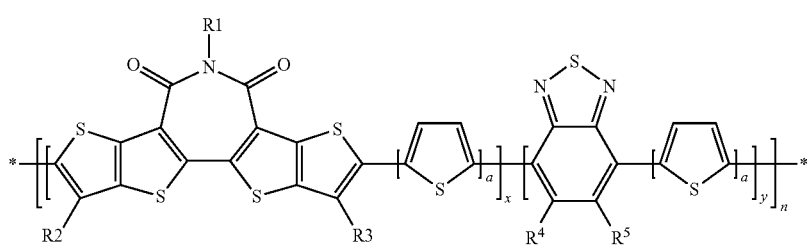

IV26

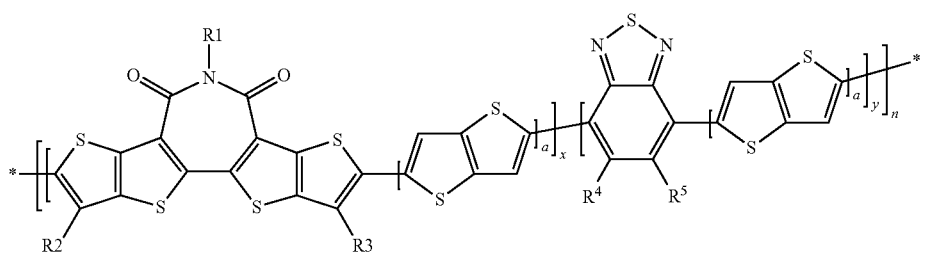

IV27

IV28

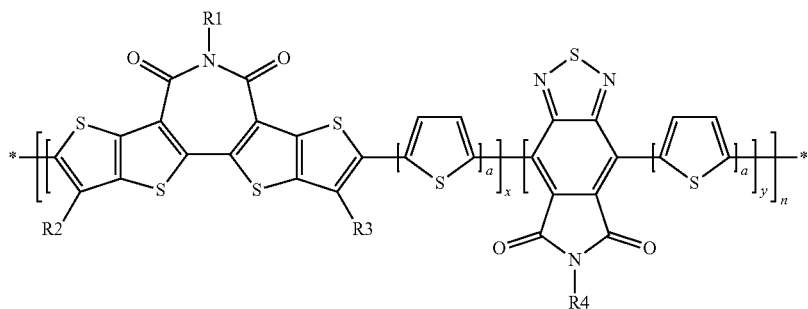

IV29

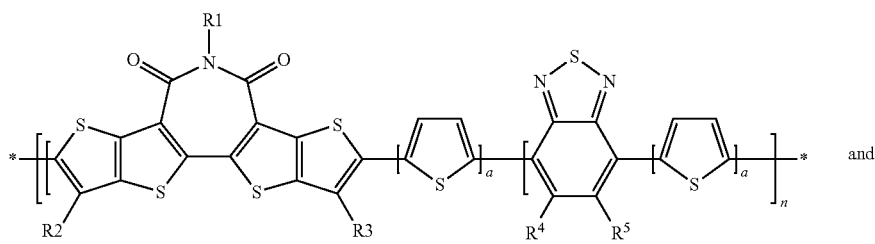

and

IV30

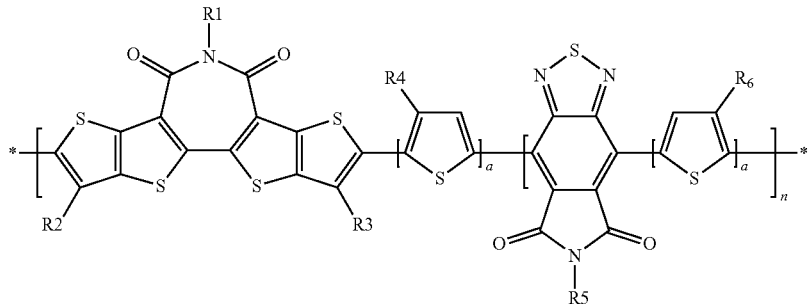

wherein a, b, c are on each occurrence identically or differently 0, 1 or 2, d is on each occurrence identically or differently 0 or an integer from 1 to 10, x is >0 and ≤1, y is ≥0 and <1, x+y is 1, n is an integer >1, $R^1$ on each occurrence identically or differently, denotes H or straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —$NR^0$—, —$SiR^0R^{00}$—, —$CF_2$—, —$CHR^0$=$CR^{00}$—, —$CY^1$=$CY^2$— or —C≡C— in such a manner that O and/or S atoms are not linked directly to one another, and in which one or more H atoms are optionally replaced by F, Cl, Br, I or CN, or denotes aryl or heteroaryl with 5 to 15 ring atoms, which is mono- or polycyclic and unsubstituted or substituted by one or more groups $R^S$, $R^{2-6}$ independently of each other, and on each occurrence identically or differently, denote H, halogen or straight-chain, branched or cyclic alkyl with 1 to 30 C atoms, in which one or more $CH_2$ groups are optionally replaced by —O—, —S—, —C(=O)—, —C(=S)—, —C(=O)—O—, —O—C(=O)—, —$NR^0$—, —$SiR^0R^{00}$—, —$CF_2$—, —$CHR^0$=$CR^{00}$—, —$CY^1$=$CY^2$— or —C≡C— in such a manner that O and/or S atoms are not linked directly to one another, and in which one or more H atoms are optionally replaced by F, Cl, Br, I or CN, and in which one or more $CH_2$ or $CH_3$ groups are optionally replaced by a cationic or anionic group, or denotes aryl or heteroaryl with 5 to 15 ring atoms, which is mono- or polycyclic and unsubstituted or substituted by one or more groups $R^S$, $R^S$ is on each occurrence identically or differently F, Br, Cl, —CN, —NC, —NCO, —NCS, —OCN, —SCN, —C(O)$NR^0R^{00}$, —C(O)$X^0$, —C(O)$R^0$, —C(O)$OR^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally comprises one or more hetero atoms, $R^0$ and $R^{00}$ are independently of each other H or optionally substituted $C_{1-40}$ carbyl or hydrocarbyl, and $X^0$ is halogen.

12. The polymer according to claim 1, which is of formula P $$R^{21}\text{-chain-}R^{22} \quad \quad P$$

wherein chain denotes a polymer chain of formula IV $$*{+}(A)_x\text{-}(B)_y\text{-}(C)_z{+}_n* \quad \quad IV$$

wherein
A, B, C independently of each other denote a distinct unit of formula I,
x is >0 and ≤1,
y is ≥0 and <1,
z is ≥0 and <1,
x+y+z is 1,
n is an integer >1,
$R^{21}$ and $R^{22}$ are on each occurrence identically or differently F, Br, Cl, —CN, —NC, —NCO, —NCS, —OCN, —SCN, —C(O)NR°R°°, —C(O)X°, —C(O)R°, —C(O)OR°, —NH$_2$, —NR°R°°, —SH, —SR°, —SO$_3$H, —SO$_2$R°, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, or denote, independently of each other, H, F, Br, Cl, I, —CH$_2$Cl, —CHO, —CR'=CR"$_2$, —SiR'R"R'", —SiR'X"X", —SiR'R"X', —SnR'R"R'", —BR'R", —B(OR')(OR"), —B(OH)$_2$, —O—SO$_2$—R', —C≡CH, —C≡C—SiR'$_3$, —ZnX" or an endcap group,
X' and X" denote halogen,
R', R" and R'" are independently of each other H or optionally substituted $C_{1-40}$ carbyl or hydrocarbyl, or two of R', R" and R'" form a cyclosilyl, cyclostannyl, cycloborane or cycloboronate group with 2 to 20 C atoms together with the respective hetero atom to which they are attached.

13. A mixture or polymer blend comprising one or more polymers according to claim 1 and one or more compounds having one or more of a semiconducting, charge transport, hole transport, electron transport, hole blocking, electron blocking, electrically conducting, photoconducting or light emitting property.

14. The mixture or polymer blend according to claim 13, further comprising one or more n-type organic semiconducting compounds or polymers.

15. The mixture or polymer blend according to claim 14, wherein the one or more n-type organic semiconducting compounds are selected from the group consisting of fullerenes and substituted fullerenes.

16. A formulation comprising one or more polymers according to claim 1 and one or more organic solvents.

17. The polymer according to claim 1, wherein a unit of formula I is not of formula I1

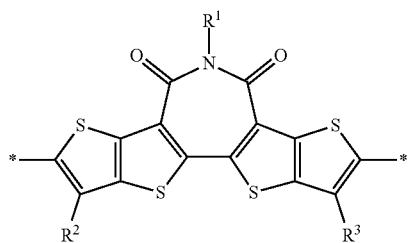

I1 wherein
$R^1$ on each occurrence identically or differently, denotes aryl, which is monocyclic and unsubstituted or substituted by one or more groups $R^S$,
$R^{2-3}$ independently of each other, and on each occurrence identically or differently, halogen,
$R^S$ denotes, on each occurrence identically or differently, F, Br, Cl, —CN, —NC, —NCO, —NCS, —OCN, —SCN, —C(O)NR°R°°, —C(O)X°, —C(O)R°, —C(O)OR°, —NH$_2$, —NR°R°°, —SH, —SR°, —SO$_3$H, —SO$_2$R°, —OH, —NO$_2$, —CF$_3$, —SF$_5$, optionally substituted silyl, or carbyl or hydrocarbyl with 1 to 40 C atoms that is optionally substituted and optionally comprises one or more hetero atoms,
X° is halogen,
$Y^1$ and $Y^2$ are independently of each other H, F, Cl or CN,
R° and R°° are independently of each other H or optionally substituted $C_{1-40}$ carbyl or hydrocarbyl.

18. A semiconducting, charge transport, electrically conducting, photoconducting or light emitting material, which comprises a polymer according to claim 1.

19. An optical, electrooptical, electronic, electroluminescent or photo-luminescent device, or a component thereof, or an assembly comprising it, which has been prepared from a formulation according to claim 16.

20. An optical, electrooptical, electronic, electroluminescent or photoluminescent device, or a component thereof, or an assembly comprising it, which comprises a polymer according to claim 1.

21. The optical, electrooptical, electronic, electroluminescent or photoluminescent device of claim 20, which is selected from the group consisting of organic field effect transistors (OFET), organic thin film transistors (OTFT), organic light emitting diodes (OLED), organic light emitting transistors (OLET), organic photovoltaic devices (OPV), organic photodetectors (OPD), organic solar cells, dye sensitized solar cells (DSSC), perovskite-based solar cells, laser diodes, Schottky diodes, photoconductors and photodetectors.

22. The component of claim 20 which is selected from the group consisting of charge injection layers, charge transport layers, interlayers, planarising layers, antistatic films, polymer electrolyte membranes (PEM), conducting substrates and conducting patterns.

23. The assembly of claim 20, which is selected from the group consisting of integrated circuits (IC), radio frequency identification (RFID) tags, security markings, security devices containing a radio frequency identification (RFID) tag, security devices containing a security marking, flat panel displays, backlights of flat panel displays, electrophotographic devices, electrophotographic recording devices, organic memory devices, sensor devices, biosensors and biochips.

24. A bulk heterojunction comprising a mixture according to claim 14.

25. A bulk heterojunction OPV device or inverted bulk heterojunction OPV device, comprising a bulk heterojunction of claim 24.

26. A process of preparing a polymer according to claim 1, comprising coupling one or more monomers selected from the following formulae with each other and/or with one or more co-monomers in an aryl-aryl coupling reaction

| | |
|---|---|
| $R^{23}$—U—$R^{24}$ | MI |
| $R^{23}$-(Sp)$_x$-U-(Sp)$_y$-$R^{24}$ | MII |
| $R^{23}$-Sp-$R^{24}$ | MIII |
| $R^{23}$-D-$R^{24}$ | MIV |
| $R^{23}$-(Sp)$_x$-D-(Sp)$_y$-$R^{24}$ | MV |
| $R^{23}$-$A^C$-$R^{24}$ | MVI |
| $R^{23}$-(Sp)$_x$-$A^C$-(Sp)$_y$-$R^{24}$ | MVII | wherein at least one monomer is selected of formula MI or MII,

U denotes a unit of formula I,

D denotes an arylene or heteroarylene group that is different from a unit of formula I, has 5 to 30 ring atoms, is optionally substituted by one or more groups $R^S$, and has electron donor properties, $A^C$ is arylene or heteroarylene that is different from U, and is optionally substituted, $R^S$ denotes, on each occurrence identically or differently, F, Br, Cl, —CN, —NC, —NCO, —NCS, —OCN, —SCN, —C(O)NR⁰R⁰⁰, —C(O)X⁰, —C(O)R⁰, —C(O)OR⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl with 1 to 40 C atoms that is optionally substituted and optionally comprises one or more hetero atoms, Sp denotes a spacer unit selected from the group consisting of the following formulae

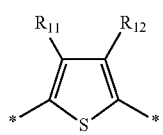
Sp1

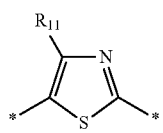
Sp2

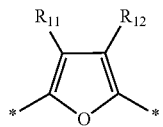
Sp3

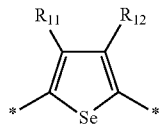
Sp4

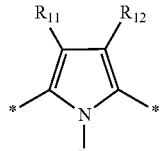
Sp5

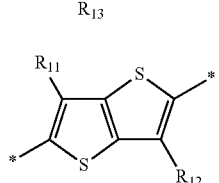
Sp6

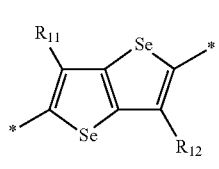
Sp7

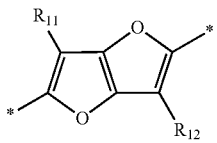
Sp8

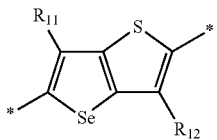
Sp9

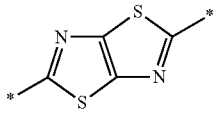
Sp10

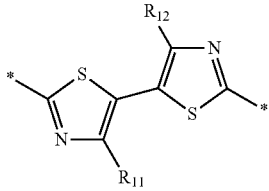
Sp11

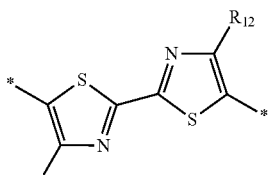
Sp12

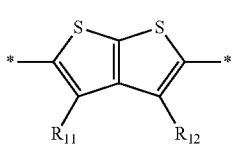
Sp13

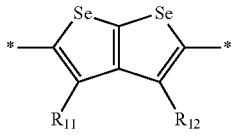
Sp14

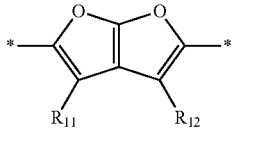
Sp15 and

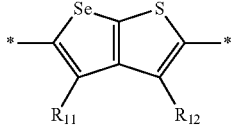
Sp16

$R^{11}$ and $R^{12}$ independently of each other denote H, F, Br, Cl, —CN, —NC, —NCO, —NCS, —OCN, —SCN, —C(O)NR⁰R⁰⁰, —C(O)X⁰, —C(O)R⁰, —C(O)OR⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl with 1 to 40 C atoms that is optionally substituted and optionally comprises one or more hetero atoms, $R^O$ and $R^{OO}$ are independently of each other H or optionally substituted $C_{1-40}$ carbyl or hydrocarbyl, x and y are independently of each other 0, 1 or 2, $R^{23}$ and $R^{24}$ are, independently of each other, selected from the group consisting of H, Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —Z$^3$=C(Z$^3$)$_2$, —C≡CH, —C≡CSi(Z$^1$)$_3$, —ZnX$^O$ and —Sn(Z$^4$)$_3$, X$^O$ is halogen, $Z^{1-4}$ are selected from the group consisting of alkyl and aryl, each being optionally substituted, or two groups Z$^2$ may also form a cycloboronate group with 2 to 20 C atoms together with the B and O atoms.

27. The polymer according to claim 1, wherein a unit of formula I is of formula I1

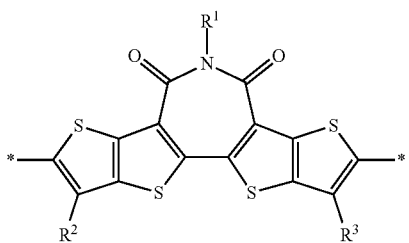

I1 wherein $R^1$ on each occurrence identically or differently, denotes H or straight-chain, branched or cyclic alkyl with 1 to 30 C atoms, in which one or more CH$_2$ groups are optionally replaced by —O—, —S—, —C(=O)—, —C(=S)—, —C(=O)—O—, —O—C(=O)—, —NR$^O$—, —SiR$^O$R$^{OO}$—, —CHR$^O$=CR$^{OO}$—, —CY$^1$=CY$^2$— or —C≡C— in such a manner that O and/or S atoms are not linked directly to one another, and in which one or more H atoms are optionally replaced by F, Cl, Br, I or CN, or denotes aryl or heteroaryl with 5 to 15 ring atoms, which is mono- or polycyclic and unsubstituted or substituted by one or more groups R$^S$, $R^{2-3}$ independently of each other, and on each occurrence identically or differently, denote H or straight-chain, branched or cyclic alkyl with 1 to 30 C atoms, in which one or more CH$_2$ groups are optionally replaced by —O—, —S—, —C(=O)—, —C(=S)—, —C(=O)—O—, —O—C(=O)—, —NR$^O$—, —SiR$^O$R$^{OO}$—, —CHR$^O$=CR$^{OO}$—, —CY$^1$=CY$^2$— or —C≡C— in such a manner that O and/or S atoms are not linked directly to one another, and in which one or more H atoms are optionally replaced by F, Cl, Br, I or CN, and in which one or more CH$_2$ or CH$_3$ groups are optionally replaced by a cationic or anionic group, or denotes aryl or heteroaryl with 5 to 15 ring atoms, which is mono- or polycyclic and unsubstituted or substituted by one or more groups R$^S$, $R^S$ denotes, on each occurrence identically or differently, F, Br, Cl, —CN, —NC, —NCO, —NCS, —OCN, —SCN, —C(O)NR$^O$R$^{OO}$, —C(O)X$^O$, —C(O)R$^O$, —C(O)OR$^O$, —NH$_2$, —NR$^O$R$^{OO}$, —SH, —SR$^O$, —SO$_3$H, —SO$_2$R$^O$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, X$^O$ is halogen, $Y^1$ and $Y^2$ are independently of each other H, F, Cl or CN, $R^O$ and $R^{OO}$ are independently of each other H or optionally substituted $C_{1-40}$ carbyl or hydrocarbyl.

* * * * *